United States Patent
Choi et al.

(10) Patent No.: US 11,153,688 B2
(45) Date of Patent: Oct. 19, 2021

(54) DISPLAY APPARATUS

(71) Applicant: LG Display Co., Ltd., Seoul (KR)

(72) Inventors: Yeongrak Choi, Paju-si (KR); Daeho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/577,563

(22) Filed: Sep. 20, 2019

(65) Prior Publication Data

US 2020/0107128 A1 Apr. 2, 2020

(30) Foreign Application Priority Data

Sep. 28, 2018 (KR) .................. 10-2018-0116278

(51) Int. Cl.
*H04R 7/04* (2006.01)
*H04R 1/02* (2006.01)
*G02F 1/1333* (2006.01)
*H05K 5/02* (2006.01)
*H01L 51/52* (2006.01)

(52) U.S. Cl.
CPC ............. *H04R 7/045* (2013.01); *H04R 1/028* (2013.01); *H05K 5/0204* (2013.01); *G02F 1/133308* (2013.01); *H01L 51/5237* (2013.01); *H04R 2499/15* (2013.01)

(58) Field of Classification Search
CPC ... G02F 1/133308; G02F 2001/133314; H01L 51/5237; H04R 1/028; H04R 2440/05; H04R 2499/15; H04R 5/02; H04R 7/045; H05K 5/0204
USPC ........................................................ 381/333
See application file for complete search history.

(56) References Cited

U.S. PATENT DOCUMENTS

| 2014/0334078 A1* | 11/2014 | Lee ........................ H04M 1/03 361/679.01 |
| 2017/0280234 A1 | 9/2017 | Choi et al. |
| 2017/0280243 A1 | 9/2017 | Choi et al. |
| 2017/0280246 A1 | 9/2017 | Choi et al. |
| 2019/0028787 A1* | 1/2019 | Masuda ................... H04R 7/26 |
| 2019/0037165 A1* | 1/2019 | Lee ........................ H04R 1/025 |

(Continued)

FOREIGN PATENT DOCUMENTS

| CN | 104811873 A | 7/2015 |
| CN | 107241675 A | 10/2017 |

(Continued)

OTHER PUBLICATIONS

First Notification of Office Action dated Mar. 18, 2021, issued in corresponding Chinese Patent Application No. 201910892294.6.

*Primary Examiner* — Paul Kim
*Assistant Examiner* — Friedrich Fahnert
(74) *Attorney, Agent, or Firm* — Morgan, Lewis & Bockius LLP

(57) ABSTRACT

A display apparatus includes: a display panel configured to display an image; a supporting member on a rear surface of the display panel, wherein the supporting member is configured to support the display panel; at least one sound generating device on the rear surface of the display panel, wherein the at least one sound generating device is configured to vibrate the display panel to generate sound; and a partition between the rear surface of the display panel and an upper surface of the supporting member, the partition including a first material and a second material.

23 Claims, 25 Drawing Sheets

(56) References Cited

U.S. PATENT DOCUMENTS

| | | | | |
|---|---|---|---|---|
| 2019/0155087 A1* | 5/2019 | Yoon | ...................... | H04R 7/045 |
| 2019/0196247 A1* | 6/2019 | Shin | ...................... | H04R 9/025 |
| 2019/0196537 A1 | 6/2019 | Choi et al. | | |
| 2019/0200111 A1* | 6/2019 | Kang | ..................... | H04R 1/028 |

FOREIGN PATENT DOCUMENTS

| | | |
|---|---|---|
| CN | 107561753 A | 1/2018 |
| CN | 108124224 A | 6/2018 |
| CN | 109961725 A | 7/2019 |

\* cited by examiner

DISPLAY APPARATUS

This application claims the benefit of the Korean Patent Application No. 10-2018-0116278 filed on Sep. 28, 2018, which is incorporated herein by reference for all purposes as if fully set forth herein.

BACKGROUND

Technical Field

The present disclosure relates to a display apparatus, and more particularly, to a display apparatus that vibrates a display panel to generate sound.

Discussion of the Related Art

Recently, as society advances toward an information-oriented society, the field of display apparatuses for visually displaying electrical information signal has rapidly advanced. Consequently, thin, light, and low power consumption display apparatuses are being developed. Examples of such display apparatuses include liquid crystal display (LCD) apparatuses, field emission display (FED) apparatuses, organic light emitting display apparatuses, light emitting diode display apparatuses, quantum dot light emitting display apparatuses, and micro light emitting diode display apparatuses.

The LCD apparatuses include an array substrate including a thin film transistor (TFT), an upper substrate including a color filter and/or a black matrix, and a liquid crystal layer between the array substrate and the upper substrate. The LCD apparatuses are apparatuses in which an alignment state of the liquid crystal layer is adjusted with an electric field generated between two electrodes provided in a pixel area, and light transmittance is adjusted based on the alignment state, thereby displaying an image.

The organic light emitting display apparatuses, which are self-emitting devices, have low power consumption, a fast response time, high emission efficiency, excellent luminance, and a wide viewing angle. Display apparatuses may include a display panel, which displays an image, and a sound device, which outputs sound along with an image. In the display apparatuses, a sound generated by the sound device travels to a rear surface of the display panel or a region under the display panel, instead of a front surface of the display panel. Therefore, sound quality is degraded due to interference of a sound reflected from a wall or a floor. For this reason, it is difficult to provide a clear sound from the sound device without hindering an immersion experience of a user. Moreover, in a case where a speaker included in a set apparatus, such as a television (TV), a computer monitor, a notebook computer, or a desktop personal computer (PC) is provided, the speaker occupies a certain space, so the design and space disposition of the set apparatus are limited.

SUMMARY

Accordingly, example embodiments of the present disclosure are directed to a display apparatus that substantially obviates one or more of the problems due to limitations and disadvantages of the related art.

An aspect of the present disclosure is to provide a display apparatus including a sound generating device for generating sound that travels to a region in front of a display panel.

Another aspect of the present disclosure is to provide a sound generating device having a new structure, which decreases a wave phenomenon of a display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus includes: a display panel configured to display an image; a supporting member on a rear surface of the display panel, wherein the supporting member is configured to support the display panel; at least one sound generating device on the rear surface of the display panel, wherein the at least one sound generating device is configured to vibrate the display panel to generate sound; and a partition between the rear surface of the display panel and an upper surface of the supporting member, the partition including a first material and a second material.

In another aspect, a display apparatus includes: a display panel configured to display an image and including a first region, a second region, and a third region; at least one sound generating device on a rear surface of the display panel, and in at least one of the first region, the second region, and the third region; a supporting member on the rear surface of the display panel, wherein the supporting member is configured to support the display panel; a first partition between the display panel and the supporting member, wherein the first partition includes a first side and a second side vertical to the first side; at least one first pad in the first region and the first side; and at least one second pad facing the at least one first pad, wherein the at least one first pad or the at least one second pad includes a first material and a second material.

In another aspect, a display apparatus includes: a display panel configured to display an image and including a first region, a second region, and a third region; at least one sound generating device in at least one of the first region, the second region, and the third region of a rear surface of the display panel; a supporting member on the rear surface of the display panel, wherein the supporting member is configured to support the display panel; a first partition between the display panel and the supporting member, wherein the first partition includes a first side and a second side vertical to the first side; a second partition between the first region and the third region; a third partition between the second region and the third region; at least one pad in the first region or the second region, and on the first side and the second side, wherein the at least one pad includes two or more materials having different stiffness values.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with example embodiments of the disclosure. It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate example embodiments of the disclosure and together with the description serve to explain various principles. In the drawings.

Figure 1A:
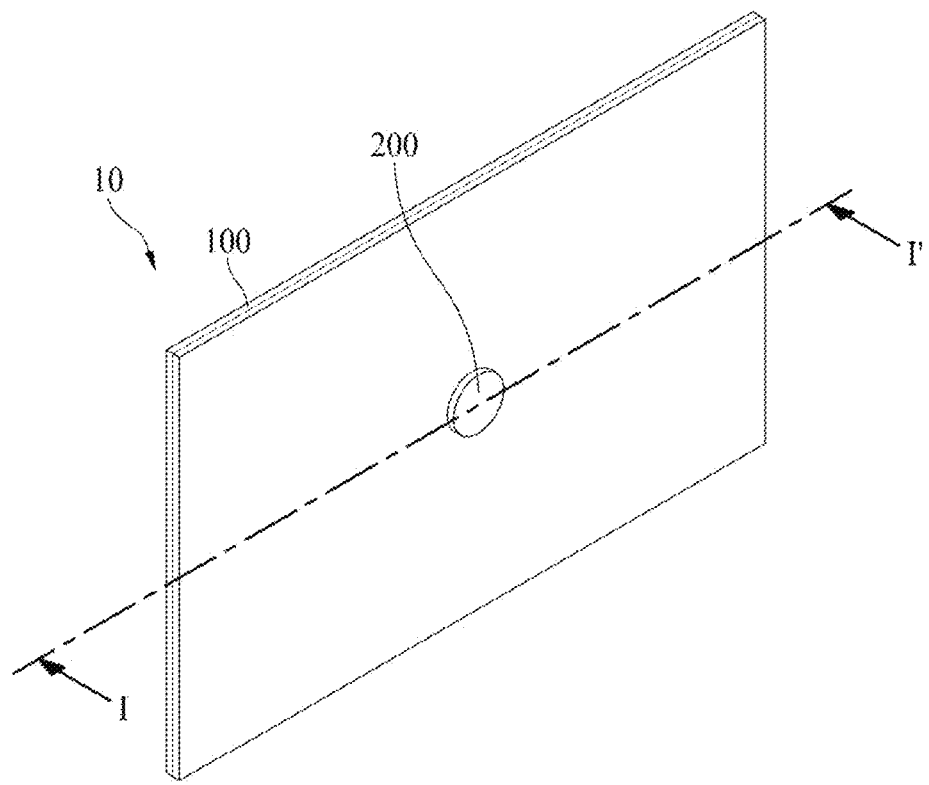
FIG. 1A illustrates a display apparatus including a sound generating device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to the embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing example embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include" described in the present specification are used, another part may be added unless "only" is used. The terms of a singular form may include plural forms unless referred to the contrary.

In construing an element, the element is construed as including an error range although there is no explicit description. In describing a position relationship, for example, when a position relation between two parts is described as, for example, "on," "over," "under," and "next," one or more other parts may be disposed between the two parts unless "just" or "direct(ly)" is used. In the description of example embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and example embodiments of the present disclosure are not limited thereto, unless otherwise specified.

In describing a time relationship, for example, when the temporal order is described as "after," "subsequent," "next," and "before," a case that is not continuous may be included unless "just," "immediate(ly)," or "direct(ly)" is used. It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as "first," "second," "A," "B," "(a)," "(b)," etc., may be used. These terms are intended to identify the corresponding elements from the other elements, and basis, order, or number of the corresponding elements should not limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element. Features of various example embodiments of the present disclosure may be partially or overall coupled to or combined with each other, and may be variously inter-operated with each other and driven technically as those skilled in the art can sufficiently understand. The example embodiments of the present disclosure may be carried out independently from each other, or may be carried out together in co-dependent relationship.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic device (or a set electronic apparatus) such as a notebook computer, a television (TV), a computer monitor, an equipment apparatus including an automotive apparatus or another type apparatuses for vehicles, and/or a mobile electronic apparatus such as a smartphone or an electronic pad, which is a complete product (or a final product) that includes an LCM or an OLED module.

Therefore, in the present disclosure, examples of the display apparatus may include a narrow-sense display apparatus itself, such as an LCM or an OLED module, and a set apparatus that is a final consumer apparatus or an application product including the LCM or the OLED module. In some example embodiments, an LCM or an OLED module including a display panel and a driver may be referred to as a narrow-sense display apparatus, and an electronic apparatus that is a final product including an LCM or an OLED module may be referred to as a set apparatus. For example, the narrow-sense display apparatus may include a display panel, such as an LCD or an OLED, and a source printed circuit board (PCB), which is a controller for driving the display panel. The set apparatus may further include a set PCB, which is a set controller electrically connected to the source PCB to overall control the set apparatus.

A display panel applied to the present example embodiment may use any type of display panel, such as a liquid crystal display panel, an organic light emitting diode (OLED) display panel, and an electroluminescent display panel, but is not limited to any particular display panel that may be vibrated by a sound generation device according to an example embodiment to output sound. Also, a shape or a size of a display panel applied to a display apparatus according to the present example embodiment is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT), which is a switching element for adjusting a light transmittance of each of the plurality of pixels, an upper substrate including a color filter and/or a black matrix, and a liquid crystal layer between the array substrate and the upper substrate.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT that is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another example, the layer provided on the array substrate may include a micro light emitting diode.

The display panel may further include a backing, such as a metal plate attached on the display panel. However, example embodiments are not limited to the metal plate, and the display panel may include another structure. In the present disclosure, the display panel may be applied to vehicles as a user interface module such as a central control panel for automobiles. For example, the display panel may be provided between occupants sitting on two front seats in order for a vibration of the display panel to be transferred to the inside of a vehicle. Therefore, an audio experience in a vehicle is improved in comparison with a case where speakers are disposed on interior sides of the vehicle.

The present inventors have recognized the above-described problems of a speaker installes in a display apparatus, and have performed various experiments so that when watching an image in front of a display panel, a traveling direction of a sound becomes a direction toward a front surface of the display panel. Thus, sound quality is enhanced. Through the various experiments, the inventors have invented a display apparatus having a new structure, which outputs a sound so that a traveling direction of the sound becomes a directiontoward a front surface of a display panel, thereby enhancing sound quality.

Hereinafter, a display apparatus according to an example embodiment of the present disclosure will be described in detail with reference to the accompanying drawings. In the following description, when the detailed description of the relevant known function or configuration is determined to unnecessarily obscure the present disclosure, the detailed description may be omitted. Also, for convenience of description, a scale of each of elements illustrated in the accompanying drawings differs from a real scale, and thus, is not limited to a scale illustrated in the drawings.

FIG. 1A illustrates a display apparatus including a sound generating device according to an example embodiment of the present disclosure. FIG. 1A illustrates a rear surface of the display apparatus 10. With reference to FIG. 1A, the display apparatus 10 may include a display panel 100, which displays an image, and a sound generating device 200 that is disposed on a rear surface of the display panel 100 and vibrates the display panel 100 to generate a sound. For example, the sound generating device 200 may directly vibrate the display panel 100 to output a sound to a forward region in front of the display panel 100.

The display panel 100 may display an image and may be implemented as any type of display panel such as a liquid crystal display panel, an organic light emitting diode (OLED) display panel, an electroluminescent display panel, etc. The display panel 100 may vibrate based on a vibration of the sound generating device 200 to output a sound. According to an example embodiment of the present disclosure, the display panel 100 may display an image in a type such as a top emission type, a bottom emission type, or a dual emission type, based on a structure of a pixel array layer including an anode electrode, a cathode electrode, and an organic compound layer. In the top emission type, visible light emitted from the pixel array layer may be irradiated onto a region in front of a base substrate to allow an image to be displayed, and in the bottom emission type, the visible light emitted from the pixel array layer may be irradiated onto a rearward region behind the base substrate to allow an image to be displayed. Moreover, the sound generating device 200 may generate a sound using the display panel 100 as a vibration plate. The sound generating device 200 may be referred to as an actuator, an exciter, or a transducer, but is not limited thereto. In other example embodiments, the sound generating device 200 may be a sound device for outputting a sound according to an electrical signal.

Figure 1B:
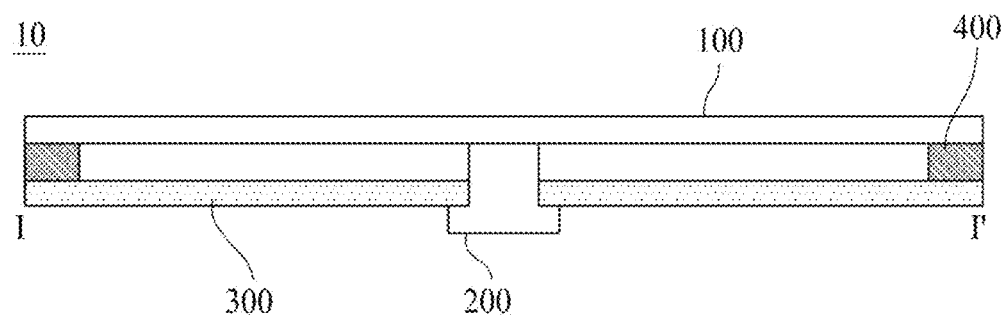
FIG. 1B is a cross-sectional view taken along the line I-I' of FIG. 1A.

FIG. 1B is a cross-sectional view taken along the line I-I' of FIG. 1A. With reference to FIG. 1B, the display apparatus may include the sound generating device 200 and a supporting member 300. The supporting member 300 may support one or more of a rear surface and a side surface of the display panel 100. Also, the sound generating device 200 may be fixed to the supporting member 300.

The supporting member 300 may be, for example, a cover bottom. For example, the supporting member 300 may include a middle cabinet that is coupled or connected to a cover bottom to surround the side surface of the display panel 100 and accommodates one edge or periphery of the display panel 100 to support the display panel 100. For example, the middle cabinet may include a sideways T-shape cross-sectional surface (or a T-shape having a 90-degree angle). The supporting member 300 may include the cover bottom, or may include the cover bottom and the middle cabinet, but is not limited thereto. In other example embodiments, the supporting member 300 may include a structure that supports the rear surface or the side surface of the display panel 100.

Moreover, the supporting member 300 may be a plate member that is provided on the rear surface of the display panel 100 or all over the display panel 100. For example, the supporting member 300 may cover the whole rear surface of the display panel 100 so as to be spaced apart from the rear surface. Also, the supporting member 300 may have a plate shape formed of a glass material, a metal material, or a plastic material. Here, an edge (or periphery) or a sharp corner of the supporting member 300 may have a tetragonal (e.g., quadrilateral) shape or a curved shape, e.g., through a chamfering process or a corner rounding process. According to an example embodiment of the present disclosure, the supporting member 300 including the glass material may include sapphire glass. For example, the supporting member 300 including the metal material may be formed of one or more of aluminum (Al), an Al alloy, a magnesium (Mg) alloy, and an iron (Fe)-nickel (Ni) alloy. As another example, the supporting member 300 may have a stacked structure including a glass plate and a metal plate, in which the metal plate may have a thickness relatively thinner than the glass plate and the glass plate may face the rear surface of the display panel 100, and a rear surface of the display apparatus 10 may be used as a mirror surface due to the metal plate. However, the present example embodiment is not limited to the materials or the shape.

Moreover, the supporting member 300 may include a hole into which the sound generating device 200 is inserted or accommodated. For example, the hole may be perforated in a predetermined partial region of the supporting member 300 along with a thickness direction of the supporting member 300 to have a circular shape or a polygonal shape, in order for the sound generating device 200 to be inserted or accommodated into the hole. Moreover, in the present disclosure, the supporting member 300 may be referred to as a "cover bottom," a "plate bottom," a "back cover," a "base frame," a "metal frame," a "metal chassis," a "chassis base," or an "m-chassis." Therefore, the supporting member 300 may be a supporter for supporting the display panel 100 and may be implemented as any type of frames or a plate structure disposed on the rear surface of the display apparatus.

An adhesive member 400 may be disposed in an edge or periphery of the display panel 100 and the supporting member 300. For example, the adhesive member 400 may be disposed between the rear surface of the display panel 100 and an upper surface of the supporting member 300. The adhesive member 400 may attach the display panel 100 with the supporting member 300. Also, the adhesive member 400 may include a double-sided tape, a single-sided tape, an adhesive, a bond, and/or the like, but is not limited thereto.

Figure 2A:
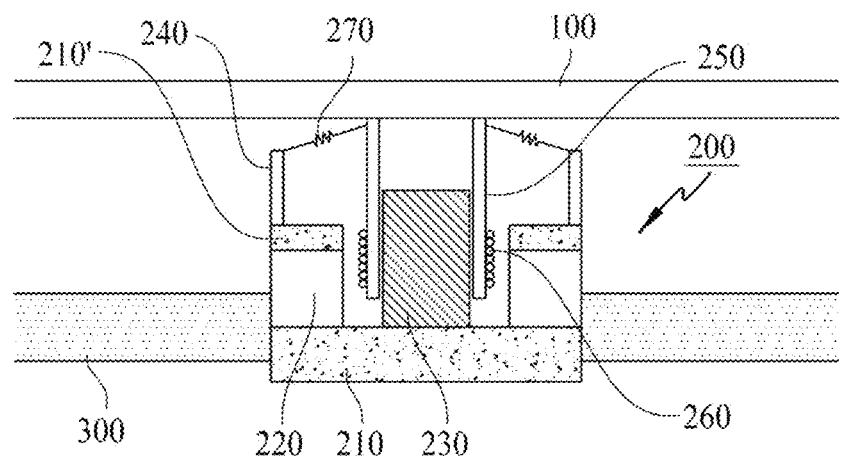
FIGS. 2A and 2B are cross-sectional views of a sound generating device according to an example embodiment of the present disclosure.
Figure 2B:
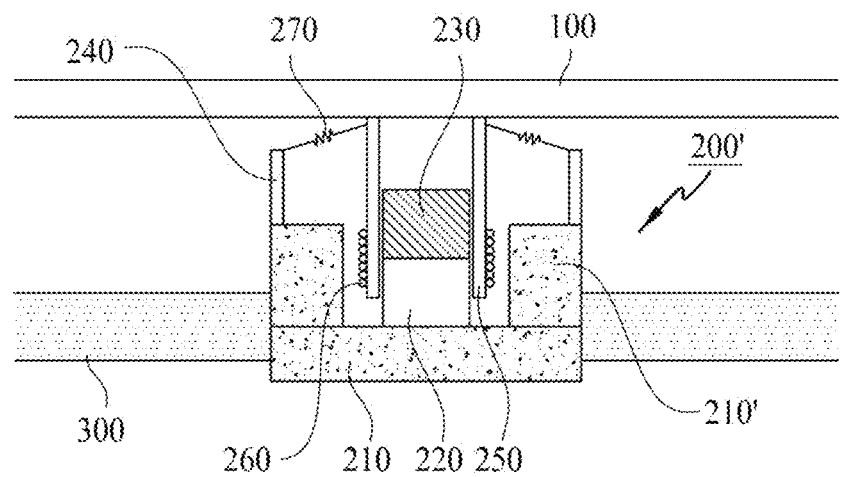

FIGS. 2A and 2B are cross-sectional views of a sound generating device according to an example embodiment of the present disclosure. The sound generating device may be classified into a first structure, where a magnet is disposed outside a coil, and a second structure where a magnet is disposed inside a coil. The first structure may be referred to as a "dynamic type" or an "external magnetic type." Also, the second structure may be referred to as a "micro type" or an "internal magnetic type." FIG. 2A illustrates the first structure, and FIG. 2B illustrates the second structure. With reference to FIG. 2A, a sound generating device 200 may include a plurality of plates (for example, first and second plates) 210 and 210', a magnet 220 disposed on a corresponding plate, a center pole 230 disposed on a corresponding plate, a bobbin 250 disposed near the center pole 230, and a coil 260 wound around the bobbin 250.

For example, the magnet 220 may be provided on the first plate 210, and the second plate 210' may be provided on the magnet 220. The first plate 210 and the second plate 210' may support the magnet 220 and may fix the sound generating device 200 to a supporting member 300. Therefore, the first plate 210 may be fixed to a hole in the supporting member 300, and the magnet 220 may be fixed and supported between the first plate 210 and the second plate 210'. At least one of the first plate 210 and the second plate 210' may be formed of a material such as iron (Fe). Each of the first plate 210 and the second plate 210' is not limited to the term. For example, the first plate 210 or the second plate 210' may be referred to as a "yoke" or the like.

The magnet 220 may be implemented with a sintered magnet such as barium ferrite, and a material of the magnet 220 may use ferrite ($Fe_2O_3$), barium carbonate ($BaCO_3$), a neodymium magnet, strontium ferrite ($Fe_{12}O_{19}Sr$) with improved magnet component, an alloy cast magnet including Al, nickel (Ni), and cobalt (Co), and/or the like, but is not limited thereto. For example, the neodymium magnet may be neodymium-iron-boron (Nd—Fe—B). However, the present example embodiment is not limited thereto.

A frame 240 may be disposed on the second plate 210' along an edge or periphery of the first plate 210. A center pole 230 may be disposed in a central region of the first plate 210. Also, the center pole 230 and the first plate 210 may be provided as one body. Also, the center pole 230 may be referred to as pole pieces. In other example embodiments, pole pieces may be further disposed on the center pole 230. The bobbin 250 may be disposed to surround the center pole 230. The coil 260 may be wound around a lower outer region (for example, a lower outer surface) of the bobbin 250, and a electrical current for generating a sound may be applied to the coil 260. The bobbin 250 may be a ring-shaped structure that is formed of paper, an Al sheet, and/or the like, and the coil 260 may be wound around a certain lower region of the bobbin 250. The generic term for the bobbin 250 and the coil 260 may be a voice coil. Also, a damper 270 may be disposed between the frame 240 and a partial region of an upper portion of the bobbin 250. The damper may be referred to as an "edge" or the like.

FIG. 2B illustrates the second structure where a magnet is disposed inside a coil. With reference to FIG. 2B, a sound generating device 200' having the second structure may include a magnet 220 disposed on a first plate 210, a center pole 230 disposed on the magnet 220, a bobbin 250 disposed near the magnet 220 and the center pole 230, and a coil 260 wound around the bobbin 250. For example, the first plate 210 may be fixed to a hole in a supporting member 300. The magnet 220 may be disposed on the first plate 210, and the center pole 230 may be disposed on the magnet 220. Also, the center pole 230 may be referred to as pole pieces. Alternatively, pole pieces may be further disposed on the center pole 230. The bobbin 250 may be disposed to surround the magnet 220 and the center pole 230, and the coil 260 may be wound around the bobbin 250.

A second plate 210' may be disposed near the first plate 210, and a frame 240 may be disposed outside the second plate 210'. For example, a damper 270 may be disposed between the frame 240 and the bobbin 250. Comparing with the first structure where a magnet is disposed outside a coil, the second structure including an internal magnet may be small in leakage magnetic flux and may reduce a total size of a sound generating device. The sound generating device applied to the display apparatus according to an example embodiment of the present disclosure is not limited to the first structure illustrated in FIG. 2A and the second structure illustrated in FIG. 2B. In other example embodiments, the display apparatus according to an example embodiment of the present disclosure may include another kind of sound generating device that vibrates a display panel to generate sound.

Figure 3A:
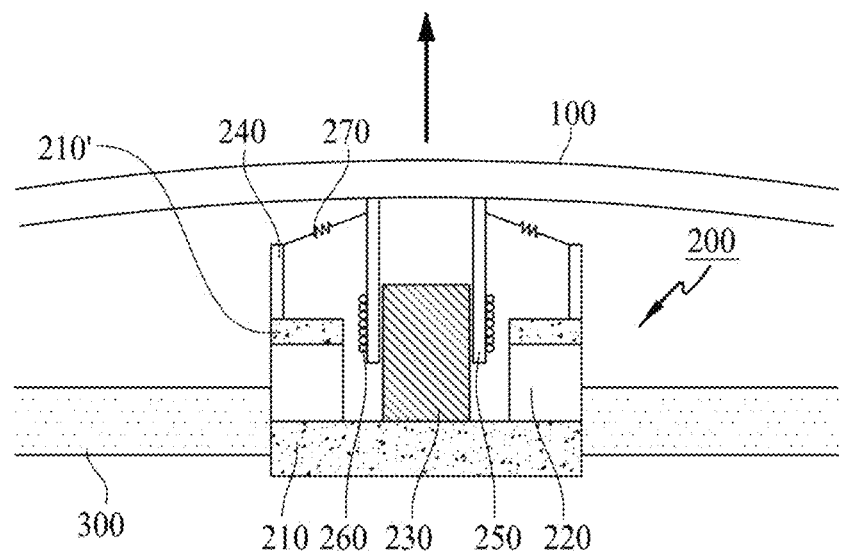
FIGS. 3A and 3B illustrate a sound generating operation performed by a sound generating device having a first structure according to an example embodiment of the present disclosure.
Figure 3B:
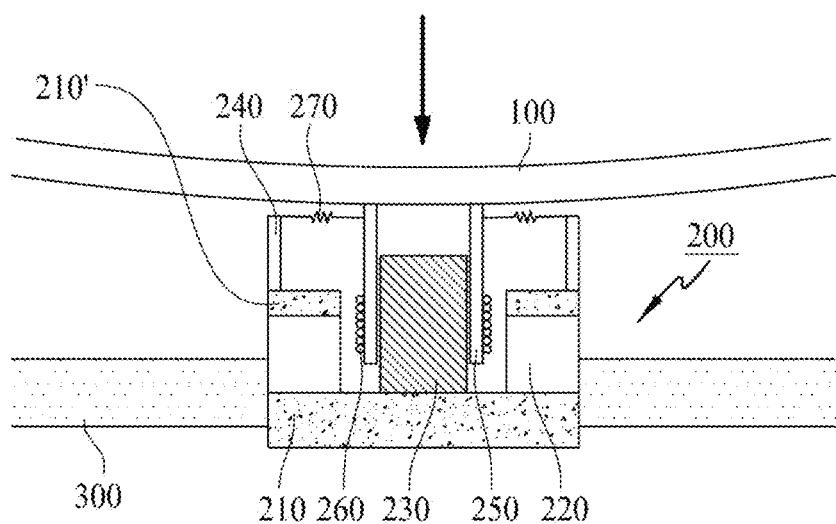

FIGS. 3A and 3B are diagrams for describing a sound generating operation performed by a sound generating device having a first structure according to an example embodiment of the present disclosure. FIG. 3A illustrates a state where a electrical current is applied. The center pole 230 connected to a lower surface of the magnet 220 through the first plate 210 may be an N-pole, and the second plate 210' connected to an upper surface of the magnet 220 may be an S-pole, whereby an external magnetic field may be generated around the coil 260. The north and south poles may be interchangeable.

In this state, when a electrical current for generating a sound is applied to the coil 260, an applied magnetic field may be generated around the coil 260, and a force for moving the bobbin 250 to an upper portion may be generated by the applied magnetic field and an external magnetic field. For example, when a electrical current is applied to the coil 260, a magnetic field may be generated around the coil 260, and thus, the bobbin 250 may be guided by the center pole 230 and may move to the upper portion according to Fleming's left-hand law based on the generated magnetic field and the external magnetic field generated by the magnet 220.

Therefore, one surface of the bobbin 250 may contact a rear surface of the display panel 100, and thus, the bobbin 250 may vibrate the display panel 100 in an upward direction (illustrated by an arrow) according to whether a electrical current is applied to the coil 260 or not, whereby a sound wave (or sound) may be generated by the vibration of the display panel 100. In this state, when the application of the electrical current stops or a reverse electrical current is applied, as illustrated in FIG. 3B, a force for moving the bobbin 250 to a lower portion may be generated according to the principle similar to description given above with reference to FIG. 3A, and the display panel 100 may vibrate in a downward direction (illustrated by an arrow).

The damper 270 may be disposed between a portion of an upper portion of the bobbin 250 and the frame 240. The damper 270 may be provided in a creased structure and may be contracted and relaxed based on a vertical motion of the bobbin 250 to control a vertical vibration of the bobbin 250. For example, the damper 270 may be connected to the bobbin 250 and the frame 240, and thus, the vertical vibration of the bobbin 250 may be controlled by a restoring force of the damper 270. For example, when the bobbin 250 vibrates by a certain height or more or vibrates by a certain height or less, the bobbin 250 may be restored to an original position by the restoring force of the damper 270. Therefore, the display panel 100 may vertically vibrate based on an application direction and level of a electrical current applied to the coil 260, and a sound wave may be generated by the vibration.

Figure 4A:
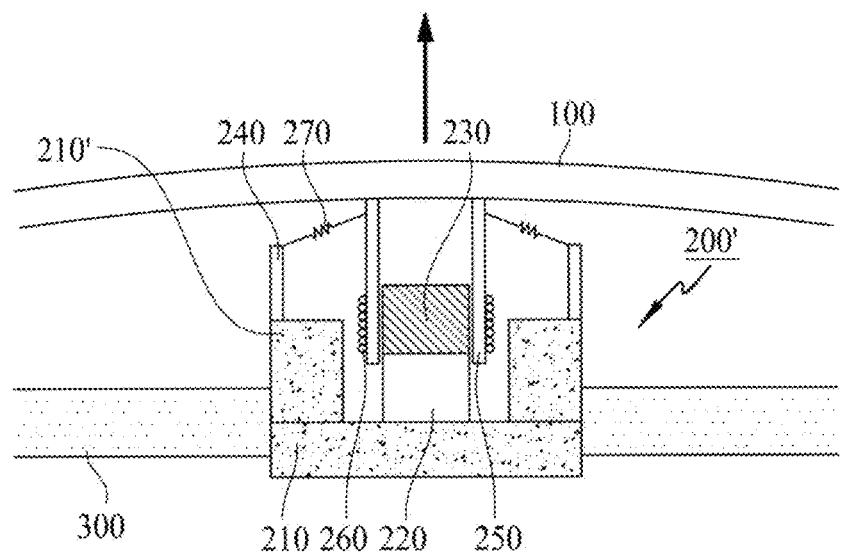
FIGS. 4A and 4B illustrate a sound generating operation performed by a sound generating device having a second structure according to an example embodiment of the present disclosure.
Figure 4B:
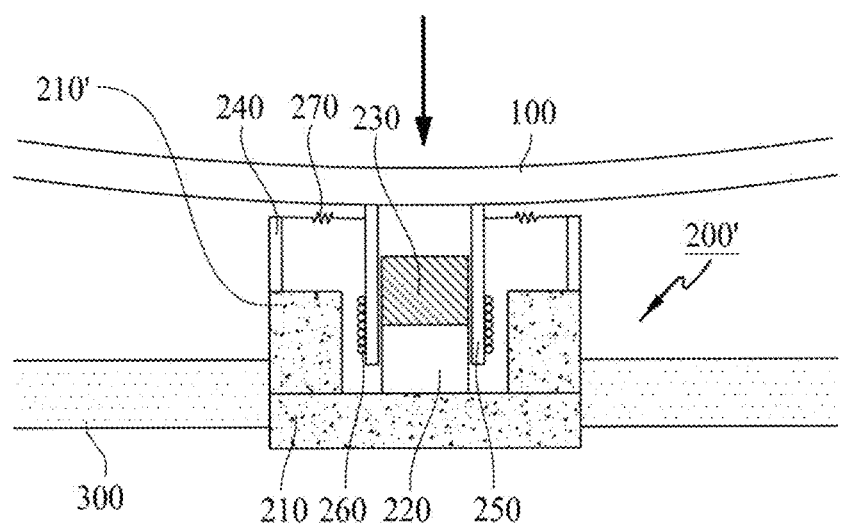

FIGS. 4A and 4B are diagrams for describing a sound generating operation performed by a sound generating device having a second structure according to an example embodiment of the present disclosure. FIG. 4A illustrates a state where a electrical current is applied. The second plate 210' may be an S-pole, and the center pole 230 connected to an upper surface of the magnet 220 may be an N-pole, whereby an external magnetic field may be generated around the coil 260. The S-pole and the N-pole may switch therebetween, and if the S-pole and the N-pole switch therebetween, the sound generating device may similarly operate by correcting a winding direction of the coil 260. In this state, when a electrical current for generating sound is applied to the coil 260, an applied magnetic field may be generated around the coil 260, and a force for moving the bobbin 250 to an upper portion may be generated by the applied magnetic field and an external magnetic field. For example, when a electrical current is applied to the coil 260, a magnetic field may be generated around the coil 260, and thus, the bobbin 250 may be guided by the center pole 230 and may move to the upper portion according to Fleming's left-hand law based on the generated magnetic field and the external magnetic field generated by the magnet 220.

Therefore, one surface of the bobbin 250 may contact a rear surface of the display panel 100, and thus, the bobbin 250 may vibrate the display panel 100 in an upward direction (illustrated by an arrow) according to whether a electrical current is applied to the coil 260 or not, whereby a sound wave (or a sound) may be generated by the vibration of the display panel 100. In this state, when the application of the electrical current stops or a reverse electrical current is applied, as illustrated in FIG. 4B, a force for moving the bobbin 250 to a lower portion may be generated according to the principle similar to description given above with reference to FIG. 4A, and the display panel 100 may vibrate in a downward direction (illustrated by an arrow).

Moreover, the damper 270 may be disposed between a partial region of an upper portion of the bobbin 250 and the frame 240. The damper 270 may have a creased structure and may be contracted and relaxed based on a vertical motion of the bobbin 250 to control a vertical vibration of the bobbin 250. For example, the damper 270 may be connected to the bobbin 250 and the frame 240, and thus, the vertical vibration of the bobbin 250 may be controlled by a restoring force of the damper 270. For example, when the bobbin 250 vibrates by a certain height or more or vibrates by a certain height or less, the bobbin 250 may be restored to an original position by the restoring force of the damper 270. Therefore, the display panel 100 may vertically vibrate based on an application direction and level of a electrical current applied to the coil 260, and a sound wave may be generated by the vibration.

Figure 5A:
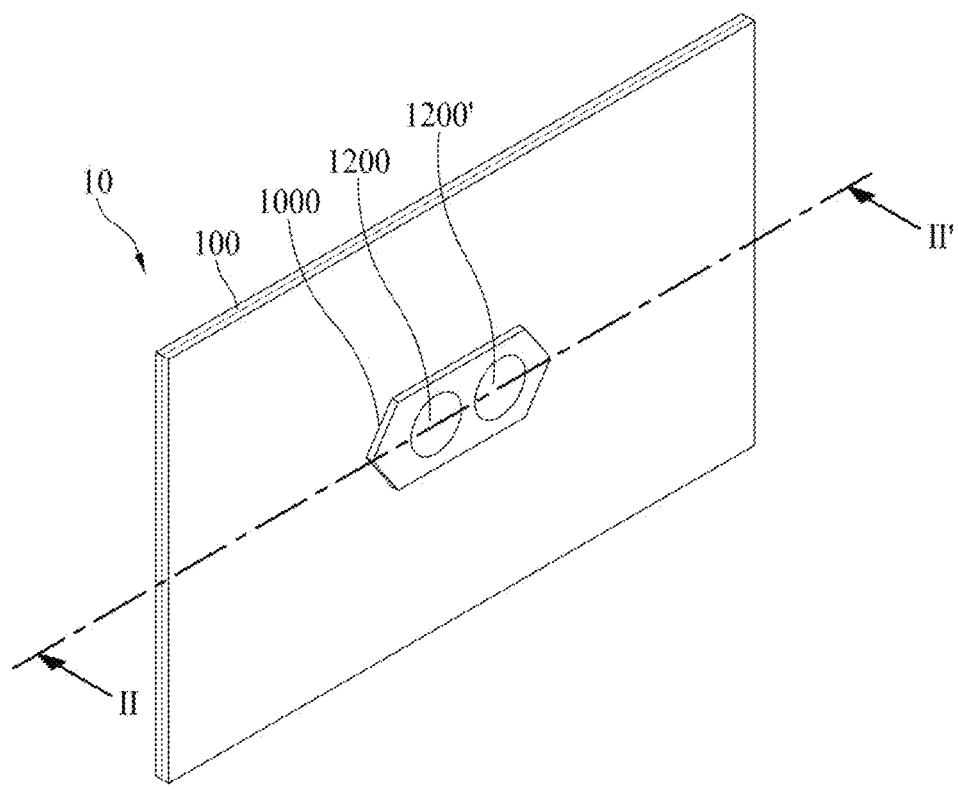
FIG. 5A illustrates a sound generating device according to another example embodiment of the present disclosure.
Figure 5B:
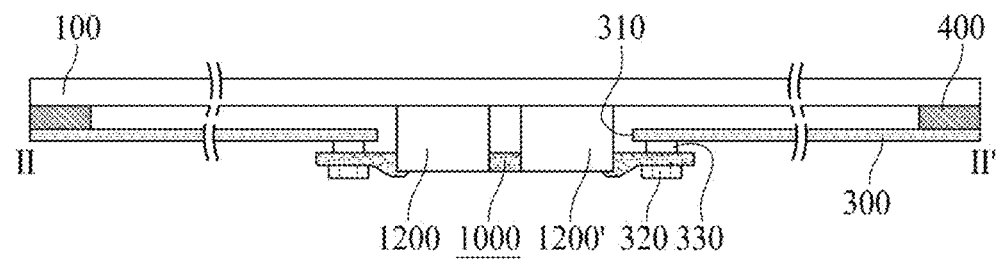
FIG. 5B is a cross-sectional view taken along the line II-II' of FIG. 5A.

FIG. 5A illustrates another example embodiment of a sound generating device according to an example embodiment of the present disclosure. FIG. 5B is a cross-sectional view taken along the line II-II' of FIG. 5A. With reference to FIG. 5A, a display apparatus 10 may include a display panel 100, which displays an image, and first and second sound generating devices 1200 and 1200' that vibrate the display panel 100 to generate a sound.

The first sound generating device 1200 and the second sound generating device 1200' may be disposed adjacent to each other. When a plurality of sound generating devices are disposed apart from one another, it is difficult to uniformly maintain a contact characteristic between the sound generating devices and the display panel 100, and sound quality is degraded due to interference and delay between the plurality of sound generating devices. Therefore, in an example embodiment of the present disclosure where sound generating devices are disposed adjacent to each other, interference or delay between sound waves generated by the sound generating devices may be reduced compared to a case where a plurality of sound generating devices are disposed apart from one another, and thus, a sound output characteristic may be enhanced. The first structure or the second structure described above with reference to FIG. 2A or 2B may be applied to a structure of the first sound generating device 1200 and the second sound generating device 1200'.

The display apparatus 10 may include a fixing device 1000 for fixing the first sound generating device 1200 and the second sound generating device 1200'. The fixing device 1000 may include a mold structure that may be formed of a material, such as plastic and/or the like, through a molding process, but is not limited thereto. The fixing device 1000 will be described below with reference to FIG. 6.

With reference to FIG. 5B, the display apparatus 10 may include the first sound generating device 1200, the second sound generating device 1200', and a supporting member 300. The supporting member 300 may support one or more of a rear surface and a side surface of a display panel 100. Also, the supporting member 300 may be a plate member that includes a metal or plastic material and is provided on the rear surface of the display panel 100 or all over the display panel 100.

The first sound generating device 1200 and the second sound generating device 1200' may be accommodated into a hole 310 in the supporting member 300. When the first sound generating device 1200 and the second sound generating device 1200' are inserted or accommodated into and fixed to the hole 310, a height of the first sound generating device 1200 and the second sound generating device 1200' disposed between the rear surface of the display panel 100 and an inner surface of the supporting member 300 may be reduced, and thus, a space or a region for generating a sound may be small.

For example, the display apparatus may further include a nut 330 fixed to the supporting member 300, and the fixing device 1000 may be fixed to the nut 330 by a screw 320 inserted or accommodated into a mounting hole of the fixing device 1000. For example, a hole, for example, a screw-through hole may be in an inner surface of the nut 330, and thus, after the mounting hole of the fixing device 1000 is aligned with the screw-through hole of the nut 330, the fixing device 1000 may be fixed to the supporting member 300 by fastening the screw 320.

The nut 330 may be, for example, a self-clinching nut. An example of the self-clinching nut may include a PEM® nut. If the self-clinching nut is used, a portion of a vibration generated by the first and second sound generating devices 1200 and 1200' may be absorbed by the self-clinching nut. Accordingly, a vibration transferred to the supporting member 300 may be reduced. In the display apparatus according to the present example embodiment, the supporting member 300 and the first and second sound generating devices 1200 and 1200' may be fixed by the nut and the screw in the supporting member, and thus, a thickness of the display panel 100 may be reduced.

An adhesive member 400 may be disposed in an edge or periphery of the display panel 100 and the supporting member 300 and may attach the display panel 100 on the supporting member 300. The adhesive member 400 may include a double-sided tape, a single-sided tape, an adhesive, a bond, and/or the like, but is not limited thereto.

Figure 6:
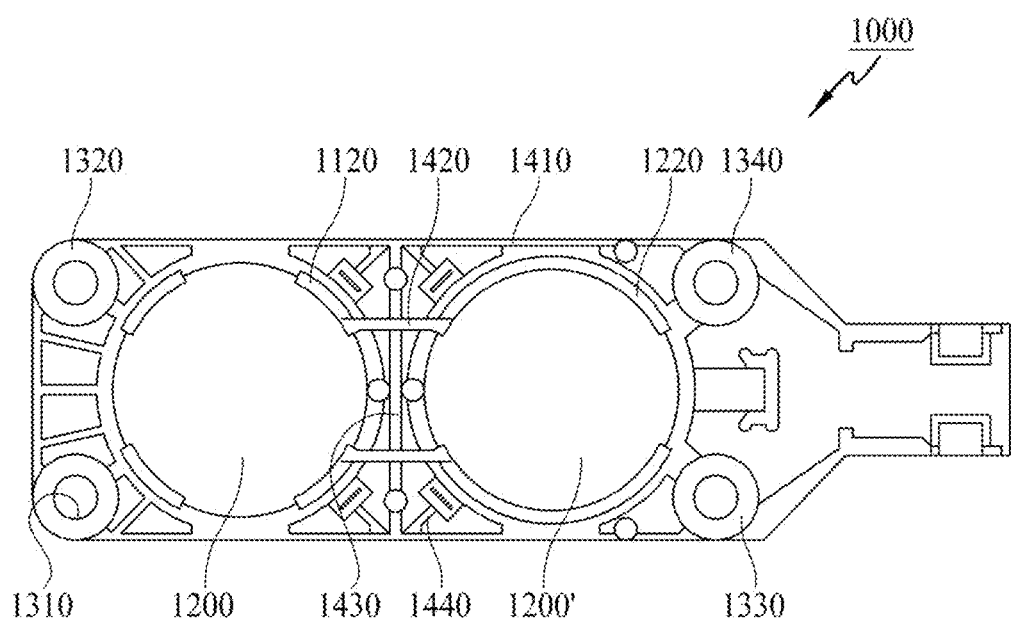
FIG. 6 illustrates a fixing device of a sound generating device according to another example embodiment of the present disclosure.

FIG. 6 illustrates a fixing device according to another example embodiment of a sound generating device in the present disclosure. With reference to FIG. 6, the fixing device 1000 of the sound generating device may be an integrated fixing device that fixes and supports a first sound generating device 1200 and a second generating device 1200' so as to be adjacent to each other. Therefore, the first sound generating device 1200 and the second sound generating device 1200' fixed by the fixing device 1000 may be a pair of sound generating devices and may be referred to as a pair of sound generating devices. The fixing device 1000 of the sound generating device may include a supporting part that supports the first sound generating device 1200 and the second generating device 1200', a plurality of rib parts that are disposed near the first sound generating device 1200 and the second generating device 1200', and a plurality of mounting holes for fixing the fixing device 1000 to a supporting member 300.

For example, the supporting part may include a first supporting part 1120 that supports the first sound generating device 1200 and a second supporting part 1220 that supports the second sound generating device 1200'. The first supporting part 1120 may support a portion of a side surface and a portion of a rear surface of the first sound generating device 1200. The first supporting part 1120 may have a cylindrical shape, but is not limited thereto. The second supporting part 1220 may support a portion of a side surface and a portion of a rear surface of the second generating device 1200'. The second supporting part 1220 may have a cylindrical shape, but is not limited thereto.

For example, the first supporting part 1120 and the second supporting part 1220 may further include two or four arc-shaped protrusions. One surface of each of the protrusions may be bent to an inner portion of each of the first and second sound generating devices 1200 and 1200' and may support a portion of a rear surface of each of the first and second sound generating devices 1200 and 1200', thereby preventing the first and second sound generating devices 1200 and 1200' from deviating to the outside of the fixing device 1000 of the sound generating device.

A plurality of rib parts may be disposed near the first supporting part 1120 and the second supporting part 1220, for maintaining a rigidity of the fixing device 1000 of the sound generating device and preventing the fixing device 1000 of the sound generating device from being deformed even when being used for a long time. For example, the rib parts may include a first rib part 1410 that extends in a widthwise direction from an outer portion of the first and second supporting parts 1120 and 1220, a second rib part 1420 that connects the first supporting part 1120 to the second supporting part 1220 in the widthwise direction, and a third rib part 1430 that is connected to the first rib part 1410 in a lengthwise direction. The widthwise direction may be a direction toward a long side on which a pair of sound generating devices are disposed. The lengthwise direction may be a direction vertical to the widthwise direction. Alternatively, the widthwise direction may be a widthwise direction of a display panel, and a vertical direction may be a lengthwise direction of the display panel.

The first rib part 1410 may long extend in a horizontal direction from an outer surface of the first and second supporting parts 1120 and 1220 to form a widthwise-direction outer structure of the fixing device 1000 of the sound generating device. A central region (i.e., a central region between the first supporting part 1120 and the second supporting part 1220) of the first rib part 1410 may be provided higher in height than and thicker in thickness than both side regions of the first rib part 1410. Therefore, even when two sound generating devices vibrate for a long time, a fixing device of the two sound generating devices is not deformed, and a relative position change between the two sound generating devices and the display panel is reduced.

One or more second rib parts 1420 may be between the first supporting part 1120 and the second supporting part 1220 and may be connected as one body. The one or more second rib parts 1420 may be disposed inward from the first rib part 1410. In FIG. 6, two second rib parts 1420 are illustrated as being provided, but are not limited thereto. In other example embodiments, the second rib part 1420 may be provided as one or three or more.

One or more third rib parts 1430 may be connected to the first rib part 1410 and the second rib part 1420 that are provided as one body. The one or more third rib parts 1430 may extend in the lengthwise direction and may be between second rib parts 1420 or first rib parts 1410.

In the example embodiment of FIG. 6, one third rib part 1430 is illustrated as a long extended structure between two first rib parts 1410, but is not limited thereto. For example, the third rib part 1430 may extend by a short distance between the second rib parts 1420. The rib part may further include one or more fourth rib parts 1440 that obliquely extends between the first supporting part 1120 and the first rib part 1410 or between the second supporting part 1220 and the first rib part 1410. The fourth rib parts 1440 may prevent the bending deformation of the fixing device 1000 of the sound generating device caused by the long-time driving of the sound generating device.

Therefore, the display apparatus according to an example embodiment of the present disclosure may include a fixing device for fixing a pair of sound generating devices and a plurality of rib parts disposed near the sound generating devices. Accordingly, the rigidity of the sound generating device may be maintained, and a sound characteristic change caused by a long-time operation may be reduced.

A distance between the first supporting part 1120 and the second supporting part 1220 may be greater than a minimum threshold value that enables a rib part to be formed, and may be less than a maximum threshold value corresponding to a diameter of the first sound generating device 1200 and the second sound generating device 1200'. If the distance between the first supporting part 1120 and the second supporting part 1220 is greater than the maximum threshold value, sound quality may be degraded. Therefore, the distance between the first supporting part 1120 and the second supporting part 1220 may be adjusted to be less than the diameter of the first sound generating device 1200 and the second sound generating device 1200', and thus, the degradation in sound quality may be reduced or prevented. For example, when a size (or a diameter) of the sound generating device is D, the distance between the first supporting part 1120 and the second supporting part 1220 may be greater than about 7 mm corresponding to an example of the minimum threshold value and may be less than the size D of the sound generating device. In an example embodiment, it may be seen that the change in sound quality characteristic is not greater in a case, where the size D of the sound generating device is about 28 mm, than a case where the size D of the sound generating device is about 0.85*D (about 23.6 mm).

A plurality of holes 1310, 1320, 1330, and 1340 for fixing the fixing device 1000 to the supporting member 300 may be provided. The hole may be in the inner surface of the nut 330 illustrated in FIG. 5B. The holes 1310, 1320, 1330, and 1340 of the fixing device 1000 and the hole of the nut 330 may be aligned, and then, by fastening the screw 320, the fixing device 1000 may be fixed to the supporting member 300. When a pair of sound generating devices according to another example embodiment of the present disclosure is applied, a uniform sound pressure may be generated in a full frequency band, and thus, a good sound output characteristic may be realized.

Figure 7:
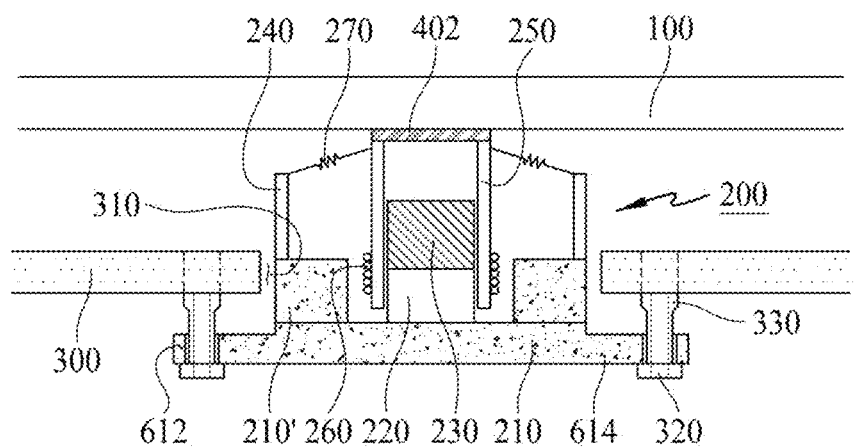
FIG. 7 illustrates a connection structure of a supporting member and a sound generating device according to an example embodiment of the present disclosure.

FIG. 7 illustrates a connection structure of a supporting member and a sound generating device according to an example embodiment of the present disclosure. In an example embodiment of the present disclosure, all of a sound generating device having the first structure and a sound generating device having the second structure may be applied. Hereinafter, a sound generating device having the second structure will be described for example. With reference to FIG. 7, a sound generating device 200 may include a diameter enlargement part 614. The diameter enlargement part 614 may be provided as one body with a first plate 210 of the sound generating device 200. The first plate 210 of the sound generating device 200 may not have a cylindrical shape. One portion of the first plate 210 may include a protrusion that is greater than a diameter of the other portion of the first plate 210. A protrusion region having an enlarged diameter may be referred to as a diameter enlargement part 614. The diameter enlargement part 614 may have a ring shape. Also, an extension part 612 for fixing the sound generating device 200 may be provided in a portion of the diameter enlargement part 614.

A screw 320 and a nut 330 may be in the extension part 612. The sound generating device 200 may be coupled or connected to a supporting member 300 by the screw 320 by using the nut 330 fixed to the supporting member 300. The nut 330 may be, for example, a self-clinching nut. An example of the self-clinching nut may include a PEM® nut, and the present example embodiment is not limited thereto. If the self-clinching nut is used, a portion of a vibration generated by the sound generating device 200 may be absorbed by the self-clinching nut that is the nut 330, and thus, a vibration transferred to the supporting member 300 may be reduced. Also, the sound generating device 200 may be accommodated into the hole 310 in the supporting member 300.

The display panel 100 may be attached on the bobbin 250 of the sound generating device 200. The adhesive member 402 may include a double-sided tape, a single-sided tape, an adhesive, a bond, and/or the like, but is not limited thereto. As in FIG. 7, the adhesive member 402 may be in a portion where the sound generating device 200 is attached on the display panel 100, but is not limited thereto. In other example embodiments, the adhesive member 402 may be provided on a whole rear surface of the display panel 100. For example, the adhesive member 402 may be provided on a whole surface between the display panel 100 and the sound generating device 200.

Figure 8:
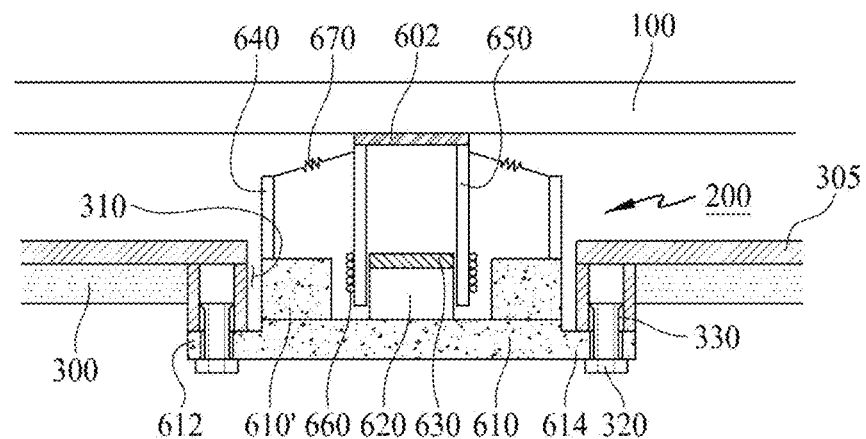
FIG. 8 illustrates a connection structure of a supporting member and a sound generating device according to another example embodiment of the present disclosure.

FIG. 8 illustrates a connection structure of a supporting member and a sound generating device 200 according to another example embodiment of the present disclosure. In an example embodiment of the present disclosure, all of a sound generating device having the first structure and a sound generating device having the second structure may be applied. Hereinafter, the second structure will be described for example.

With reference to FIG. 8, a sound generating device 200 may include a magnet 620 disposed on a first plate 610, a center pole 630 disposed on the magnet 620, a bobbin 650 disposed near the magnet 620 and the center pole 630, and a coil 660 wound around the bobbin 650. For example, a second plate 610' may be disposed near the first plate 610, and a frame 640 may be disposed near the second plate 610'. Also, a damper 670 may be between the frame 640 and the bobbin 650. A description of the sound generating device 200 is the same as description given above with reference to FIG. 2, and thus, is omitted.

The sound generating device 200 may further include a diameter enlargement part 614. The diameter enlargement part 614 may be provided as one body with the first plate 610 of the sound generating device 200. The first plate 610 of the sound generating device 200 may have a cylindrical shape. One side of the first plate 610 may include a protrusion that is greater than a diameter of the other portion of the first plate 610. A protrusion region having a relatively enlarged diameter may be referred to as a diameter enlargement part 614. The diameter enlargement part 614 may be provided in a ring shape. Also, an extension part 612 for fixing the sound generating device 200 may be in a portion of the diameter enlargement part 614.

A screw 320 and a nut 330 may be provided in the extension part 612. The nut 330 may be, for example, a self-clinching nut. An example of the self-clinching nut may include a PEM® nut, and the present example embodiment is not limited thereto. The sound generating device 200 may be fixed to the supporting member 300 by the screw 320 and the nut 330. If the self-clinching nut is used for connecting the supporting member 300 to the sound generating device 200, a vibration generated by the sound generating device 200 may be absorbed by the self-clinching nut, and thus, a vibration transferred to the supporting member 300 may be reduced. In a case where the supporting member 300 is directly coupled or connected to the sound generating device 200 without the self-clinching nut, a vibration that is generated when the sound generating device 200 is operating may be transferred to the supporting member 300 for a long time. When the supporting member 300 has a thin thickness, the supporting member 300 may be bent or deformed. For example, when the supporting member 300 is thin, the sound generating device 200 may be directly coupled or connected to the screw 320 of the supporting member 300. Accordingly, a fixing force between the supporting member 300 and the sound generating device 200 may not be sufficient.

Therefore, if a nut is provided for fixing a sound generating device to a supporting member, bending or deformation of the supporting member may be prevented, and a thickness of the supporting member may be thickened for enhancing a fixing force between the supporting member and the sound generating device. Because a thickness of the supporting member is thickened, a problem where a thickness of a display apparatus is thickened may occur. In a case where the supporting member is formed of glass or stainless steel for improving an appearance design of the display apparatus, it is unable to insert a nut into the supporting member.

Therefore, a second supporting member 305 may be further provided on the supporting member 300 in order for the nut 330 to be inserted or accommodated into the supporting member 300. The second supporting member 305 may be disposed more adjacent to the display panel 100 than the supporting member 300. The second supporting member 305 may be formed of a metal material, and the nut 330 may be inserted or accommodated into the second supporting member 305. The sound generating device 200 may be coupled or connected to the supporting member 300 and the second supporting member 305 by the screw 320 using the nut 330 fixed to the supporting member 300. The sound generating device 200 may be accommodated by a hole 310 in the second supporting member 305 and the supporting member 300. The supporting member 300 and the second supporting member 305 may be fixed by an adhesive member. The adhesive member may include a double-sided tape, a single-sided tape, an adhesive, a bond, and/or the like, but is not limited thereto. The second supporting member 305 may be formed of, for example, aluminum (Al) that is a metal material, but is not limited thereto. The second supporting member 305 may be referred to as an inner plate.

Because the supporting member 300 is formed of glass or stainless steel, an appearance design of the display apparatus may be improved. Therefore, because the second supporting member 305 is further provided, the sound generating device 200 may get close to a front surface of the display panel 100 by a distance corresponding to a thickness of the supporting member 300, and thus, a thickness of the display apparatus may be reduced. Therefore, because the second supporting member is further provided, the sound generating device may be implemented to be thinner, and thus, a thickness of the display apparatus may be reduced. Therefore, because the second supporting member is further provided, a thickness of the sound generating device may be reduced, thereby solving a problem where a thickness or height of a supporting plate covering the sound generating device increases. Accordingly, the sound generating device and a electrical wiring may be under the supporting plate, thereby providing a display apparatus having a sense of beauty in appearance.

An adhesive member 602 for attaching the sound generating device 200 on the display panel 100 may be provided. The adhesive member 602 may include a double-sided tape, a single-sided tape, an adhesive, a bond, and/or the like, but is not limited thereto. As shown in FIG. 8, the adhesive member 602 may be provided in a portion where the sound generating device 200 is attached on the display panel 100, but is not limited thereto. In other example embodiments, the adhesive member 602 may be on a whole rear surface of the display panel 100. For example, the adhesive member 602 may be on a whole surface between the display panel 100 and the sound generating device 200.

Figure 9A:
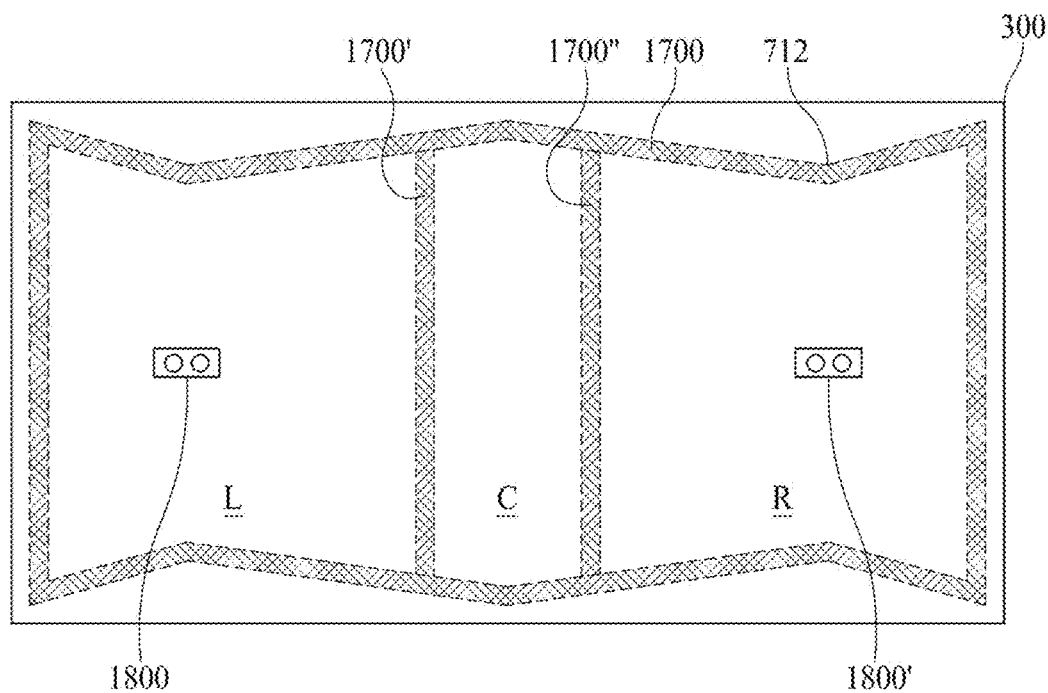
FIGS. 9A and 9B illustrate a sound generating device and a partition in a display apparatus according to an example embodiment of the present disclosure.
Figure 9B:
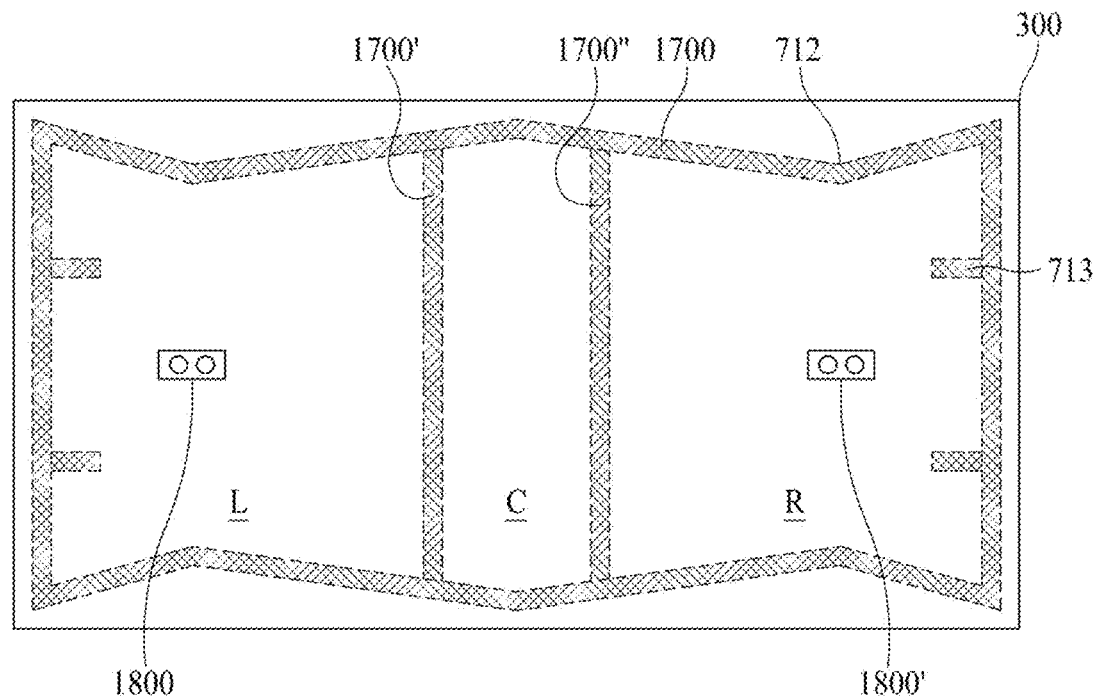

FIGS. 9A and 9B illustrate a sound generating device and a partition in a display apparatus according to an example embodiment of the present disclosure. With reference to FIGS. 9A and 9B, a display panel 100 may include a first region L, a second region R, and a third region C. The first region L may be a left region of a rear surface of the display panel 100, the second region R may be a right region of the rear surface of the display panel 100, and the third region C may be a central region of the rear surface of the display panel 100. The left region and the right region may be compatible, and for convenience, description will be given below with reference to the illustration. A first sound generating device 1800 may be disposed in the first region L of the rear surface of the display panel 100, and a second sound generating device 1800' may be disposed in the second region R of the rear surface of the display panel 100.

For example, the first sound generating device 1800 and the second sound generating device 1800' may be configured as a pair of sound generating devices. The pair of sound generating devices may be the same as descriptions given above with reference to FIGS. 5 and 6, and thus, their detailed descriptions will be omitted. A partition may be provided between the first sound generating device 1800 and the second sound generating device 1800'. The partition may include a first partition 1700, a second partition 1700', and a third partition 1700". Each of the first partition 1700, the second partition 1700', and the third partition 1700" may be an air gap or a space where a sound is generated when the display panel 100 vibrates by the first sound generating device 1800 and the second sound generating device 1800'. Also, the second partition 1700' and the third partition 1700" may separate a left sound and a right sound respectively generated by the first sound generating device 1800 and the second sound generating device 1800'.

A sound wave that is generated when a display panel vibrates by a vibration generating device may be spread radially from a center of the vibration generating device and may propagate. The sound wave may be referred to as a progressive wave. The progressive wave may be reflected by one side of a partition to generate a reflected wave, and the reflected wave may propagate in a direction opposite to the progressive wave. The reflected wave overlaps and interferes in the progressive wave and does not propagate, thereby generating a standing wave that stands at a certain position. A sound pressure is reduced by the standing wave, and for this reason, a sound output characteristic is reduced. Therefore, a bent part 712 may be in the partition in order to decrease the degree of reduction in sound pressure caused by the standing wave generated by interference between the reflected wave and the progressive wave. Also, the standing wave that causes the sound pressure to be reduced is much generated at a position at which a level of the progressive wave and the reflected wave is high. Accordingly, the bent part may be disposed at a position at which a level of a sound wave transferred from the vibration generating device is highest. This will be described below.

With reference to FIGS. 9A and 9B, a partition may be provided, and a bent part 712 may be further provided on at least one side of the partition. The first sound generating device 1800 may be in the first region L that is the left region of the rear surface of the display panel 100, and the second sound generating device 1800' may be provided in the second region R that is the right region of the display panel 100. Also, the second partition 1700' and the third partition 1700" may be between the first sound generating device 1800 and the second sound generating device 1800'.

The first partition 1700 may be between the display panel 100 and the supporting member 300. For example, the first partition 1700 may be in an edge or periphery of the supporting member 300. The first partition 1700, the second partition 1700', and the third partition 1700" may be on the rear surface of the display panel 100 or an upper surface of the supporting member 300. The first partition 1700 may be in an edge or periphery of the display panel 100. For example, the first partition 1700 may be in an edge or periphery of the rear surface of the display panel 100. Here, an example where the first partition 1700 is in the supporting member 300 will be described.

A bent part 712 may be on one or more sides of the first partition 1700. The bent part 712 may be on one or more sides, which a strongest sound wave reaches, of four sides of the first partition 1700 and may be configured to face the first and second sound generating devices 1800 and 1800'. For example, the bent part 712 may be configured to face the first and second sound generating devices 1800 and 1800'. The bent part 712 may be configured with two rectilinear parts and may be provided at a position at which the two rectilinear parts contact each other. Accordingly, the degree of reduction in a sound pressure caused by a standing wave may be reduced.

With reference to FIG. 9B, the bent part 712 and a protrusion 713 may be in the first partition 1700. For example, the bent part 712 may be provided on one or more sides of the first partition 1700, and one or more protrusions 713 may be on a side vertical to a side on which the bent part 712 is provided. The protrusion 713 may more decrease the degree of reduction in a sound pressure caused by a standing wave that occurs due to interference between a reflected wave and a progressive wave.

A substrate configuring the display panel 100 may use a glass substrate. In order to implement a display apparatus having a thin thickness, a thickness of the glass substrate may be thinly adjusted. For example, using the glass substrate having a thickness thinned from 0.7 mm to 0.5 mm, the display apparatus may be more thinly implemented. Because the thickness of the substrate is thinned, in a case where the partition is provided on the rear surface of the display panel 100 or an upper surface of a supporting member, a problem where the display panel 100 is not flat and a step height is formed in the display panel 100 occurs due to the partition when the supporting member is attached on the display panel 100. For example, a problem where the display panel 100 is not flat and a screen is unevenly seen occurs due to a shape of the bent part bounced to a screen of the display panel 100 or a separated portion of the bent part, for example, a portion where the two rectilinear portions contacts each other. Such a phenomenon may be referred to as an uneven phenomenon or a wave phenomenon of the display panel 100, and the term is not limited thereto. This will be described below with reference to FIGS. 10 to 12B.

Figure 10:
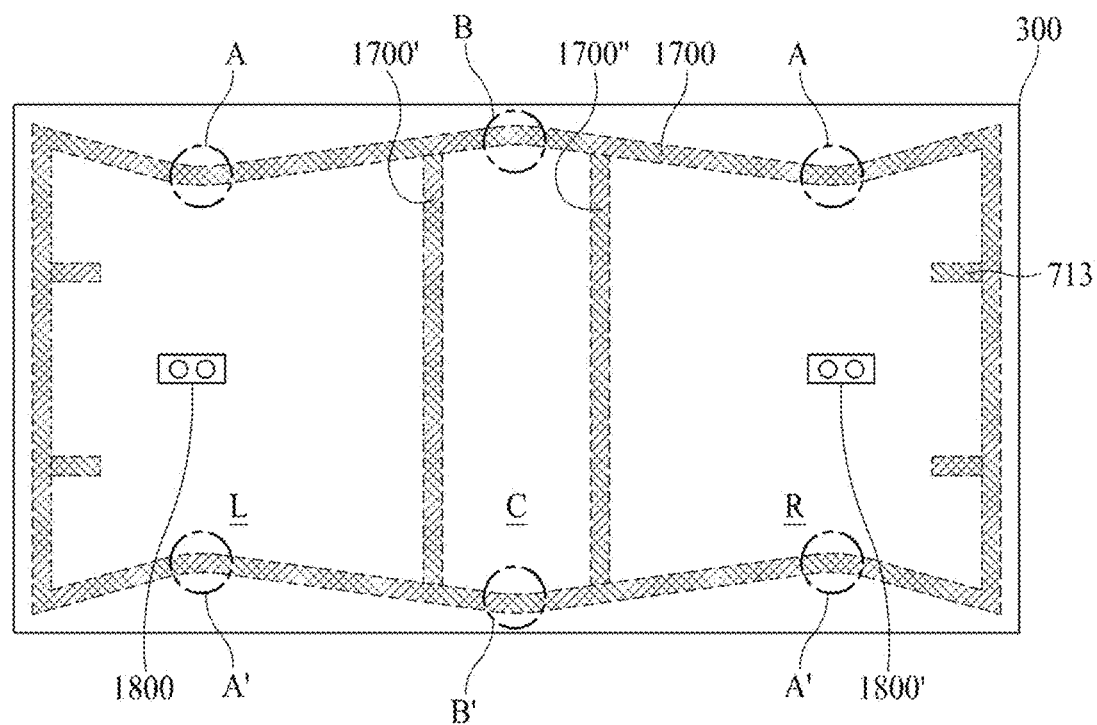
FIG. 10 illustrates a sound generating device and a partition in a display apparatus according to an example embodiment of the present disclosure.

FIG. 10 illustrates a sound generating device and a partition in a display apparatus according to an example embodiment of the present disclosure. With reference to FIG. 10, a display panel according to an example embodiment of the present disclosure may be implemented by changing the shape of the bent part 712, described above with reference to FIG. 9, to a concave shape or a round shape. This is for solving a wave phenomenon of the display panel by changing the shape of the bent part 712. An experiment result obtained by testing the display panel according to the present example embodiment will be described below with reference to FIGS. 11 and 12.

Figure 11A:
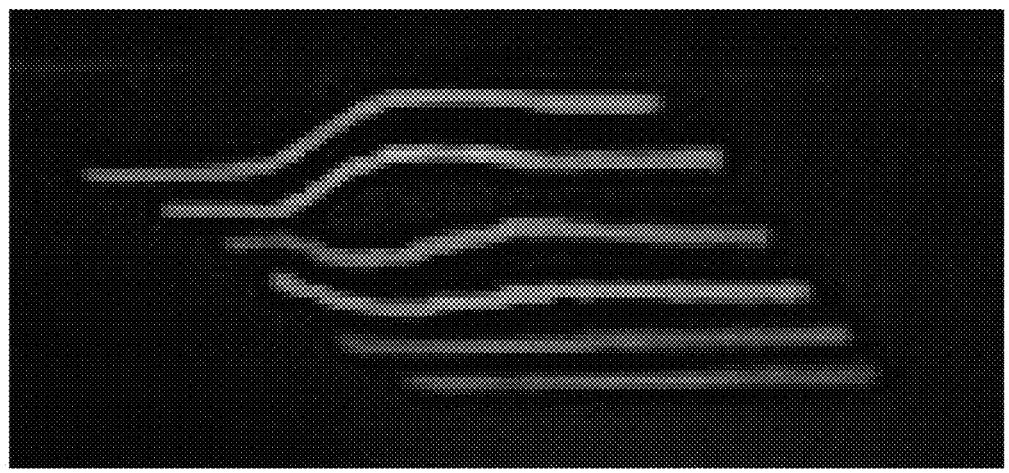
FIGS. 11A to 12B illustrate a result obtained by measuring a rear surface of a display panel in a display apparatus according to an example embodiment of the present disclosure.
Figure 11B:
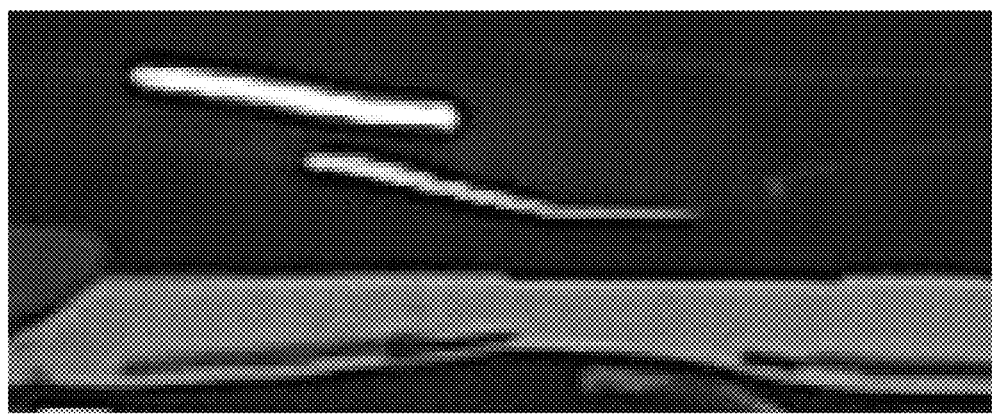

FIGS. 11A to 12B illustrate a result obtained by measuring a rear surface of a display panel. FIGS. 11A and 11B are diagrams showing results obtained by measuring a region A and a region A' of FIG. 10. The region A and the region A' may be disposed in a supporting member 300. The region A may be a bent part 712 in a first partition 1700 in a first region L, and the region A' may be a bent part 712 in a first partition 1700 in a second region R. FIG. 11A shows the region A of FIG. 10, and FIG. 11B shows the region A' of FIG. 10. In FIGS. 11A and 11B, a white portion is a portion where a wave phenomenon occurs. Therefore, it may be seen that the wave phenomenon of the display panel occurs less in the region A' (FIG. 11B) than the region A (FIG. 11A), but the wave phenomenon still occurs.

Figure 12A:
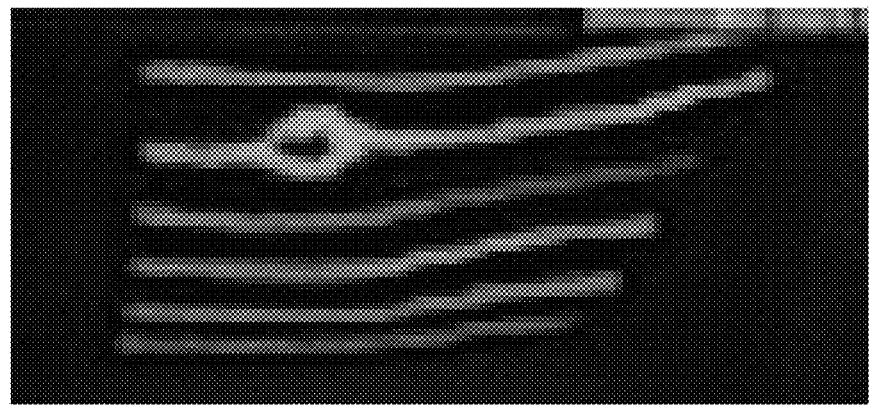
Figure 12B:
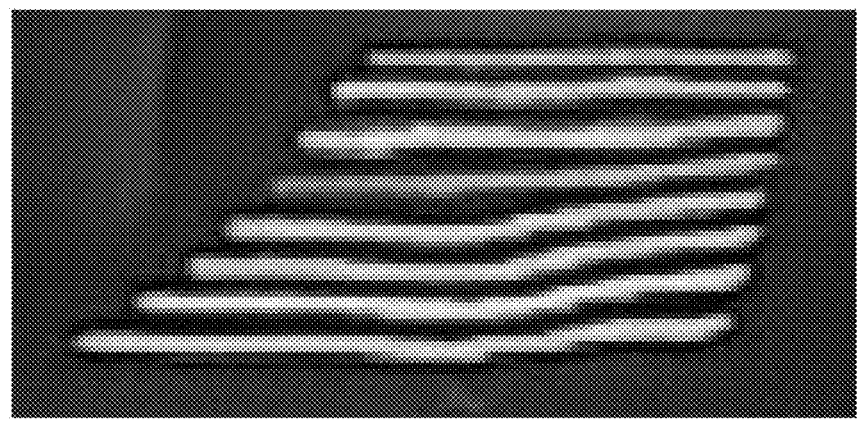

FIGS. 12A and 12B illustrate results obtained by measuring a region B and a region B' of FIG. 10. The region B and the region B' may be disposed in a supporting member 300. Each of the region B and the region B' may be a bent part 712 in a first partition 1700 in a third region C. FIG. 12A shows the region B of FIG. 10, and FIG. 12B shows the region B' of FIG. 10. In FIGS. 12A and 12B, a white portion is a portion where a 'wave phenomenon occurs. Therefore, it may be seen that the wave phenomenon of the display panel occurs less in the region B' (FIG. 12B) than the region B (FIG. 12A), but the wave phenomenon occurs still. Accordingly, it may be seen that, even when a shape of a bent part is modified, the wave phenomenon still occurs. The inventors have performed an experiment on a material of a first partition, and this will be described below with reference to FIGS. 13A and 13B.

Figure 13A:
FIGS. 13A and 13B illustrate a display panel and a supporting member according to an example embodiment of the present disclosure.
Figure 13B:
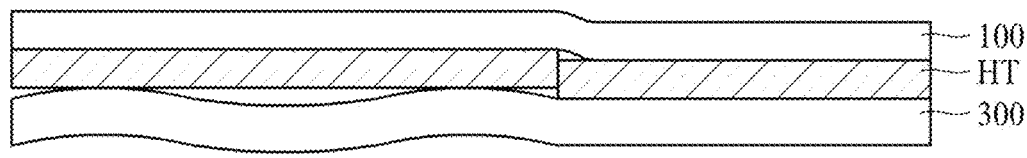

FIGS. 13A and 13B illustrate a display panel and a supporting member according to an example embodiment of the present disclosure. With reference to FIG. 13A, a first partition may be between a display panel 100 and a supporting member 300. The first partition may be formed of a soft tape (ST) including a soft material. When the first partition is formed of the soft tape, the inventors have recognized that the display panel 100 is not flat, based on flatness or bending of the supporting member 300. Therefore, the inventors have recognized that a wave phenomenon of the display panel 100 occurs. Accordingly, the inventors have performed an experiment under a condition where a material of the first partition is changed to a stiff material.

With reference to FIG. 13B, a first partition between a display panel 100 and a supporting member 300 may be formed of a hard tape (HT) including a stiff material. When the first partition is formed of the hard tape, it may be seen that a wave phenomenon caused by flatness or bending of the supporting member 300 is reduced, but a wave phenomenon still occurs due to a step height of a tape for attachment of the display panel 100 adjacent to the supporting member 300. The first partition has difficulty in a process of attaching the first partition on an outer portion of the display panel or the supporting member in order for a user not to see a wave phenomenon. When such attachment is needed, it is difficult to output a desired sound or to tune a sound.

Therefore, the inventors have configured a bent part that allows a vibration to be laterally spread, for controlling a peak or dipping caused by a standing wave of a sound generating device in a lengthwise direction (a lengthwise direction of a display panel), but have recognized that the wave phenomenon still occurs. For this reason, the inventors have performed various experiments for controlling the peak or the dipping caused by the standing wave or decreasing the wave phenomenon. Through the various experiments, the inventors have invented a display apparatus having a new structure. This will be described below with reference to FIGS. 14 to 23C.

Figure 14:
FIG. 14 illustrates a display panel and a supporting member according to another example embodiment of the present disclosure.

FIG. 14 illustrates a display apparatus according to another example embodiment of the present disclosure. With reference to FIG. 14, a partition T between the display panel 100 and the supporting member 300 may be a first material T1 and a second material T2 that are two or more materials instead of one material. For example, the partition T may include two or more materials having different stiffness. As described above with reference to FIG. 13A, when the partition T is formed of only soft materials, the partition T may be affected by flatness of bending of a supporting member 300, and thus, a partition adjacent to a display panel 100 may be formed of the first material T1, which is a stiff material.

As described above with reference to FIG. 13B, when the partition T is formed of only stiff materials, a problem may occur due to a step height between the supporting member and other elements, and thus, a partition adjacent to the supporting member may be formed of the second material T2, which is a soft material. For example, the first material T1 included in the partition, which is more adjacent to the display panel than the second material T2, may be formed of a material, which is high in stiffness, and the second material T2 included in the partition, which is more adjacent to the supporting member, may be formed of a material than the first material T1, which is low in stiffness. Therefore, a material included in the partition adjacent to the supporting member 300 may decrease the degree to which the display panel 100 is pulled in a process of attaching the supporting member 300 on the display panel 100, and in order to reduce the step height between the supporting member 300 and the other elements, the partition may be formed of the second material T2. Also, the partition may be formed of the first material T1 so as to solve a problem where the display panel 100 is not flat due to flatness or bending of the supporting member 300.

For example, a 25% compression force deflection (CFD) value of a material that is high in stiffness may be 0.25 or more. For example, a 25% CFD value of a material that is low in stiffness may be less than 0.25. CFD may be a compressive force needed for causing deformation and may be divided into 25%, 40%, 50%, and 60%, based on ASTM D3574 test. 25% CFD may be a force needed for causing 25% deformation of an arbitrary material. For example, when a material having 100 mm is pressed to be 75 mm (compression by 25 mm), a pressing force may be 25% CFD, and 50% CFD may be a pressing force when a material having 100 mm is pressed to be 50 mm (compression by 50 mm). A material that is high in stiffness may be acryl or polyolefin, but is not limited thereto. A material that is low in stiffness may have a 25% CFD value of less than 0.25. A material that is low in stiffness may be polyurethane or sponge, but is not limited thereto. Also, a material included in the partition may be an adhesive, and the adhesive may be provided on and under a material that is high in stiffness. Accordingly, a material of a stiff base material or a stiff material may be used.

Figure 15A:
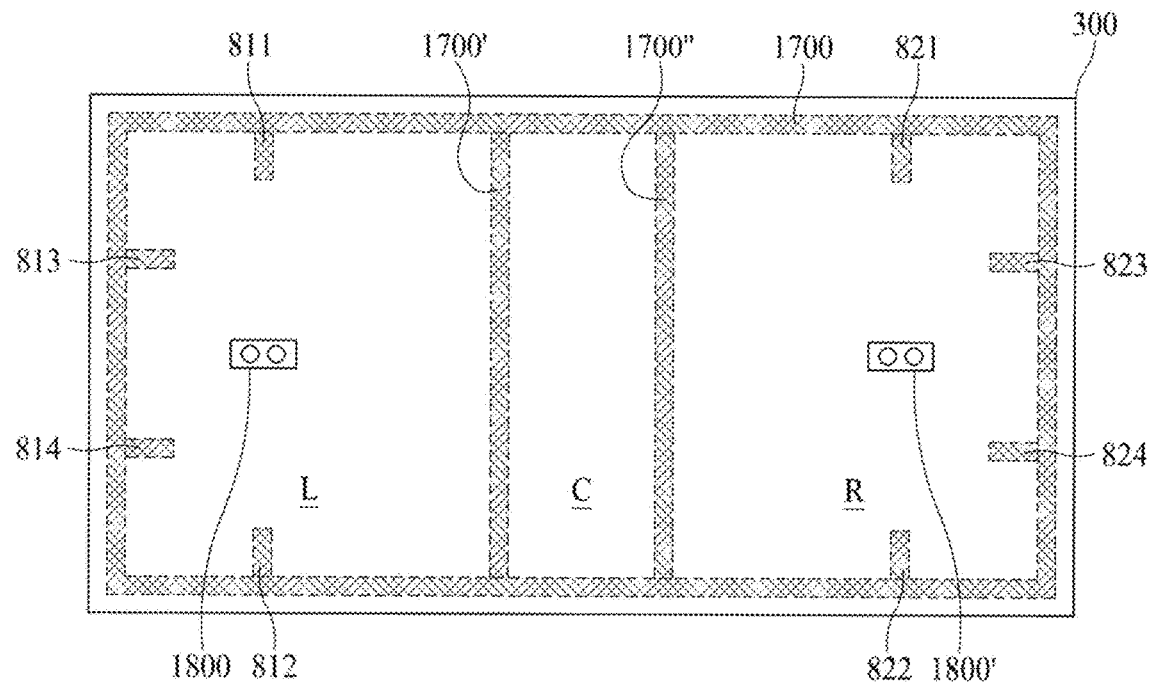
FIGS. 15A to 15C illustrate a sound generating device and a partition according to another example embodiment of the present disclosure.
Figure 15B:
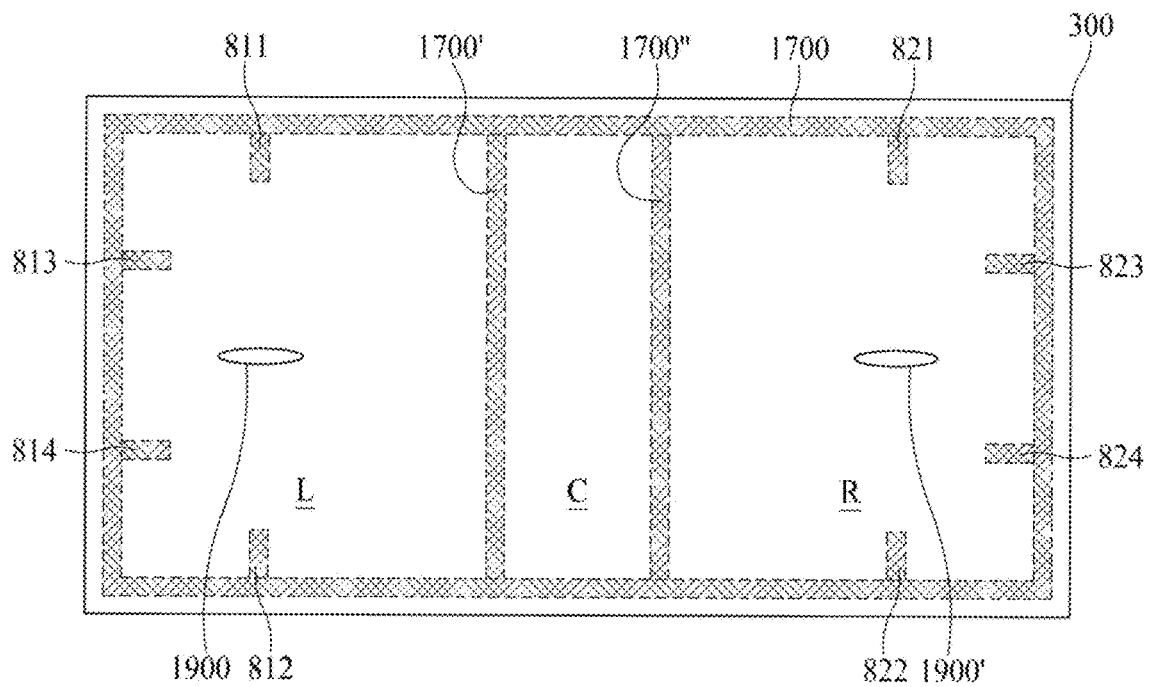
Figure 15C:
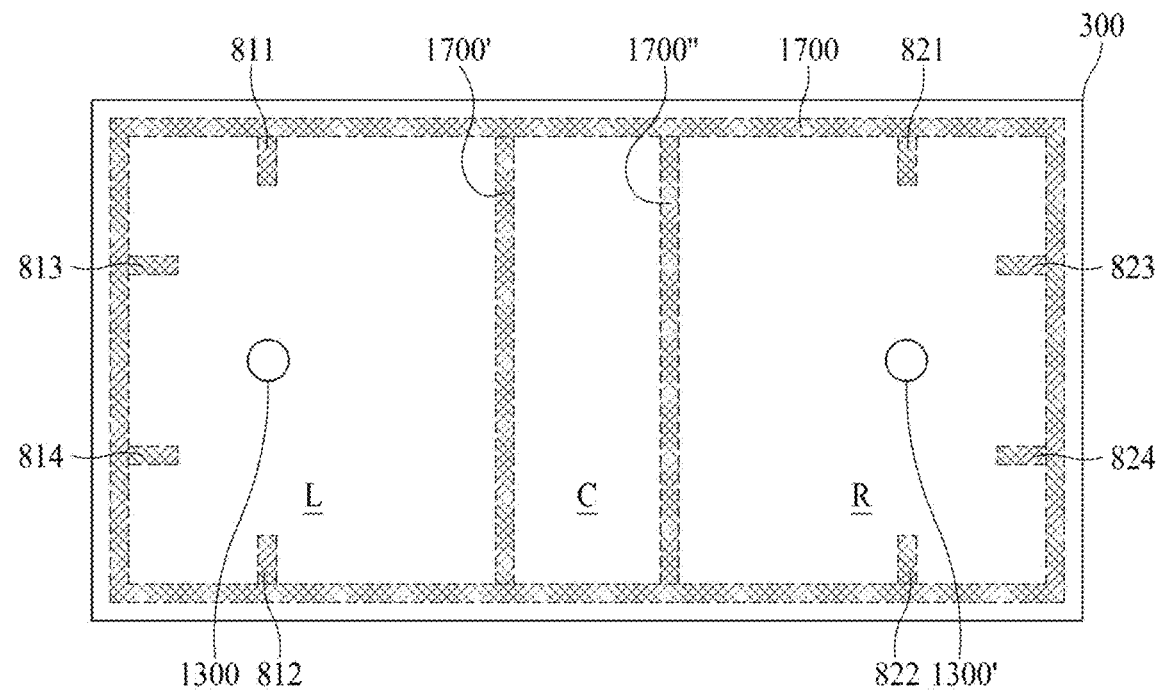

FIGS. 15A to 15C illustrate a sound generating device and a partition according to another example embodiment of the present disclosure. With reference to FIGS. 15A to 15C, a display panel 100 may include a first region L, a second region R, and a third region C. The first region L may be a left region of a rear surface of the display panel 100, the second region R may be a right region of the rear surface of the display panel 100, and the third region C may be a central region of the rear surface of the display panel 100. At least one sound generating device may be in at least one of the first region L, the second region R, and the third region C. The at least one sound generating device may include one or more of a circular sound generating device, an oval sound generating device, and a pair of sound generating devices. The at least one sound generating device may vibrate the display panel 100 to generate a sound. For example, the at least one sound generating device may directly vibrate the display panel 100 to generate a sound.

With reference to FIGS. 15A to 15C, a first sound generating device 1800 and a second sound generating device 1800' may be respectively in the first region L and the second region R of the display panel 100. The first sound generating device 1800 may be disposed in the first region L of a rear surface of the display panel 100, and the second sound generating device 1800' may be in the right region R of the rear surface of the display panel 100. As described above with reference to FIGS. 7 and 8, the first sound generating device 1800 and the second sound generating device 1800' may be coupled or connected to a supporting member 300 and may be between the display panel 100 and the supporting member 300.

Therefore, the first sound generating device 1800 may be disposed in the first region L that is the left region of the rear surface of the display panel 100 and may vibrate the left region L of the display panel 100, and the second sound generating device 1800' may be disposed in the second region L that is the right region of the rear surface of the display panel 100 and may vibrate the right region R of the display panel 100. The first sound generating device 1800 and the second sound generating device 1800' may receive different vibration signals and may be independently driven. For example, the first sound generating device 1800 may generate a sound using the left region L of the display panel 100 as a vibration plate, and the second sound generating device 1800' may generate a sound using the right region R of the display panel 100 as a vibration plate. For example, the first sound generating device 1800 and the second sound generating device 1800' may directly vibrate the display panel 100 to generate sounds. Such descriptions may be similarly applied to FIGS. 15B to 22C.

In FIG. 15A, a first sound generating device 1800 and a second sound generating device 1800' may be configured as a pair of sound generating devices. Descriptions of the pair of sound generating devices are the same as descriptions given above with reference to FIGS. 5 and 6, and thus, are omitted. Description given above with reference to FIGS. 7 and 8 may be similarly applied to a connection structure of the first and second sound generating devices 1800 and 1800' and a supporting member.

In FIG. 15B, a first sound generating device 1900 and a second sound generating device 1900' may be configured as an oval sound generating device. The sound generating device described above with reference to FIGS. 1 and 2 may be applied to the oval sound generating device, and a bobbin may be configured in an oval shape. The oval shape may have an elliptical shape, a rectangular shape with rounded corners, or non-circular curved shape having a width different from its height, but is not limited thereto. When the oval sound generating device is applied, a sound output characteristic of a middle to high-pitched sound band may be enhanced. Description given above with reference to FIGS. 7 and 8 may be similarly applied to a connection structure of the first and second sound generating devices 1900 and 1900' and a supporting member.

In FIG. 15C, a first sound generating device 1300 and a second sound generating device 1300' may be configured as a circular sound generating device. The sound generating device described above with reference to FIGS. 1 and 2 may be applied to the circular sound generating device. Description given above with reference to FIGS. 7 and 8 may be applied to a connection structure of the first and second sound generating devices 1300 and 1300' and a supporting member.

A partition and a pad will be described below with reference to FIG. 15A, and their descriptions may be similarly applied to FIGS. 15B and 15C. With reference to FIGS. 15A to 15C, a first partition 1700 may be between a display panel and a supporting member 300. For example, the first partition 1700 may be between a rear surface of the display panel and an upper surface of the supporting member 300. Also, the first partition 1700 may be on the supporting member 300. For example, the first partition 1700 may be in an edge or periphery of the supporting member 300 or an edge or periphery of an upper of the supporting member 300. Also, the first partition 1700 may be in an edge or periphery of the display panel. For example, the first partition 1700 may be in an edge or periphery of the rear surface of the display panel. Also, the first partition 1700 may be a whole region of the rear surface of the display panel or the supporting member 300. Also, the first partition 1700 may be a whole region of four outer sides of the supporting member 300 or the whole region of the rear surface of the display panel.

With reference to FIG. 15A, at least two partitions (for example, a second partition 1700' and a third partition 1700") may be disposed between a first sound generating device 1800 and a second sound generating device 1800'. For example, the second partition 1700' may be disposed between a first region L and a third region C, and the third partition 1700" may be disposed between a second region R and the third region C. The first partition 1700, the second partition 1700' and the third partition 1700" may each be an air gap or a space where a sound is generated when the display panel 100 vibrates. An air gap or a space that generates or transfers a sound may be referred to as a "partition." A partition may be referred to as an "enclosure" or a "baffle," but the term is not limited thereto. Also, the first partition 1700, the second partition 1700' and the third partition 1700" may have a sealed structure, or may have an unsealed structure.

The first partition 1700, the second partition 1700' and the third partition 1700" may prevent a sound from being leaked to the outside through each side surface of a display panel 100, and thus, the sound may be output to only a forward region in front of the display panel 100, thereby enhancing a sound output characteristic. The first partition 1700, the second partition 1700' and the third partition 1700" may be disposed between the display panel 100 and the supporting member 300. For example, the first partition 1700, the second partition 1700' and the third partition 1700" may be disposed between a rear surface of the display panel 100 and an upper surface of the supporting member 300. Also, the first partition 1700, the second partition 1700' and the third partition 1700" may be disposed in the supporting member 300. Also, the first partition 1700, the second partition 1700' and the third partition 1700" may be disposed in the display panel 100. In FIGS. 15A to 22C, an example where the first partition 1700, the second partition 1700' and the third partition 1700" are disposed in the supporting member 300 will be described.

The second partition 1700' and the third partition 1700" may separate a left sound and a right sound respectively generated by the first sound generating device 1800 of the left region L and the second sound generating device 1800' of the second region R. Also, a vibration of the display panel 100 performed in a space or an air gap defined as the second partition 1700' and the third partition 1700" may be attenuated or absorbed by a center of the display panel 100, and thus, a sound generated in the first region L may be prevented from being transferred to a space of the second region R. Therefore, because the second partition 1700' and the third partition 1700" are provided, the left sound and the right sound may be separated from each other, and thus, a sound output characteristic may be enhanced. Also, the first sound generating device 1800 and the second sound generating device 1800' may output a sound of a middle-pitched sound band and a sound of a high-pitched sound band and may output a stereo sound separating the left and right sounds, thereby providing a display apparatus having a two-channel sound output characteristic. Here, the middle-pitched sound band may be 200 Hz to 3 kHz, the high-pitched sound band may be 3 kHz or more, and a low-pitched sound band may be 200 Hz or less. However, the present example embodiment is not limited thereto.

A partition having a double structure including two or more partitions may be provided between the first sound generating device 1800 and the second sound generating device 1800'. For example, a left region and a right region of a display panel have the same vibration characteristic when realizing a mono sound where the left and right regions output the same sound, and for this reason, a resonance phenomenon or an interference phenomenon is maximized in a certain frequency band, causing the reduction in sound pressure. Therefore, the partition may be configured in a structure including two or more partitions, for decreasing an influence of a sound characteristic caused by a resonance frequency difference of a middle-high-pitched sound that occurs in the first sound generating device in the first region L (the left region) and the second sound generating device in the second region R (the right region). When three or more partitions are provided between the first sound generating device 1800 and the second sound generating device 1800', a sound pressure is prevented from being reduced even when sound interference in the left and right regions increases, thereby preventing a sound output characteristic from being discontinuously recognized.

Therefore, two or more partitions may be provided in a central region of a display panel, thereby decreasing an influence of a sound characteristic caused by a resonance frequency difference between a middle sound and a high sound in a left region and a right region of the display panel. Also, a partition may be between two sound generating devices, and thus, a left sound and a right sound may be separated from each other, thereby enhancing a stereo characteristic of a sound. Also, a different sound of the middle-pitched sound band may be output by the two sound generating devices.

The first sound generating device 1800 may be provided in the first region L that is the left region, the second sound generating device 1800' may be provided in the second region R that is the right region, and a sound generating device may not be provided in a third region C that is a central region. Accordingly, the degradation in sound quality caused by interference in the first region L and the second region R may be reduced. Also, a sound characteristic corresponding to the middle-pitched and high-pitched sound bands may be more enhanced. Also, an area of the third region C may be adjusted to be less than an area of the first region L and an area of the second region R. Accordingly, a sound of the low-pitched sound band may be enhanced. Also, the third region C may decrease the degradation in sound quality caused by interference in the first region L and the second region R. Accordingly, a sound of the low-pitched, middle-pitched, and high-pitched sound bands may be enhanced. Descriptions of the first partition 1700, the second partition 1700', and the third partition 1700" may be substantially similarly applied to FIGS. 15B to 22C.

In FIGS. 15A to 22C, the first partition 1700 may be the adhesive member described above with reference to FIG. 1. Also, the adhesive member for attaching the supporting member on the display panel may be further provided between the display panel and the supporting member described above with reference to FIG. 1. For example, the adhesive member may be further provided in an edge or periphery of the display panel or an edge or periphery of the supporting member.

FIGS. 15A to 22C illustrate an example where the sound generating device is in the left region or the right region without being disposed in a center of the left region (the first region L) or the right region (the second region R) of the display panel 100, but the present example embodiment is not limited thereto. In other example embodiments, the sound generating device may be in the center of the left region (the first region L) or the right region (the second region R) of the display panel 100. Alternatively, the sound generating device may be asymmetrically in the first region L and the second region R of the display panel 100. A stereo sound characteristic may be more enhanced in a case, where the sound generating device lean to the left region or the right region, than a case where the sound generating device is disposed in the center of the left region (the first region L) or the right region (the second region R) of the display panel 100.

As described above with reference to FIGS. 9A to 12B, the bent part 712 may be provided in the first partition 1700 so as to decrease a peak and dipping that are caused by a standing wave occurring in a lengthwise direction of the first and second sound generating devices 1800 and 1800'. Here, the peak may be a phenomenon where a sound pressure bounces in a specific frequency, and the dipping may be a phenomenon where generating of a specific frequency is suppressed, and thus, a low sound pressure is generated. A sound output characteristic of the display apparatus is reduced by the peak or the dip. Also, the inventors have recognized that the first partition 1700 should be implemented in another shape, for decreasing a wave phenomenon caused by the bent part. Therefore, the inventors have recognized that the first partition 1700 should be disposed based on a shape of the display panel 100 without the bent part, for decreasing the wave phenomenon.

Therefore, the first partition 1700 may be disposed along a shape of the display panel 100. For example, the first partition 1700 may have a tetragonal (e.g., quadrilateral) shape, but is not limited thereto. In other example embodiments, a shape of the first partition 1700 may be modified based on a shape of the display panel 100. If the display panel 100 is a curved display panel having a curved shape or the like, the first partition 1700 may have a curved shape or a curve shape. Accordingly, the first partition 1700 may be disposed along a shape of the display panel 100, and thus, a degree to which the display panel 100 is pulled is reduced in a process of attaching the supporting member on the display panel 100, thereby preventing the wave phenomenon.

However, if the partition is configured as the first partition 1700, it is unable to control the peak and the dipping caused by the standing wave, and thus, the inventors have recognized that the first partition 1700 should have a structure for controlling the peak and the dipping caused by the standing wave. The structure may be configured to prevent the wave phenomenon and to enable the peak and the dipping caused by the standing wave to be easily controlled. The structure is not implemented through a simple procedure but has been implemented through various experiments.

Therefore, at least one pad may be on at least one side of the first partition 1700, for decreasing the peak and the dipping caused by the standing wave. For example, the first partition 1700 may include a first side and a second side vertical to the first side, and at least one first pad 811 may be on the first side. At least one second pad 812 may be disposed to face the at least one first pad 811. The at least one first pad 811 and the at least one second pad 812 may be in the first region L. The first pad 811 and the second pad 812 may be provided as one or as a plurality. The first side may be a widthwise direction of the display panel 100 or the supporting member 300, and the second side may be a lengthwise direction of the display panel 100 or the supporting member 300. The widthwise direction and the lengthwise direction may be interchangeable.

At least one seventh pad 821 and at least one eighth pad 822 may be in the second region R. The at least one eighth pad 822 may be disposed to face the at least one seventh pad 821. The seventh pad 821 and the eighth pad 822 may be provided as one or as a plurality. The at least one first pad 811 and the at least one second pad 812 may be provided to face the first sound generating device 1800. The at least one seventh pad 821 and the at least one eighth pad 822 may be provided to face the second sound generating device 1800'. For example, the first pad 811 and the second pad 812 may be disposed in the first region L to face the first sound generating device 1800, and the seventh pad 821 and the eighth pad 822 may be disposed in the second region R to face the second sound generating device 1800'. Therefore, the pads 811, 812, 821, and 822 may decrease the peak or the dipping caused by the standing wave that occurs in a lengthwise direction of the first sound generating device 1800 and the second sound generating device 1800' and may allow a vibration to laterally transferred, thereby enhancing a sound output characteristic.

A shape of the pads 811, 812, 821, and 822 may be implemented to prevent the wave phenomenon from occurring when the display panel 100 is pulled in a process of attaching a pad, disposed on the supporting member, on the display panel 100. Alternatively, a shape of the pads 811, 812, 821, and 822 may be implemented to prevent the wave phenomenon from occurring when the display panel 100 is pulled in a process of attaching the pad, disposed on the supporting member, on the display panel 100. Therefore, the inventors have performed various experiments on shapes of the pads 811, 812, 821, and 822 so as to reduce the wave phenomenon that occurs when the bent part is configured as described above with reference to FIGS. 9A to 12B, for decreasing the peak or the dip caused by the standing wave.

For example, an example where a partition is disposed on a supporting member will be described, and even when the partition is disposed on a rear surface of the display panel, a wave phenomenon may occur. Therefore, the partition may be disposed on the rear surface of the display panel or an upper surface of the supporting member and may be disposed between the rear surface of the display panel or the upper surface of the supporting member, but is not limited thereto. Accordingly, the shape of the pads is not modified through a simple procedure but has been modified through various experiments. For example, the shape of the pads should be implemented to prevent the wave phenomenon and to enable the peak and the dip caused by the standing wave to be easily controlled. The pads have been implemented in a tetragonal (e.g., quadrilateral) shape or an end-rounded tetragonal (e.g., quadrilateral) shape through various experiments.

At least one third pad 813 and at least one fourth pad 814 may be further provided on a second side of the first partition 1700. The at least one third pad 813 and the at least one fourth pad 814 may be disposed in the first region L. For example, the third pad 813 and the fourth pad 814 may be provided as one or as a plurality on one or more sides of the first partition 1700. The at least one third pad 813 and the at least one fourth pad 814 may be provided to face the first sound generating device 1800. The third pad 813 and the fourth pad 814 may be disposed symmetrically with respect to the first sound generating device 1800. Also, at least one ninth pad 823 and at least one tenth pad 824 may be further provided on the second side of the first partition 1700. The at least one ninth pad 823 and the at least one tenth pad 824 may be disposed in the second region R.

For example, the ninth pad 823 and the tenth pad 824 may be provided as one or as a plurality on one or more sides of the first partition 1700. The at least one ninth pad 823 and the at least one tenth pad 824 may be provided to face the second sound generating device 1800'. The ninth pad 823 and the tenth pad 824 may be disposed symmetrically with respect to the second sound generating device 1800'. The pads 813, 814, 823, and 824 may further decrease a peak or dipping caused by a standing wave generated by interference between a reflected wave and a progressive wave and may prevent sound quality from being degraded by the standing wave or the reflected wave. For example, the third pad 813 and the fourth pad 814 may be disposed on a second side of the first partition 1700 of the first region L, and the ninth pad 823 and the tenth pad 824 may be disposed on a second side of the first partition 1700 of the second region R. In FIG. 15A, the pads 813, 814, 823, and 824 may be provided as one or as a plurality on one of a first side and a second side vertical among four sides of the display panel 100, but is not limited thereto and may be provided as two or more.

As described above with reference to FIGS. 13A to 14, the first partition 1700 may include two or more materials including materials having different stiffness. The two or more materials may be materials having different stiffness, and for example, two materials will be described below. The present example embodiment is not limited thereto, and the first partition 1700 may include two materials having high stiffness and one material having low stiffness. The two or more materials may include a first material and a second material. For example, the first material included in a partition adjacent to the display panel may include a material that is high in stiffness, and the second material included in a partition adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Even when the first partition 1700 is not disposed closest to an edge or periphery of the rear surface of the display panel 100 or an edge or periphery of the upper surface of the supporting member, a wave phenomenon seen on a screen of the display panel 100 may be reduced. Accordingly, a desired sound may be output. Also, the first partition 1700 may be configured based on the shape of the display panel 100, and thus, workability may be improved in a process of attaching the display panel 100 on the supporting member that supports the rear surface of the display panel 100.

Various experiments have been performed so that the first to fourth pads 811, 812, 813, and 814 and the seventh to tenth pads 821 to 824 are formed of materials for decreasing a degree to which the display panel 100 is pulled in a process of attaching the supporting member 300 on the display panel 100. The inventors have recognized that the pads 811, 812, 813, 814, and 821 to 824 disposed in the first partition 1700 should be formed of materials for decreasing a degree to which the display panel 100 is pulled in a process of contacting the display panel 100. Therefore, the inventors have performed various experiments on a material that prevents the wave phenomenon and enable the peak or the dip caused by the standing wave to be controlled, instead of simply changing a material. The inventors have recognized that the pads 811, 812, 813, 814, and 821 to 824 should be formed of materials that are the same as that of the first partition 1700, based on various experiments. When the pads 811, 812, 813, 814, and 821 to 824 are formed of materials that are the same as that of the first partition 1700, the inventors have recognized that the display panel is less pulled and a wave phenomenon caused by flatness or bending of the supporting member is reduced. A partition and a pad disposed in the supporting member are described with reference to FIGS. 15A to 22C, but without being limited thereto, the same description may also be applied to a case where the partition and the pad are disposed on the rear surface of the display panel 100.

Therefore, the first to fourth pads 811 to 814 and the seventh to tenth pads 821 to 824 may be formed of materials that are the same as that of the first partition 1700. Also, the second partition 1700' and the third partition 1700" may be disposed in the first partition 1700, and thus, the first to fourth pads 811 to 814 may be formed of materials that are the same as those of the seventh to tenth pads 821 to 824. For example, at least one of the first partition 1700, the second partition 1700', and the third partition 1700" may be formed of the same material as that of the first pad 811. Alternatively, the first partition 1700, the second partition 1700', and the third partition 1700" may be formed of the same material as that of the first pad 811.

Alternatively, the second partition 1700' and the third partition 1700" may be formed of the same material as that of the first partition 1700. For example, the first to fourth pads 811 to 814 and the seventh to tenth pads 821 to 824 may be formed of two or more materials including materials having different stiffness. For example, the two or more materials may include a first material and a second material. For example, the first material included in a partition adjacent to the display panel may include a material that is high in stiffness, and the second material included in a partition adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

As a size of the first to fourth pads 811 to 814 and a size of the seventh to tenth pads 821 to 824 increase, it may be easy to control the peak or the dip caused by the standing wave. For example, if a width of the first pad 811 and a width of the second pad 812 is less than 10 mm, it may be difficult to control the peak or the dipping caused by the standing wave. Therefore, the width of the first pad 811 and the width of the second pad 812 may be adjusted to about 10 mm or more. Also, a size of the third and fourth pads 813 and 814 may be adjusted to be equal to that of the first pad 811, but is not limited thereto. For example, a width of the third pad 813 may be adjusted to about 10 mm or more, and a length of the third pad 813 may be adjusted to about 30 mm or less. However, the present example embodiment is not limited thereto.

A size of the first pad 811 and the seventh pad 821 may be equal to or greater than that of the second pad 812 and the eighth pad 822, but the present example embodiment is not limited thereto. A length of the first pad 811 may be equal to or longer than that of the second pad 812. For example, the length of the first pad 811 may be about 90 mm or less and the length of the second pad 812 may be about 30 mm or less, but the present example embodiment is not limited thereto. The length of the first pad 811 and the length of the second pad 812 may be similarly applied to the seventh pad 821 and the eighth pad 822 provided in the second region R. a size of the first to fourth pads 811 to 814 may be similarly applied to the seventh to tenth pads 821 to 824 provided in the second region R.

A shape of the first to fourth pads 811 to 814 and a shape of the seventh to tenth pads 821 to 824 may be a tetragonal (e.g., quadrilateral) shape or an end-rounded tetragonal (e.g., quadrilateral) shape, but are not limited thereto and may be provided as various shapes such as a circular shape. Therefore, because one or more pads are provided on at least one side of a partition, the wave phenomenon may decrease, and the peak or the dipping caused by the standing wave may be reduced, thereby enhancing a sound output characteristic. Also, because the partition and the pads are formed of two or more materials having different stiffness, the wave phenomenon may decrease. In FIG. 15A, a pair of sound generating devices have been described above for example, and the description of FIG. 15A may be similarly applied to a circular sound generating device and an oval sound generating device. The description of FIG. 15A may be similarly applied to FIGS. 16A to 22C.

Figure 16A:
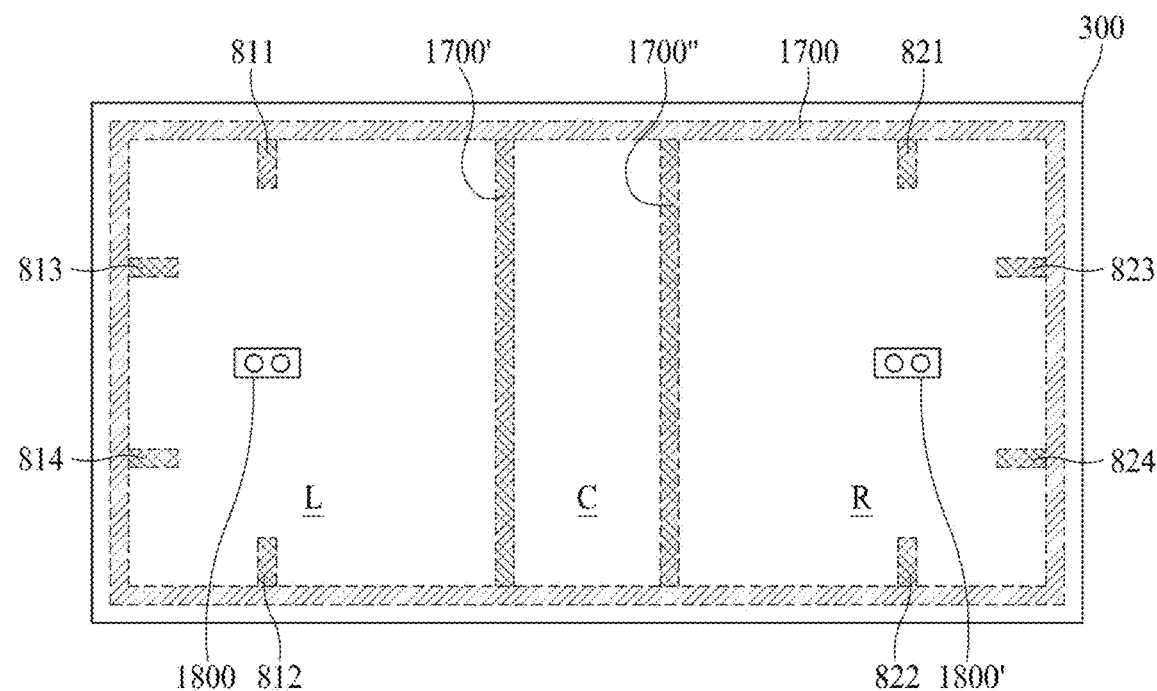
FIGS. 16A to 16C illustrate a sound generating device and a partition according to another example embodiment of the present disclosure.
Figure 16B:
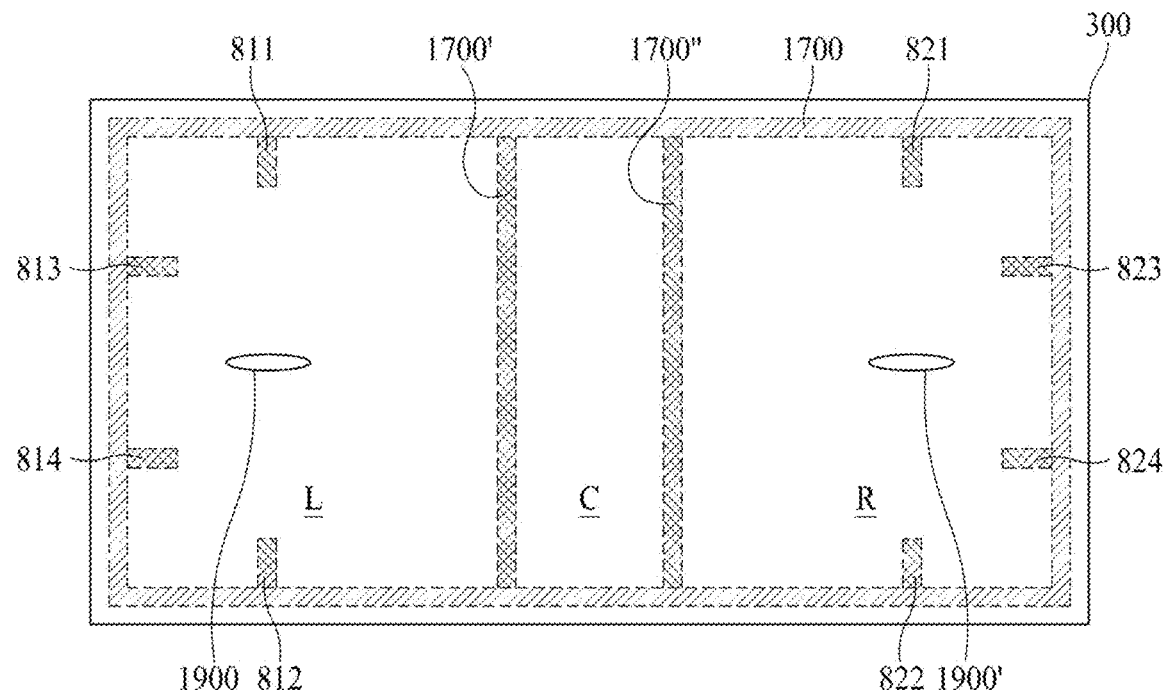
Figure 16C:
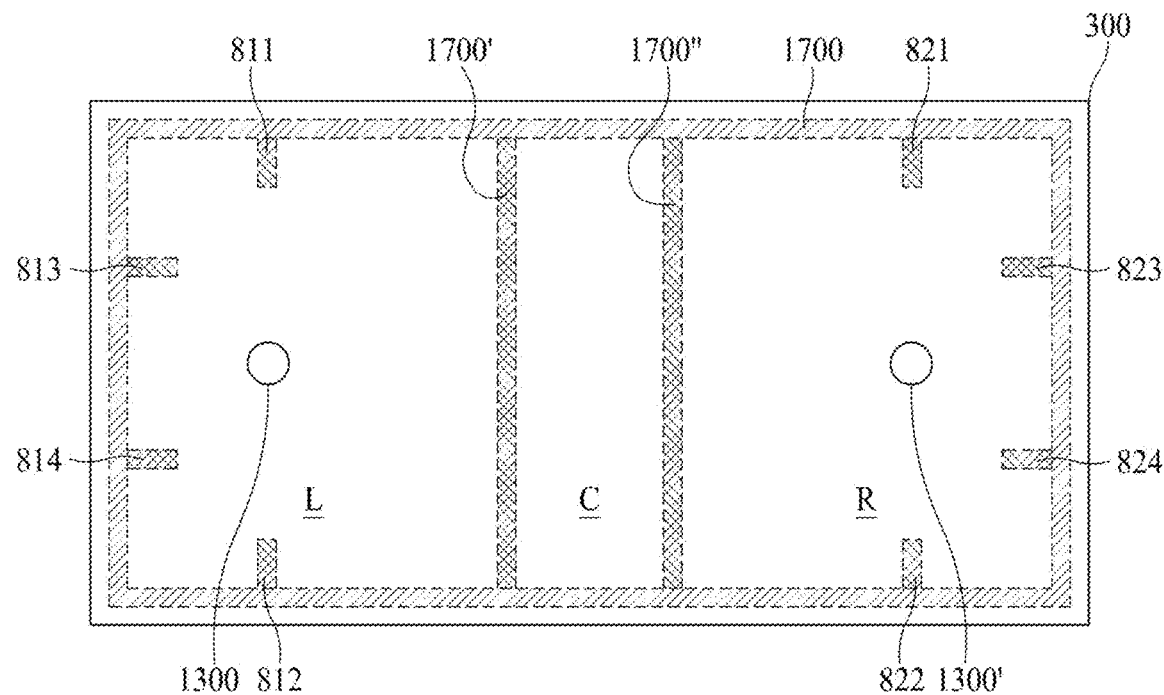

FIGS. 16A to 16C illustrate a sound generating device and a partition according to another example embodiment of the present disclosure. In FIGS. 16A to 16C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. A partition and a pad will be described below with reference to FIG. 16A, and their descriptions may be similarly applied to FIGS. 16B and 16C.

In FIGS. 16A to 16C, a first partition 1700 may include two or more materials including materials having different stiffness. An adhesive force between a display panel and a supporting member may be enhanced, but sound quality may be affected thereby. In order to enhance sound quality, the inventors have recognized that the first partition 1700 is formed of one material instead of two or more materials. Also, the first partition 1700 may be disposed in an outermost portion of the display panel, a wave phenomenon may not be seen. For example, the one material may be a double-sided tape or a single-sided tape, but is not limited thereto. Comparing with a single-sided tape, the inventors have recognized that, when the first partition 1700 is formed of a double-sided tape, the wave phenomenon is not reduced, but the adhesive force between the display panel and the supporting member is enhanced and sound quality is enhanced. Accordingly, the first partition 1700 may be formed of a material having elasticity that enables compression to be made to a certain degree. The first partition 1700 may be formed of polyurethane, polyolefin, polyethylene, and/or the like, but are not limited thereto.

A second partition 1700' and a third partition 1700" may be formed of the same material as that of a first pad 811, but are not limited thereto. The second partition 1700' and the third partition 1700" may be formed of the same material as that of the first partition 1700. For example, the second partition 1700' and the third partition 1700" may be formed of a double-sided tape or a double-sided foam pad. The second partition 1700' and the third partition 1700" may be formed of polyurethane, polyolefin, polyethylene, and/or the like, but are not limited thereto. When the second partition 1700' and the third partition 1700" are formed of the same material as that of the first pad 811, a wave phenomenon of the display panel may be reduced more than a case where the second partition 1700' and the third partition 1700" are formed of the same material as that of the first partition 1700. The second partition 1700' and the third partition 1700" may be formed of the same material as that of the first partition 1700, based on a difference of a degree to which the wave phenomenon of the display panel is seen.

First to fourth pads 811 to 814 and seventh to tenth pads 821 to 824 may be formed of materials that differ from that of the first partition 1700. The first to fourth pads 811 to 814 and the seventh to tenth pads 821 to 824 may be formed of materials that differ from that of the second partition 1700' or the third partition 1700". For example, the first to fourth pads 811 to 814 and the seventh to tenth pads 821 to 824 may be formed of two or more materials including materials having different stiffness. The wave phenomenon of the display panel may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, because the partition and the pads are formed of different materials, the wave phenomenon may decrease, and a desired sound may be output, thereby enhancing a sound output characteristic.

Figure 17A:
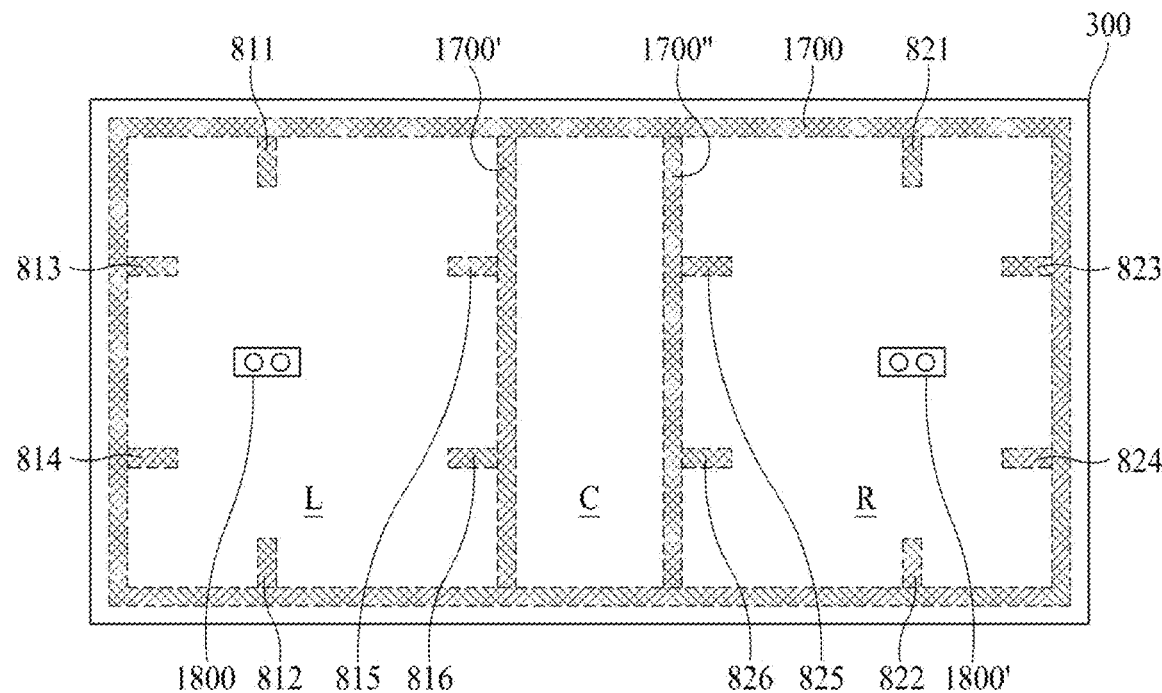
FIGS. 17A to 17C illustrate a sound generating device and a partition according to another example embodiment of the present disclosure.
Figure 17B:
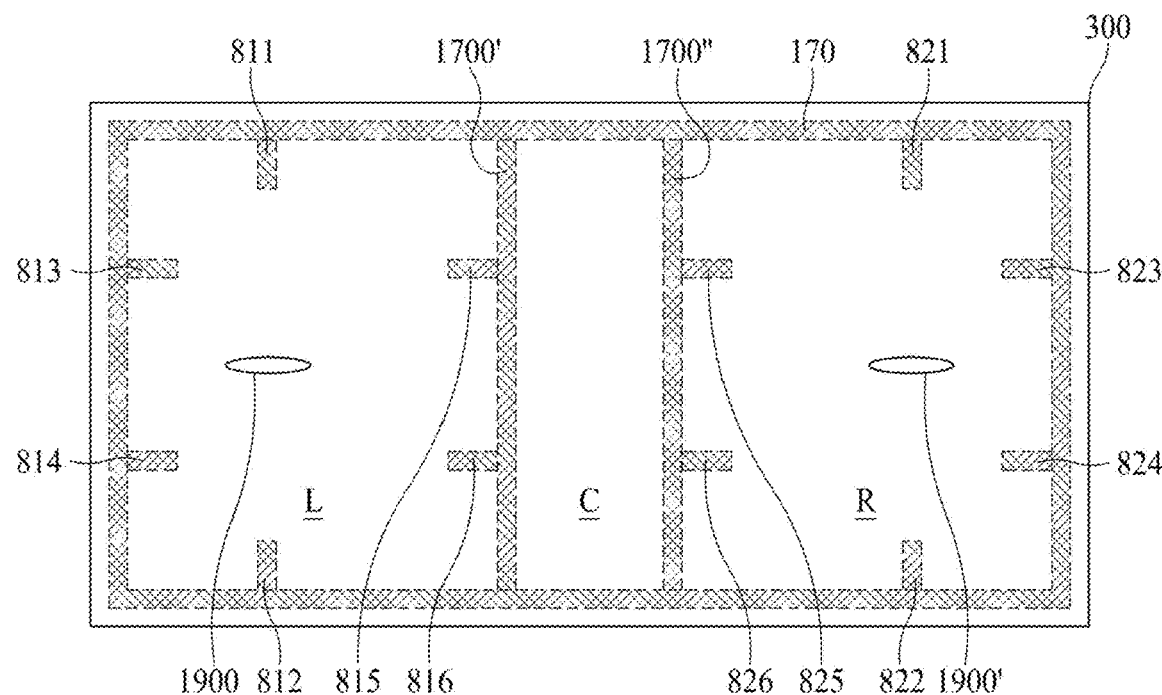
Figure 17C:
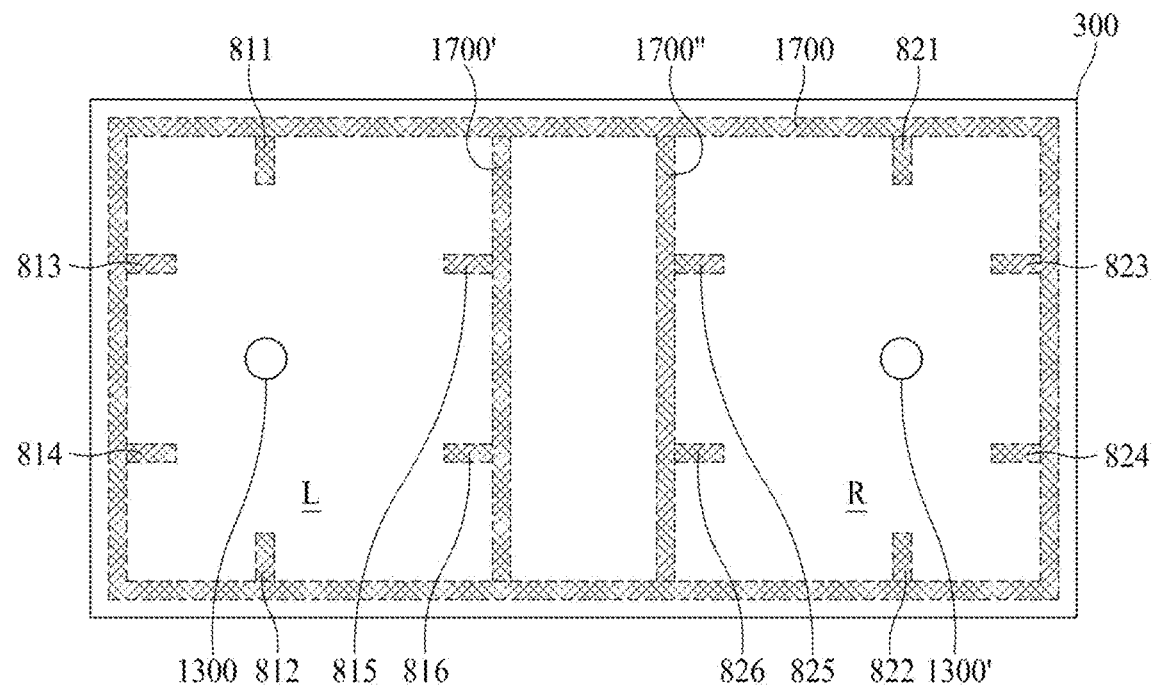

FIGS. 17A to 17C illustrate a sound generating device and a partition according another example embodiment of to the present disclosure. In FIGS. 17A to 17C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. A partition and a pad will be described below with reference to FIG. 17A, and their descriptions may be similarly applied to FIGS. 17B and 17C.

With reference to FIG. 17A, a first partition 1700 may be between a display panel and a supporting member. For example, the first partition 1700 may be between a rear surface of the display panel and an upper surface of the supporting member. A second partition 1700' and a third partition 1700" that are at least two partitions may be between a first sound generating device 1800 and a second sound generating device 1800'. For example, the second partition 1700' may be between a first region L and a third region C, and the third partition 1700" may be between a second region R and the third region C.

At least one fifth pad 815 and at least one sixth pad 816 may be further provided on one side of the second partition 1700'. The at least one fifth pad 815 and the at least one sixth pad 816 may be disposed in the first region L. The at least one fifth pad 815 and the at least one sixth pad 816 may be disposed to face the first sound generating device 1800. The at least one fifth pad 815 and the at least one sixth pad 816 may be disposed to face a third pad 813 and a fourth pad 814, but are not limited thereto. For example, the fifth pad 815 and the sixth pad 816 may be disposed to be symmetrical or asymmetrical with the third pad 813 and the fourth pad 814 with respect to the first sound generating device 1800. For example, the third pad 813 may be located at upper portion than the first sound generating device 1800, and the fifth pad 815 may be located at lower portion than the first sound generating device 1800.

At least one eleventh pad 825 and at least one twelfth pad 826 may be further provided on one side of the third partition 1700". The at least one eleventh pad 825 and the at least one twelfth pad 826 may be in the second region R. The at least one eleventh pad 825 and the at least one twelfth pad 826 may be disposed to face the second sound generating device 1800". The at least one eleventh pad 825 and the at least one twelfth pad 826 may be disposed to face a ninth pad 823 and a tenth pad 824, but are not limited thereto. For example, the eleventh pad 825 and the twelfth pad 826 may be disposed to be symmetrical or asymmetrical with the ninth pad 823 and the tenth pad 824 with respect to the second sound generating device 1800'. For example, the eleventh pad 825 may be located at upper portion than the second sound generating device 1800', and the twelfth pad 826 may be located at lower portion than the second sound generating device 1800'.

The fifth pad 815, the sixth pad 816, the eleventh pad 825, and the twelfth pad 826 may further decrease a peak or dipping caused by a standing wave generated by interference between a reflected wave and a progressive wave and may prevent sound quality from being degraded by the standing wave or the reflected wave. A size of the fifth pad 815, the sixth pad 816, the eleventh pad 825, and the twelfth pad 826 may be equal to or greater than that of the first pad 811 or the third pad 813, but is not limited thereto. A shape of the fifth pad 815, the sixth pad 816, the eleventh pad 825, and the twelfth pad 826 may be the same as that of the first pad 811 or the third pad 813. For example, a shape of the fifth pad 815, the sixth pad 816, the eleventh pad 825, and the twelfth pad 826 may be a tetragonal (e.g., quadrilateral) shape or an end-rounded tetragonal (e.g., quadrilateral) shape, but is not limited thereto and may be provided as various shapes such as a circular shape.

The fifth pad 815, the sixth pad 816, the eleventh pad 825, and the twelfth pad 826 may be formed of the same material as that of the first partition 1700. For example, the fifth pad 815, the sixth pad 816, the eleventh pad 825, and the twelfth pad 826 may be formed of the same material as at least one of a first material and a second material of the first partition 1700. The fifth pad 815, the sixth pad 816, the eleventh pad 825, and the twelfth pad 826 may be formed of the same material as that of the first pad 811.

For example, the fifth pad 815, the sixth pad 816, the eleventh pad 825, and the twelfth pad 826 may be formed of the same material as at least one of a first material and a second material of the first pad 811. The fifth pad 815, the sixth pad 816, the eleventh pad 825, and the twelfth pad 826 may be formed of two or more materials including materials having different stiffness. A wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, because the partition and the pads are formed of two or more materials having different stiffness, the wave phenomenon may decrease.

Figure 18A:
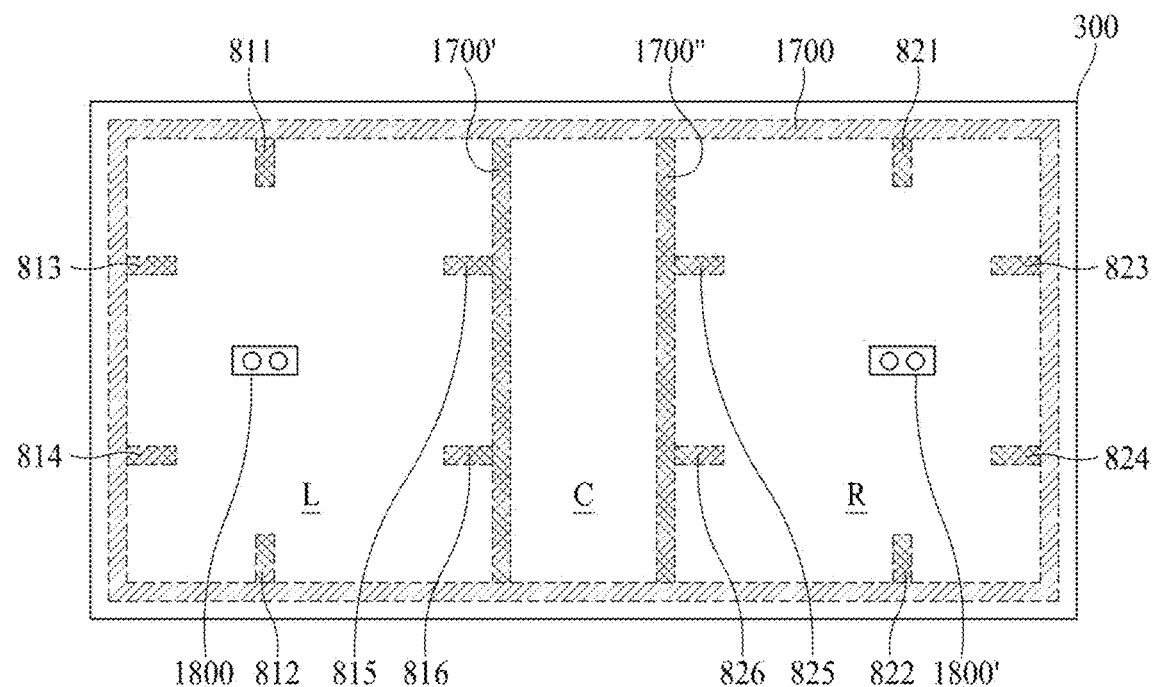
FIGS. 18A to 18C illustrate a sound generating device and a partition according to another example embodiment of the present disclosure.
Figure 18B:
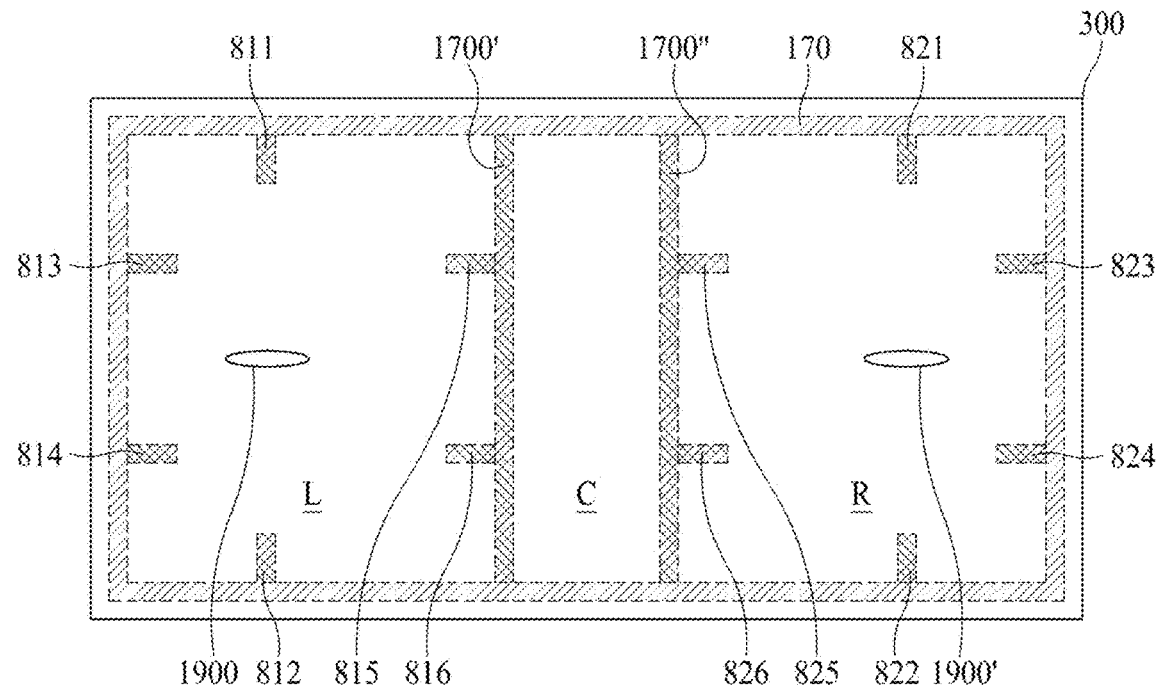
Figure 18C:
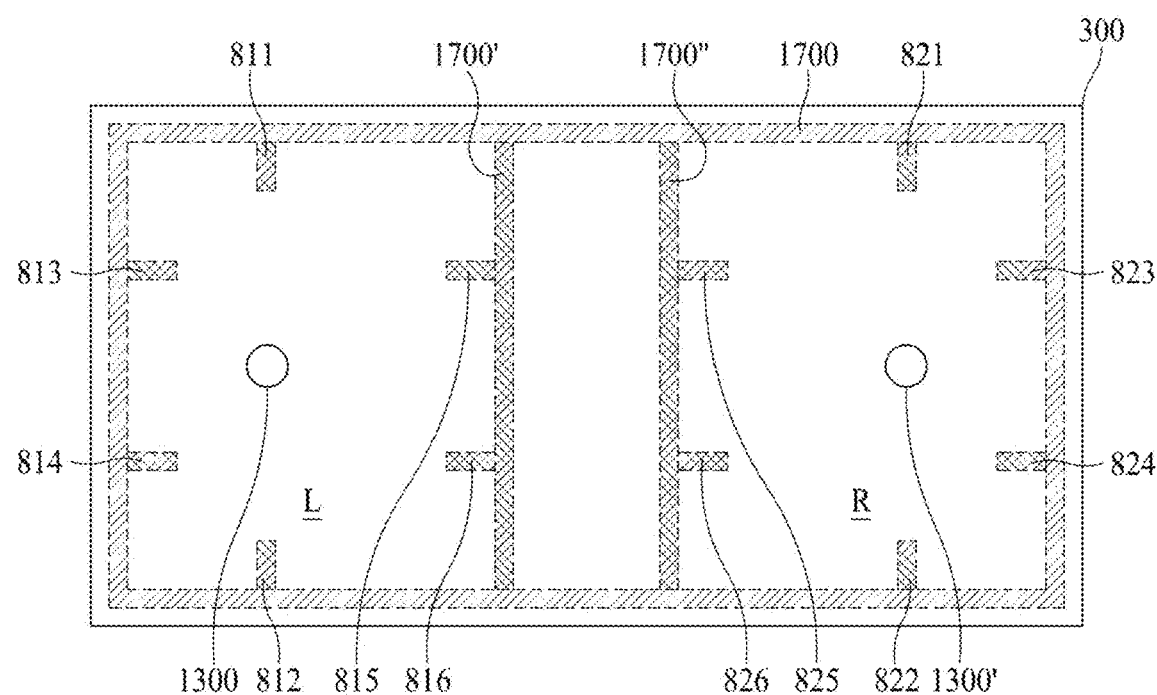

FIGS. 18A to 18C illustrate a sound generating device and a partition according to another example embodiment of the present disclosure. In FIGS. 18A to 18C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. A partition and a pad will be described below with reference to FIG. 18A, and their descriptions may be similarly applied to FIGS. 18B and 18C.

In FIGS. 18A to 18C, a first partition 1700 may include two or more materials including materials having different stiffness. An adhesive force between a display panel and a supporting member may be enhanced, but sound quality may be affected thereby. In order to enhance sound quality, the inventors have recognized that the first partition 1700 is formed of one material instead of two or more materials. Also, the first partition 1700 may be disposed in an outermost portion of the display panel, a wave phenomenon may not be seen. For example, the one material may be a double-sided tape or a single-sided tape, but is not limited thereto. Comparing with a single-sided tape, the inventors have recognized that, when the first partition 1700 is formed of a double-sided tape, the wave phenomenon is not reduced, but the adhesive force between the display panel and the supporting member is enhanced and sound quality is enhanced. Accordingly, the first partition 1700 may be formed of a material having elasticity that enables compression to be made to a certain degree. The first partition 1700 may be formed of polyurethane, polyolefin, polyethylene, and/or the like, but are not limited thereto.

A second partition 1700' and a third partition 1700" may be formed of the same material as that of a first pad 811, but are not limited thereto. The second partition 1700' and the third partition 1700" may be formed of the same material as that of the first partition 1700. For example, the second partition 1700' and the third partition 1700" may be formed of a double-sided tape or a double-sided foam pad. The second partition 1700' and the third partition 1700" may be formed of polyurethane, polyolefin, polyethylene, and/or the like, but are not limited thereto. When the second partition 1700' and the third partition 1700" are formed of the same material as that of the first pad 811, a wave phenomenon of the display panel may be reduced more than a case where the second partition 1700' and the third partition 1700" are formed of the same material as that of the first partition 1700. The second partition 1700' and the third partition 1700" may be formed of the same material as that of the first partition 1700, based on a difference of a degree to which the wave phenomenon of the display panel is seen.

First to sixth pads 811 to 816 and seventh to twelfth pads 821 to 826 may be formed of materials that differ from that of the first partition 1700. The first to sixth pads 811 to 816 and the seventh to twelfth pads 821 to 826 may be formed of materials that differ from that of the second partition 1700' or the third partition 1700". For example, the first to sixth pads 811 to 816 and the seventh to twelfth pads 821 to 826 may be formed of two or more materials including materials having different stiffness. The wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, because the partition and the pads are formed of different materials, the wave phenomenon may decrease, and a desired sound may be output, thereby enhancing a sound output characteristic.

Figure 19A:
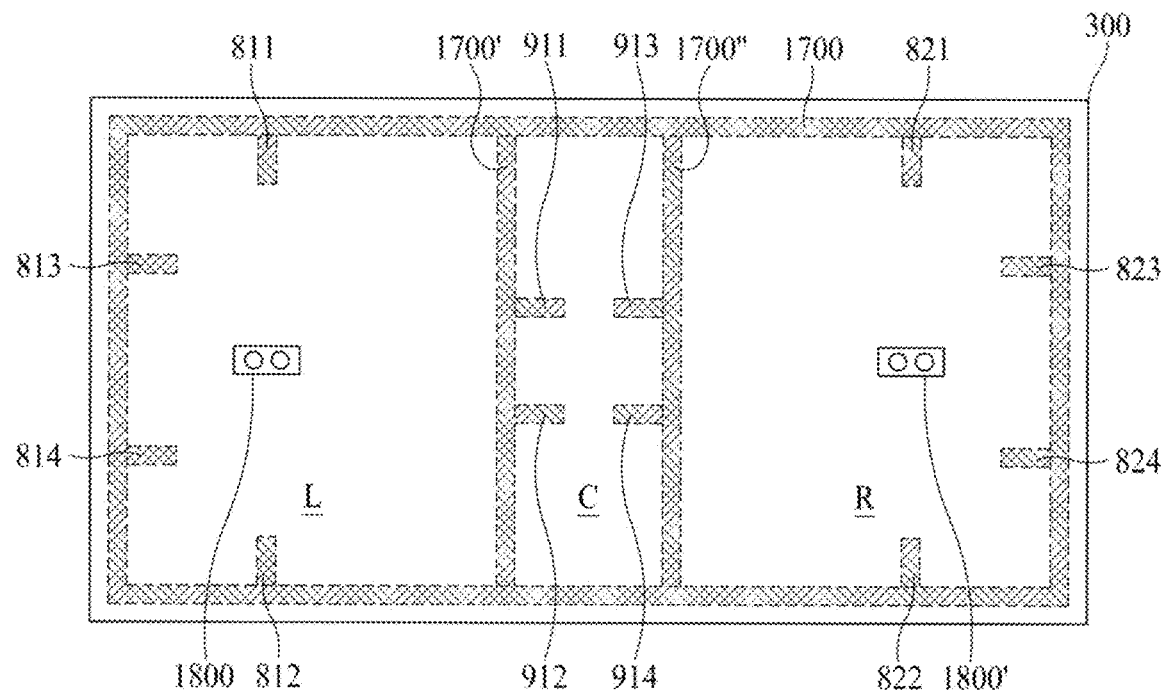
FIGS. 19A to 19C illustrate a sound generating device and a partition according to another example embodiment of the present disclosure.
Figure 19B:
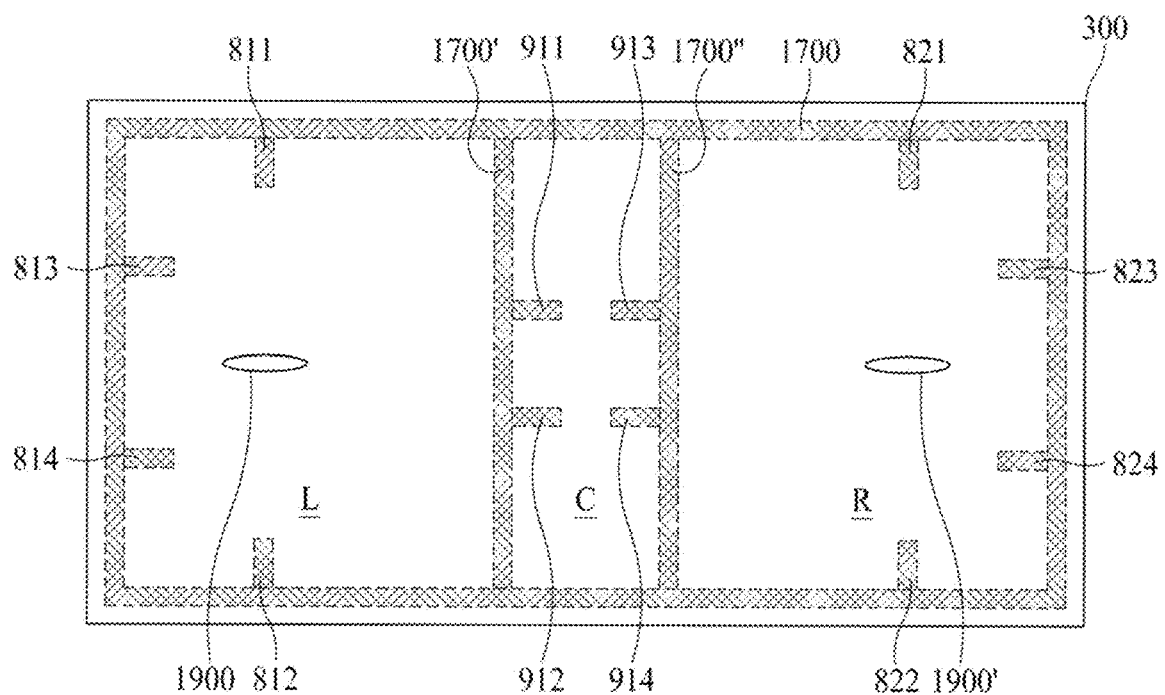
Figure 19C:
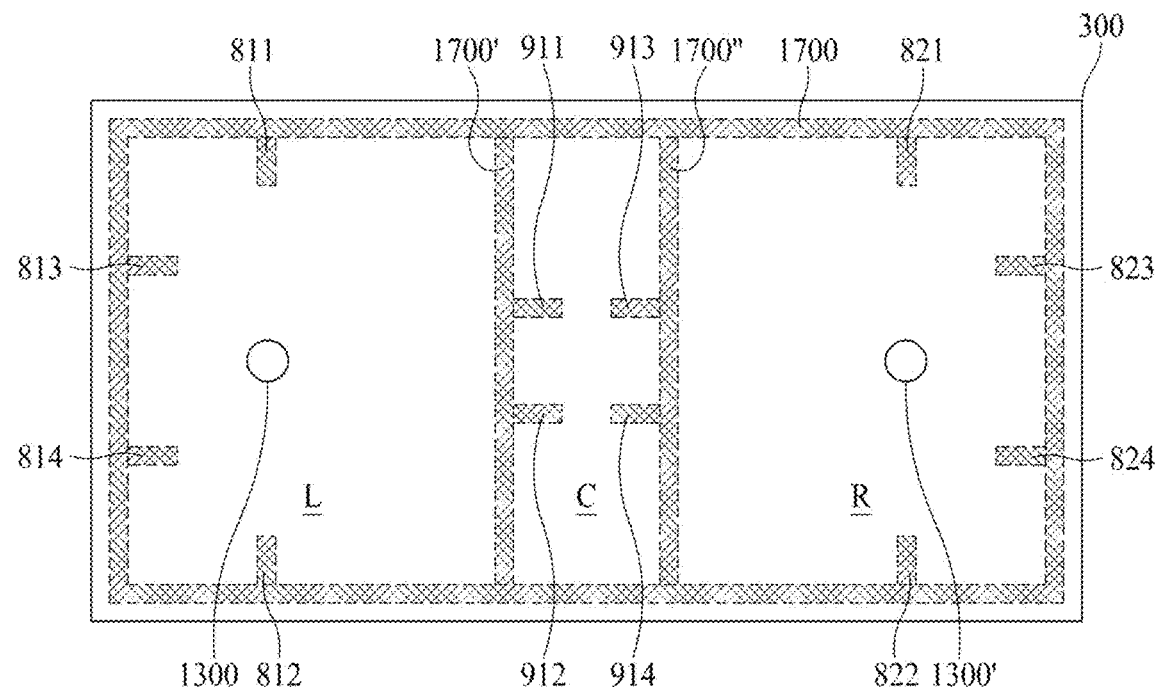

FIGS. 19A to 19C illustrate a sound generating device and a partition according to another example embodiment of the present disclosure. In FIGS. 19A to 19C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. A partition and a pad will be described below with reference to FIG. 19A, and their descriptions may be similarly applied to FIGS. 19B and 19C.

With reference to FIG. 19A, a first partition 1700 may be between a display panel 100 and a supporting member 300. For example, the first partition 1700 may be between a rear surface of the display panel and an upper surface of the supporting member. A second partition 1700' and a third partition 1700" that are at least two partitions may be between a first sound generating device 1800 and a second sound generating device 1800'. For example, the second partition 1700' may be between a first region L and a third region C, and the third partition 1700" may be between a second region R and the third region C.

At least one first member 911 and at least one second member 912 may be further provided on one side of the second partition 1700'. The first member 911 and the second member 912 may prevent a vibration generated by the first sound generating device 1800 from passing over the second partition 1700'. The at least one first member 911 and the at least one second member 912 may be disposed in the third region C. The at least one first member 911 and the at least one second member 912 may be disposed in a widthwise direction of the display panel 100 or the supporting member 300. The at least one first member 911 and the at least one second member 912 may be disposed between a third pad 813 and a fourth pad 814, but are not limited thereto.

For example, the first member 911 and the second member 912 may be disposed to be symmetrical or asymmetrical with respect to the first sound generating device 1800. For example, the first member 911 may be disposed more downward or upward than the second member 912 with respect to the first sound generating device 1800. When the first member 911 or the second member 912 is provided, the first member 911 and the second member 912 may be disposed to be symmetrical with respect to the first sound generating device 1800. For example, the first member 911 or the second member 912 may be disposed on the same line as the first sound generating device 1800 with respect to the first sound generating device 1800.

At least one third member 913 and at least one fourth member 914 may be further provided on one side of the third partition 1700". The third member 913 and the fourth member 914 may prevent a vibration generated by the second sound generating device 1800' from passing over the third partition 1700". The at least one third member 913 and the at least one fourth member 914 may be disposed in the third region C. The at least one third member 913 and the at least one fourth member 914 may be disposed in the widthwise direction of the display panel 100 or the supporting member 300. The at least one third member 913 and the at least one fourth member 914 may be between a ninth pad 823 and a tenth pad 824, but are not limited thereto.

For example, the third member 913 and the fourth member 914 may be disposed to be symmetrical or asymmetrical with respect to the second sound generating device 1800'. For example, the third member 913 may be disposed more downward or upward than the fourth member 914 with respect to the second sound generating device 1800'. When only the third member 913 or the fourth member 914 is provided, the third member 913 and the fourth member 914 may be disposed to be symmetrical with respect to the second sound generating device 1800'. For example, the third member 913 or the fourth member 914 may be on the same line as the second sound generating device 1800' with respect to the second sound generating device 1800'.

The first member 911 and the second member 912 may be disposed to be asymmetrical with the third member 913 and the fourth member 914. For example, the first member 911 and the second member 912 may be located at upper portion than the first sound generating device 1800 and the third member 913 and the fourth member 914 may be located at lower portion than the first sound generating device 1800, with respect to the first sound generating device 1800.

A size of the first to fourth members 911 to 914 may be equal to or greater than that of the first pad 811 or the third pad 813, but is not limited thereto. A shape of the first to fourth members 911 to 914 may be the same as that of the first pad 811 or the third pad 813. For example, a shape of the first to fourth members 911 to 914 may be a tetragonal (e.g., quadrilateral) shape or an end-rounded tetragonal (e.g., quadrilateral) shape, but is not limited thereto and may be provided as various shapes such as a circular shape.

The first to fourth members 911 to 914 may be formed of the same material as that of the first partition 1700. For example, the first to fourth members 911 to 914 may be formed of the same material as at least one of a first material and a second material of the first partition 1700. The first to fourth pads 911 to 914 may be formed of the same material as that of the first pad 811. For example, the first to fourth members 911 to 914 may be formed of the same material as at least one of a first material and a second material of the first pad 811. The first to fourth members 911 to 914 may be formed of two or more materials including materials having different stiffness. A wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, one or more members may be further provided on at least one side of the partition, thereby more enhancing a sound output characteristic. Also, because the partition, the pads, and the members are formed of two or more materials having different stiffness, the wave phenomenon may decrease.

Figure 20A:
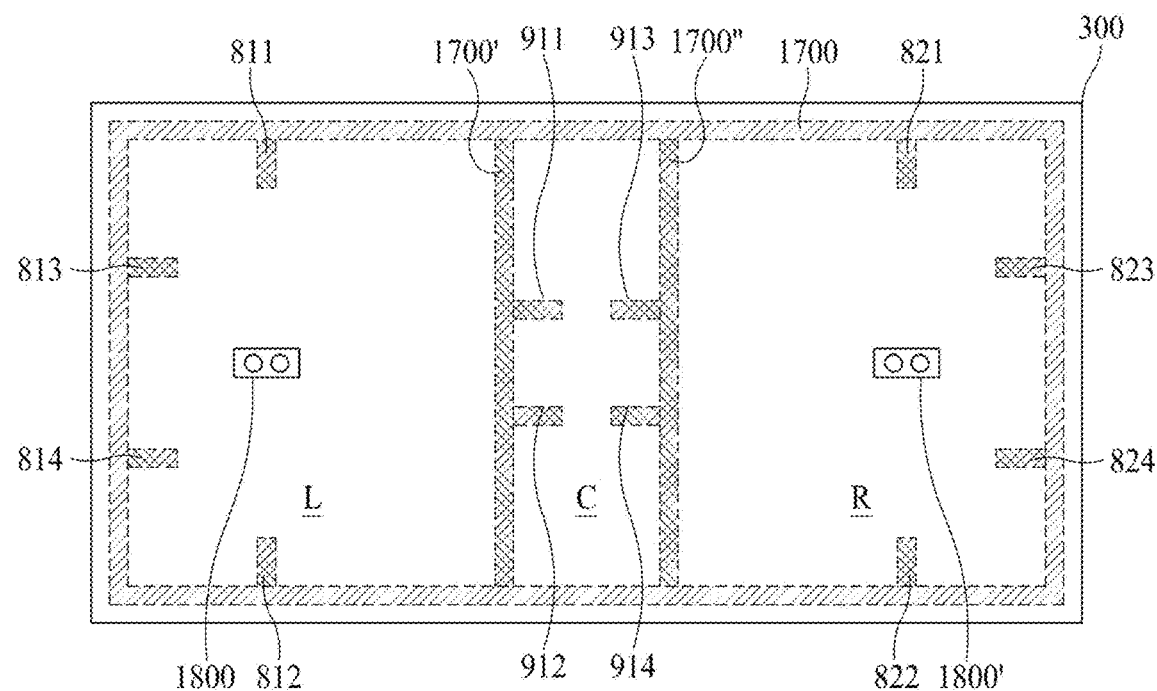
FIGS. 20A to 20C illustrate a sound generating device and a partition according to another example embodiment of the present disclosure.
Figure 20B:
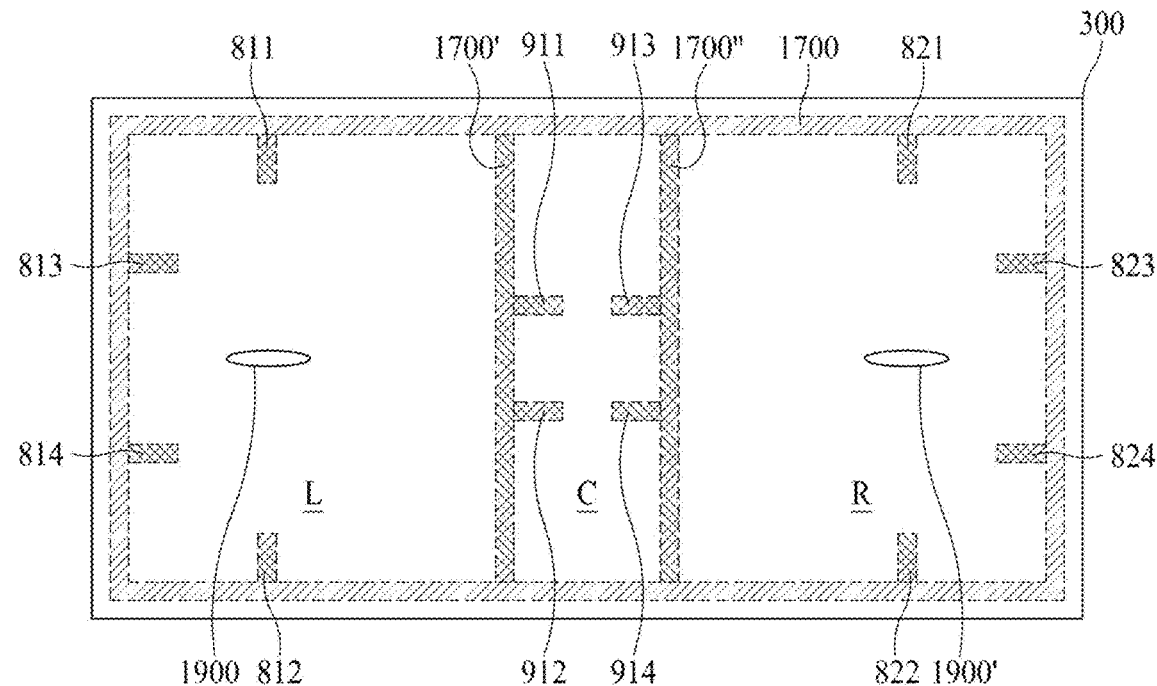
Figure 20C:
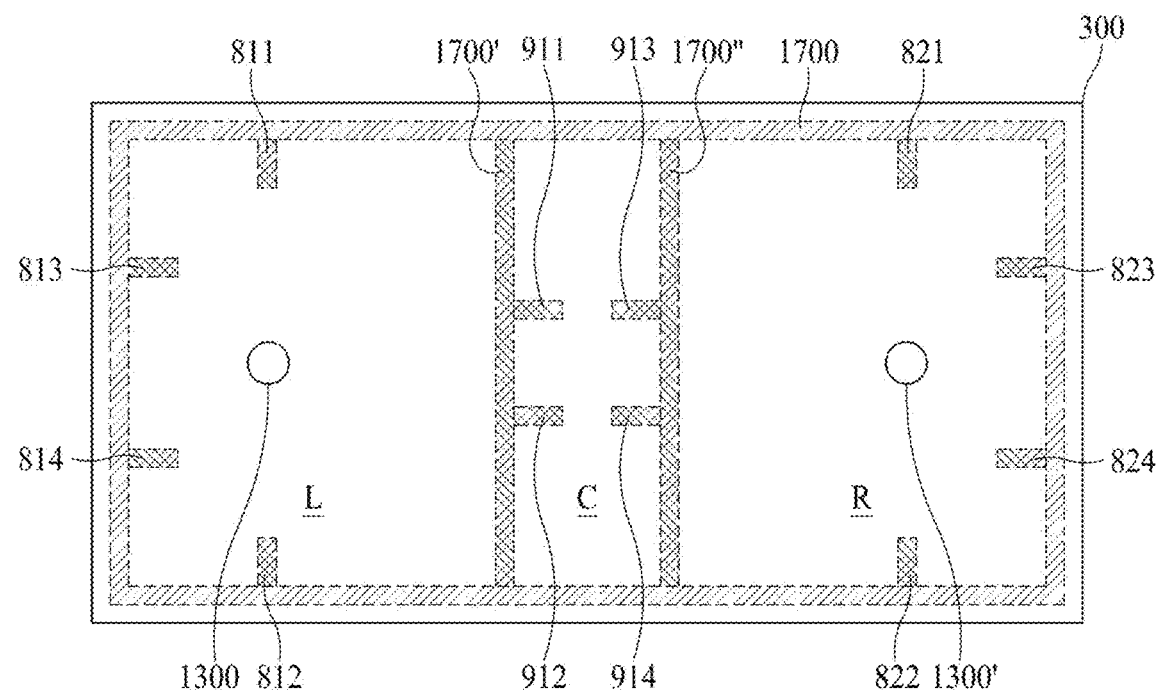

FIGS. 20A to 20C illustrate a sound generating device and a partition according to another example embodiment of the present disclosure. In FIGS. 20A to 20C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. Descriptions of first to fourth members are the same as descriptions given above with reference to FIG. 19A, and thus, are omitted or will be briefly given below. A partition, a pad, and a member will be described below with reference to FIG. 20A, and their descriptions may be similarly applied to FIGS. 20B and 20C.

In FIGS. 20A to 20C, a first partition 1700 may include two or more materials including materials having different stiffness. An adhesive force between a display panel and a supporting member may be enhanced, but sound quality may be affected thereby. In order to enhance sound quality, the inventors have recognized that the first partition 1700 is formed of one material instead of two or more materials. Also, the first partition 1700 may be disposed in an outermost portion of the display panel, a wave phenomenon may not be seen. For example, the one material may be a double-sided tape or a single-sided tape, but is not limited thereto. Comparing with a single-sided tape, the inventors have recognized that, when the first partition 1700 is formed of a double-sided tape, the wave phenomenon is not reduced, but the adhesive force between the display panel and the supporting member is enhanced and sound quality is enhanced. Accordingly, the first partition 1700 may be formed of a material having elasticity that enables compression to be made to a certain degree. The first partition 1700 may be formed of polyurethane, polyolefin, polyethylene, and/or the like, but are not limited thereto.

A second partition 1700' and a third partition 1700" may be formed of the same material as that of a first pad 811, but are not limited thereto. The second partition 1700' and the third partition 1700" may be formed of the same material as that of the first partition 1700. For example, the second partition 1700' and the third partition 1700" may be formed of a double-sided tape or a double-sided foam pad. The second partition 1700' and the third partition 1700" may be formed of polyurethane, polyolefin, polyethylene, and/or the like, but are not limited thereto. When the second partition 1700' and the third partition 1700" are formed of the same material as that of the first pad 811, a wave phenomenon of the display panel may be reduced more than a case where the second partition 1700' and the third partition 1700" are formed of the same material as that of the first partition 1700. The second partition 1700' and the third partition 1700" may be formed of the same material as that of the first partition 1700, based on a difference of a degree to which the wave phenomenon of the display panel is seen.

First to fourth pads 811 to 814, seventh to tenth pads 821 to 824, and first to fourth members 911 to 914 may be formed of materials that differ from that of the first partition 1700. The first to fourth pads 811 to 814, the seventh to tenth pads 821 to 824, and the first to fourth members 911 to 914 may be formed of materials that differ from that of the second partition 1700' or the third partition 1700". For example, the first to fourth pads 811 to 814, the seventh to tenth pads 821 to 824, and the first to fourth members 911 to 914 may be formed of two or more materials including materials having different stiffness. The wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, one or more members may be further provided on at least one side of the partition, thereby more enhancing a sound output characteristic. Also, because the partition and the pads are formed of different materials, the wave phenomenon may decrease, and a desired sound may be output, thereby enhancing a sound output characteristic.

Figure 21A:
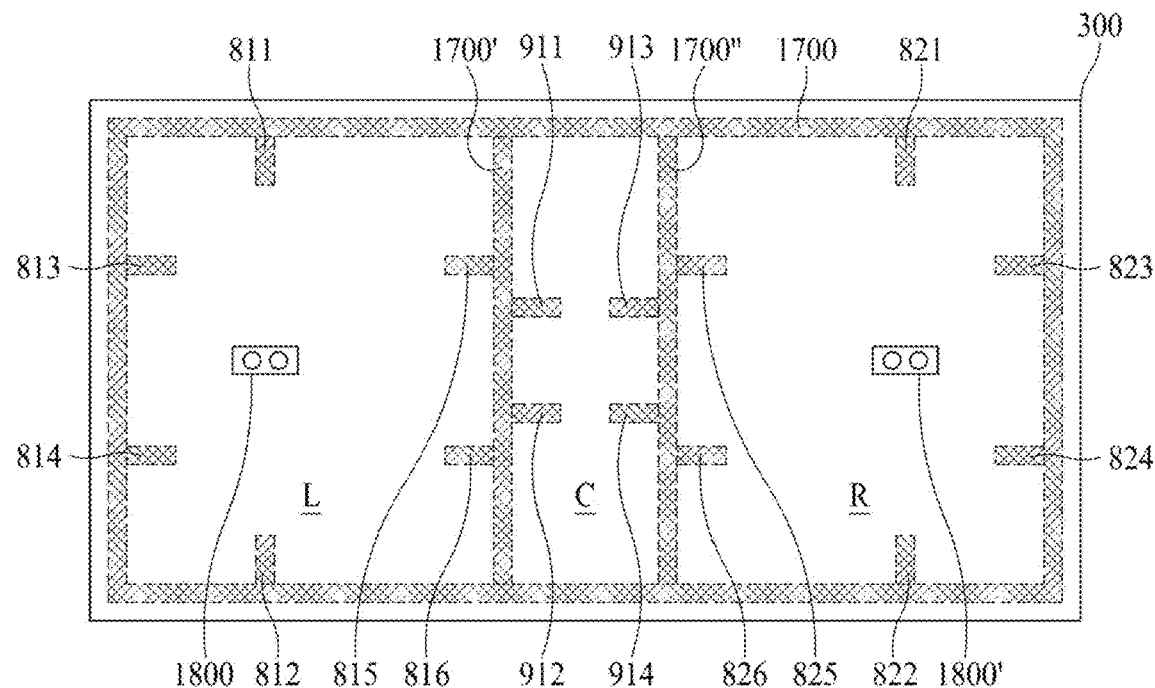
FIGS. 21A to 21C illustrate a sound generating device and a partition according to another example embodiment of the present disclosure.
Figure 21B:
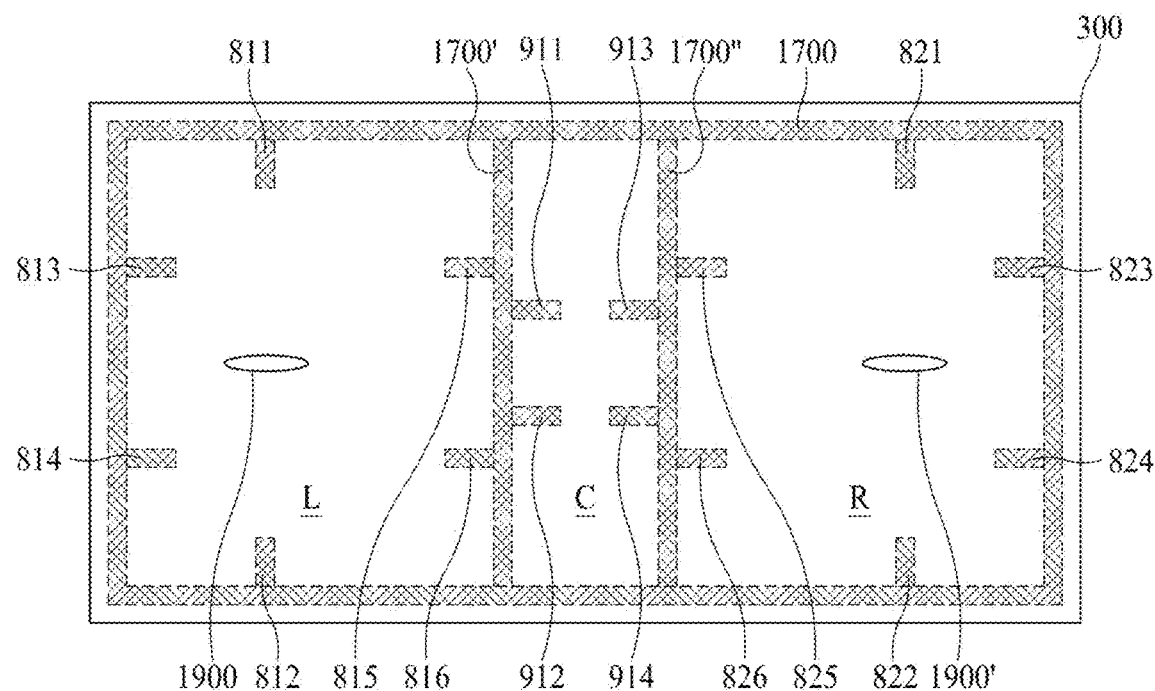
Figure 21C:
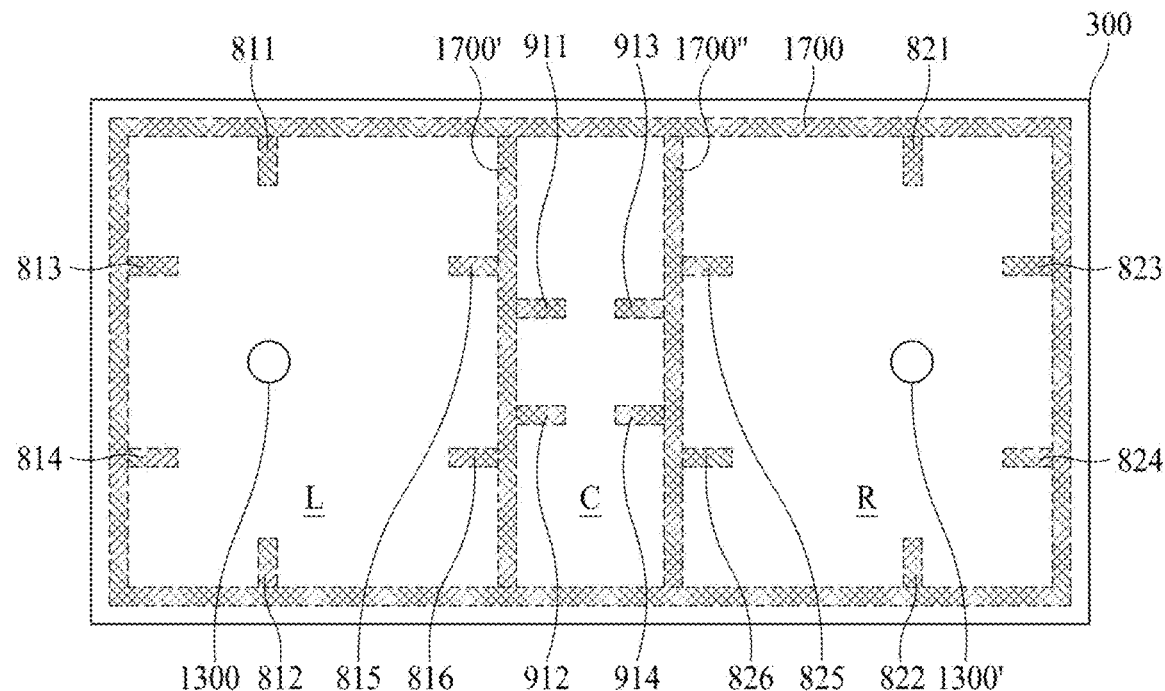

FIGS. 21A to 21C illustrate a sound generating device and a partition according to another example embodiment of the present disclosure. In FIGS. 21A to 21C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. Descriptions of fifth to twelfth pads are the same as descriptions given above with reference to FIG. 17A, and thus, are omitted or will be briefly given below. Descriptions of first to fourth members are the same as descriptions given above with reference to FIG. 19A, and thus, are omitted or will be briefly given below. A partition, a pad, and a member will be described below with reference to FIG. 21A, and their descriptions may be similarly applied to FIGS. 21B and 21C.

With reference to FIG. 21A, a first partition 1700 may be between a display panel and a supporting member. For example, the first partition 1700 may be between a rear surface of the display panel and an upper surface of the supporting member. A second partition 1700' and a third partition 1700" that are at least two partitions may be between a first sound generating device 1800 and a second sound generating device 1800'. For example, the second partition 1700' may be between a first region L and a third region C, and the third partition 1700" may be between a second region R and the third region C.

At least one fifth pad 815 and at least one sixth pad 816 may be further provided on one side of the second partition 1700'. At least one eleventh pad 825 and at least one twelfth pad 826 may be further provided on one side of the third partition 1700". The fifth pad 815, the sixth pad 816, the eleventh pad 825, and the twelfth pad 826 may further decrease a peak or dipping caused by a standing wave generated by interference between a reflected wave and a progressive wave and may prevent sound quality from being degraded by the standing wave or the reflected wave.

A size of the fifth pad 815, the sixth pad 816, the eleventh pad 825, and the twelfth pad 826 may be equal to or greater than that of the first pad 811 or the third pad 813, but is not limited thereto. A shape of the fifth pad 815, the sixth pad 816, the eleventh pad 825, and the twelfth pad 826 may be the same as that of the first pad 811 or the third pad 813. For example, a shape of the fifth pad 815, the sixth pad 816, the eleventh pad 825, and the twelfth pad 826 may be a tetragonal (e.g., quadrilateal) shape or an end-rounded tetragonal (e.g., quadrilateral) shape, but is not limited thereto and may be provided as various shapes such as a circular shape.

The fifth pad 815, the sixth pad 816, the eleventh pad 825, and the twelfth pad 826 may be formed of the same material as that of the first partition 1700. For example, the fifth pad 815, the sixth pad 816, the eleventh pad 825, and the twelfth pad 826 may be formed of the same material as at least one of a first material and a second material of the first partition 1700. The fifth pad 815, the sixth pad 816, the eleventh pad 825, and the twelfth pad 826 may be formed of the same material as that of the first pad 811. For example, the fifth pad 815, the sixth pad 816, the eleventh pad 825, and the twelfth pad 826 may be formed of the same material as at least one of a first material and a second material of the first pad 811. The fifth pad 815, the sixth pad 816, the eleventh pad 825, and the twelfth pad 826 may be formed of two or more materials including materials having different stiffness.

A wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

At least one first member 911 and at least one second member 912 may be further provided on one side of the second partition 1700'. The first member 911 and the second member 912 may prevent a vibration generated by the first sound generating device 1800 from passing over the second partition 1700'. At least one third member 913 and at least one fourth member 914 may be further provided on one side of the third partition 1700". The third member 913 and the fourth member 914 may prevent a vibration generated by the second sound generating device 1800' from passing over the third partition 1700". The first member 911 and the second member 912 may be disposed to be asymmetrical with the third member 913 and the fourth member 914. For example, the first member 911 and the second member 912 may be located at an upper portion of the first sound generating device 1800 and the third member 913 and the fourth member 914 may be located at a lower portion of the first sound generating device 1800, with respect to the first sound generating device 1800.

A size of the first to fourth members 911 to 914 may be equal to or greater than that of the first pad 811 or the third pad 813, but is not limited thereto. A shape of the first to fourth members 911 to 914 may be the same as that of the first pad 811 or the third pad 813. For example, a shape of the first to fourth members 911 to 914 may be a tetragonal shape (e.g., quadrilateral) or an end-rounded tetragonal (e.g., quadrilateral) shape, but is not limited thereto and may be provided as various shapes such as a circular shape.

The first to fourth members 911 to 914 may be formed of the same material as that of the first partition 1700. For example, the first to fourth members 911 to 914 may be formed of the same material as at least one of a first material and a second material of the first partition 1700. The first to fourth members 911 to 914 may be formed of the same material as that of the first pad 811. For example, the first to fourth members 911 to 914 may be formed of the same material as at least one of a first material and a second material of the first pad 811. The first to fourth members 911 to 914 may be formed of two or more materials including materials having different stiffness. A wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, one or more members may be further provided on at least one side of the partition, thereby more enhancing a sound output characteristic. Also, because the partition, the pads, and the members are formed of two or more materials having different stiffness, the wave phenomenon may decrease.

Figure 22A:
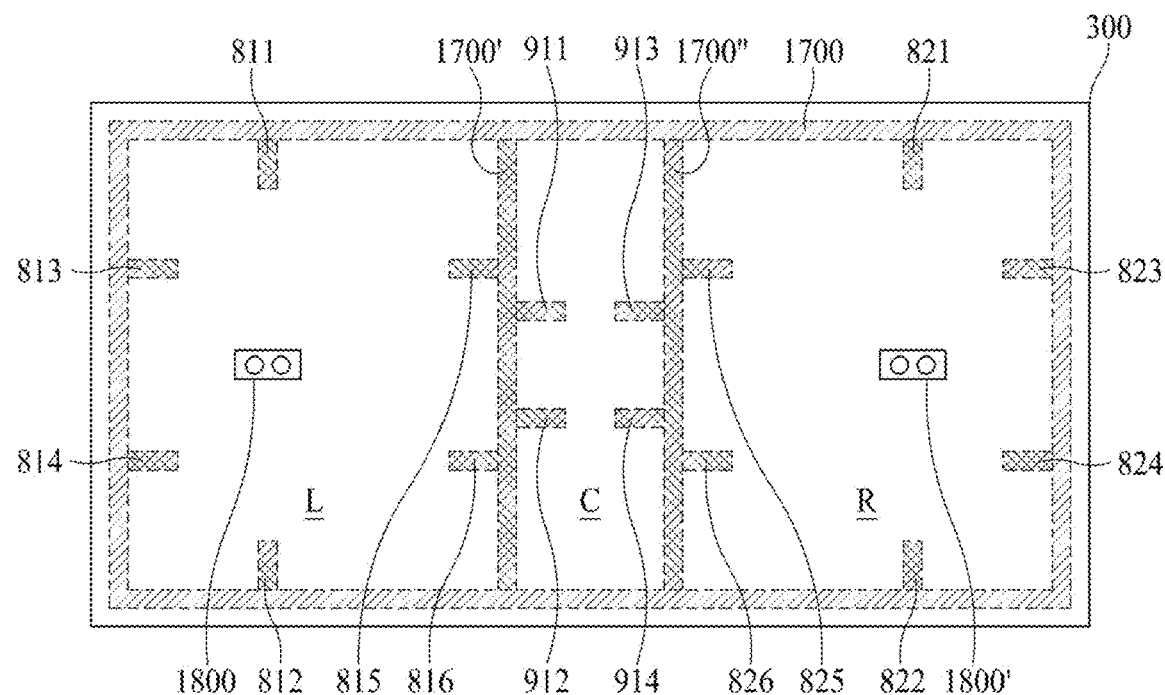
FIGS. 22A to 22C illustrate a sound generating device and a partition according to another example embodiment of the present disclosure.
Figure 22B:
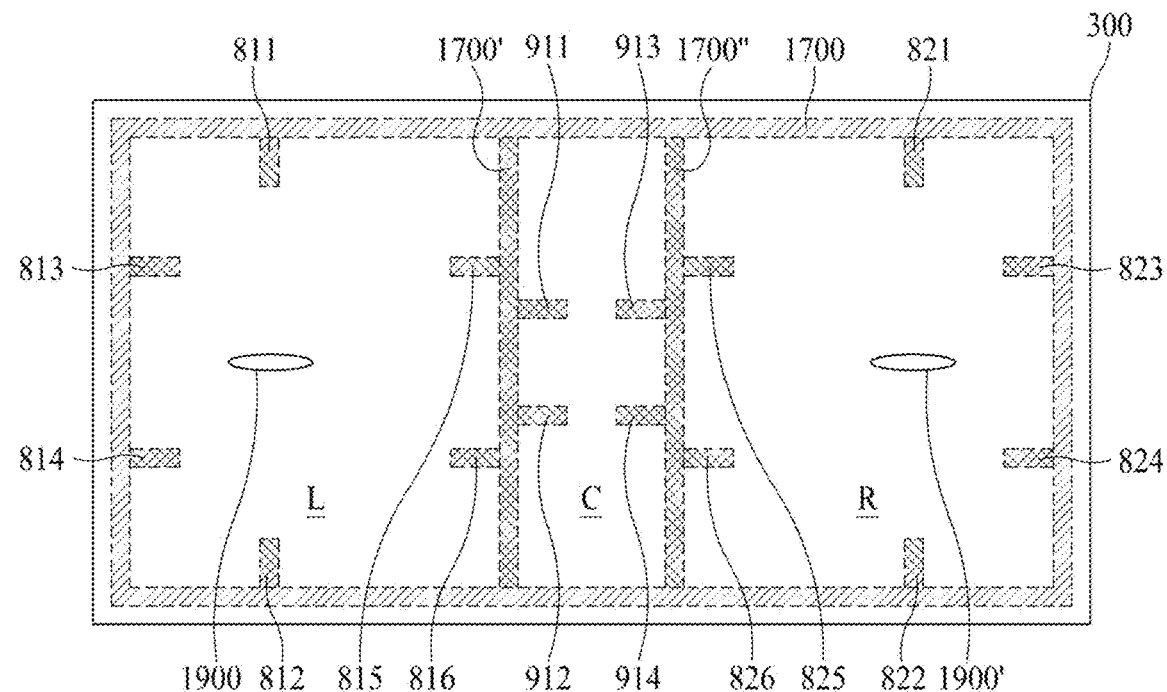
Figure 22C:
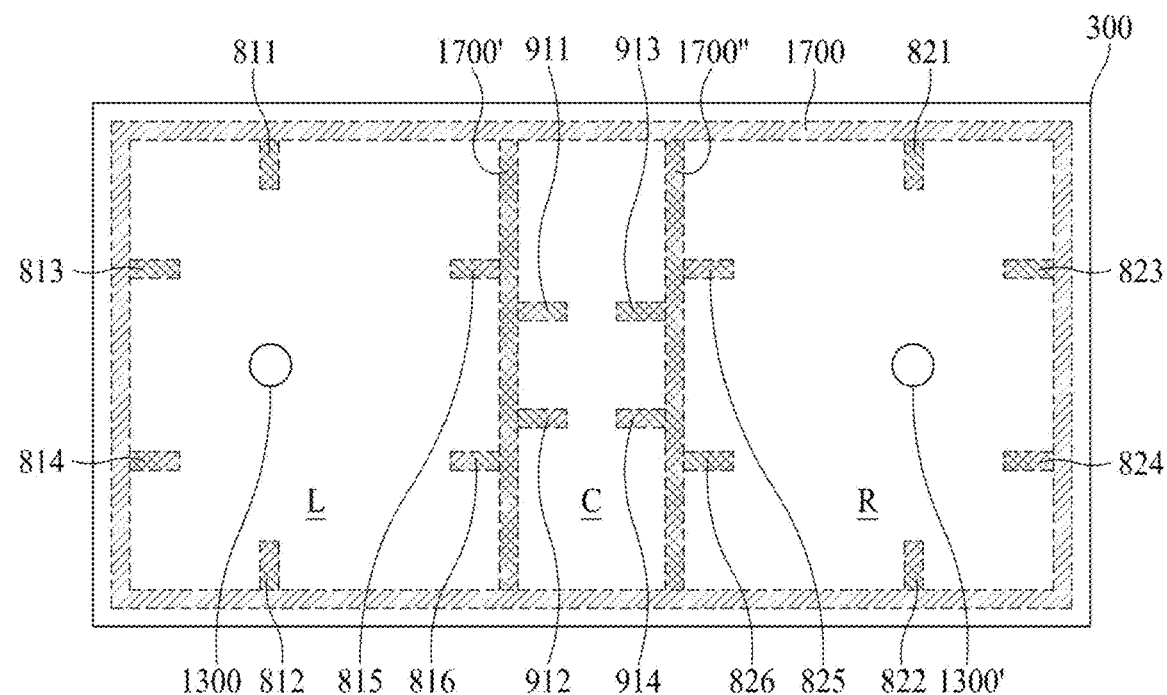

FIGS. 22A to 22C illustrate a sound generating device and a partition according to another example embodiment of the present disclosure. In FIGS. 22A to 22C, the same descriptions as descriptions given above with reference to FIGS. 15A to 15C are omitted or will be briefly given below. For example, descriptions of a sound generating device and first to fourth pads as well as seventh to tenth pads are omitted or will be briefly given below. Descriptions of a fifth pad, a sixth pad, an eleventh pad, and a twelfth pad are the same as descriptions given above with reference to FIG. 17A, and thus, are omitted or will be briefly given below. Descriptions of first to fourth members are the same as descriptions given above with reference to FIG. 19A, and thus, are omitted or will be briefly given below. A partition, a pad, and a member will be described below with reference to FIG. 22A, and their descriptions may be similarly applied to FIGS. 22B and 22C.

In FIGS. 22A to 22C, a first partition 1700 may include two or more materials including materials having different stiffness. An adhesive force between a display panel and a supporting member may be enhanced, but sound quality may be affected thereby. In order to enhance sound quality, the inventors have recognized that the first partition 1700 is formed of one material instead of two or more materials. Also, the first partition 1700 may be disposed in an outermost portion of the display panel, a wave phenomenon may not be seen. For example, the one material may be a double-sided tape or a single-sided tape, but is not limited thereto. Comparing with a single-sided tape, the inventors have recognized that, when the first partition 1700 is formed of a double-sided tape, the wave phenomenon is not reduced, but the adhesive force between the display panel and the supporting member is enhanced and sound quality is enhanced. Accordingly, the first partition 1700 may be formed of a material having elasticity that enables compression to be made to a certain degree. The first partition 1700 may be formed of polyurethane, polyolefin, polyethylene, and/or the like, but are not limited thereto.

A second partition 1700' and a third partition 1700" may be formed of the same material as that of a first pad 811, but are not limited thereto. The second partition 1700' and the third partition 1700" may be formed of the same material as that of the first partition 1700. For example, the second partition 1700' and the third partition 1700" may be formed of a double-sided tape or a double-sided foam pad. The second partition 1700' and the third partition 1700" may be formed of polyurethane, polyolefin, polyethylene, and/or the like, but are not limited thereto. When the second partition 1700' and the third partition 1700" are formed of the same material as that of the first pad 811, a wave phenomenon of the display panel may be reduced more than a case where the second partition 1700' and the third partition 1700" are formed of the same material as that of the first partition 1700. The second partition 1700' and the third partition 1700" may be formed of the same material as that of the first partition 1700, based on a difference of a degree to which the wave phenomenon of the display panel is seen.

First to sixth pads 811 to 816, seventh to twelfth pads 821 to 826, and first to fourth members 911 to 914 may be formed of materials that differ from that of the first partition 1700. The first to sixth pads 811 to 816, the seventh to twelfth pads 821 to 826, and the first to fourth members 911 to 914 may be formed of materials that differ from that of the second partition 1700' or the third partition 1700". For example, the first to sixth pads 811 to 816, the seventh to twelfth pads 821 to 826, and the first to fourth members 911 to 914 may be formed of two or more materials including materials having different stiffness. The wave phenomenon may be reduced. For example, a first material adjacent to the display panel may include a material that is high in stiffness, and a second material adjacent to the supporting member may include a material that is low in stiffness. For example, a material that is high in stiffness may have a 25% CFD value of 0.25 or more. A material that is high in stiffness may be acryl or polyolefin, but is not limited thereto. For example, a material that is low in stiffness may have a 25% CFD value of less than 0.25. A material that is low in stiffness may be polyurethane or sponge, but is not limited thereto.

Therefore, because one or more pads are provided on at least one side of a partition, the wave phenomenon may decrease, and the peak or the dipping caused by the standing wave may be reduced, thereby enhancing a sound output characteristic. Also, one or more members may be further provided on at least one side of the partition, thereby more enhancing a sound output characteristic. Also, because the partition and the pads are formed of different materials, the wave phenomenon may decrease, and a desired sound may be output, thereby enhancing a sound output characteristic.

Figure 23A:
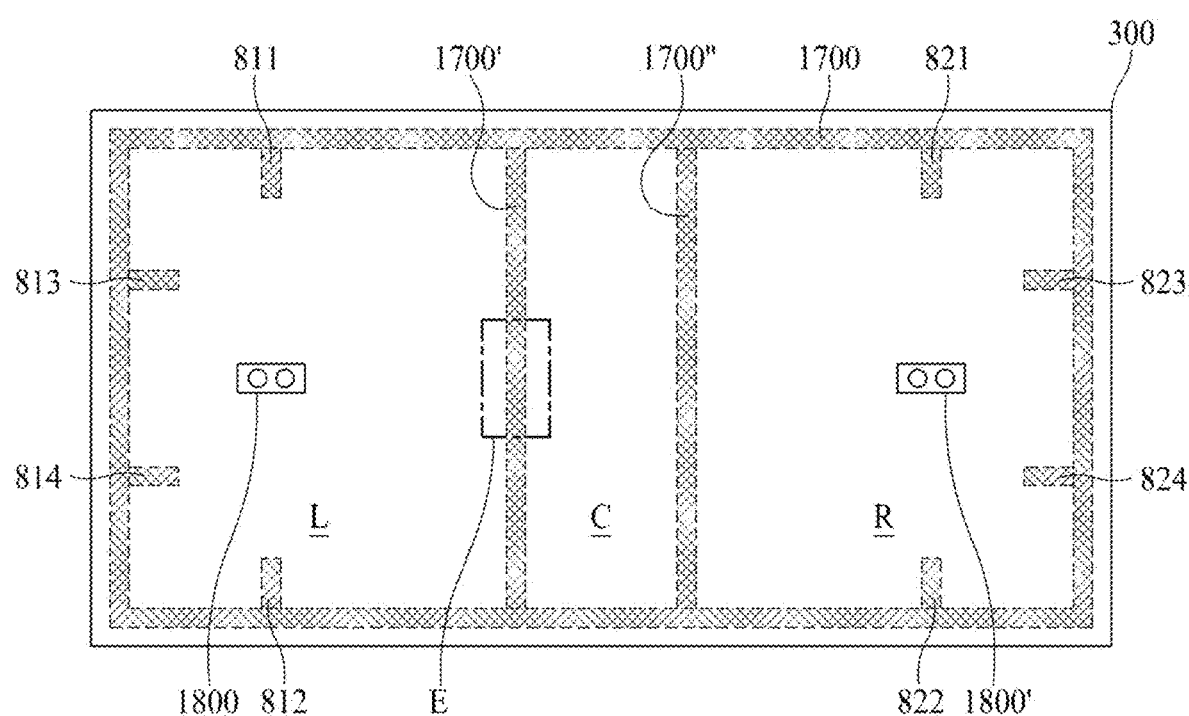
FIGS. 23A to 23C illustrate a result obtained by measuring a rear surface of a display panel in a display apparatus according to an example embodiment of the present disclosure.
Figure 23B:
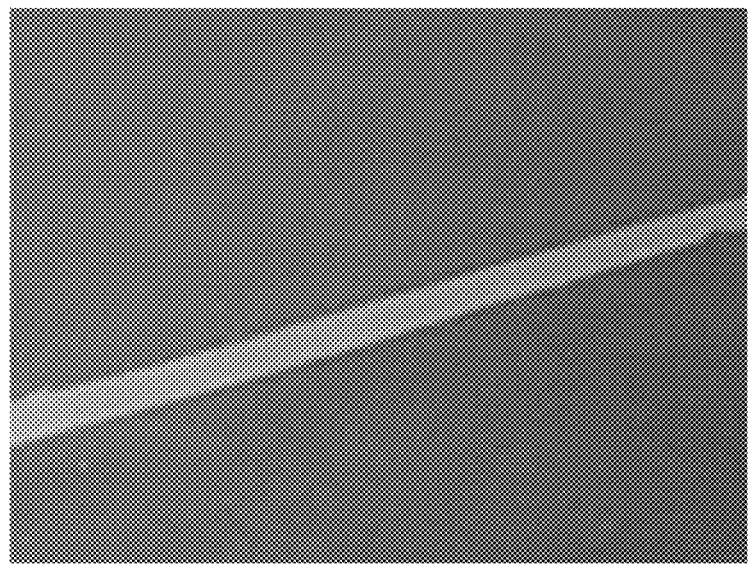
Figure 23C:
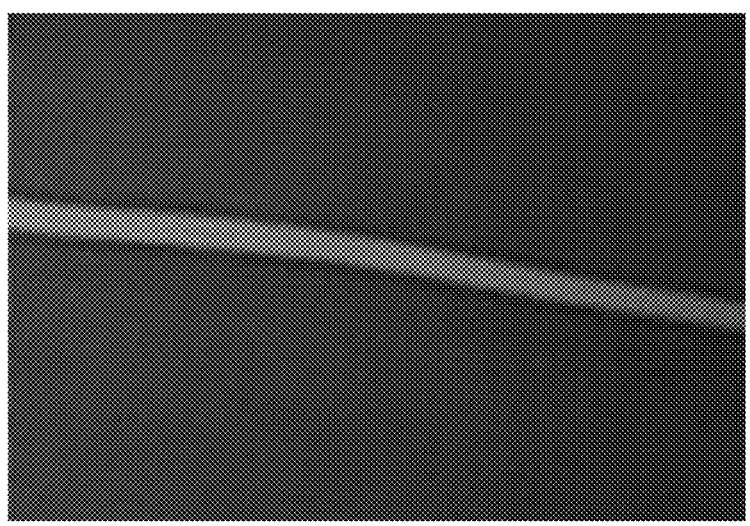

FIGS. 23A to 23C illustrate a result obtained by measuring a rear surface of a display panel in a display apparatus according to an example embodiment of the present disclosure. FIGS. 23B and 23C are diagrams showing results obtained by measuring a portion "E" of FIG. 23A. The portion "E" may be a portion of a second partition 1700'. FIG. 23B shows an example where two materials having different stiffness according to an example embodiment of the present disclosure are applied. FIG. 23C shows an example where a double-sided tape is applied. It may be seen that the second partition 1700' is a straight line in FIG. 23B, but is not straight line in FIG. 23C. When the second partition 1700' is not straight line, a wave phenomenon of a display panel may occur based on flatness or bending of a supporting member. Therefore, when two materials having different stiffness are applied, the flatness or bending of the supporting member may be corrected, thereby reducing the wave phenomenon of the display panel. The present example is an example that measures a second partition, but is not limited thereto and may be similarly applied to a first partition, a third partition, a pad, a member, etc. Accordingly, in a display apparatus according to an example embodiment of the present disclosure, it may be seen that the partition is formed of two or more materials having different stiffness, and thus, the wave phenomenon is reduced.

Because the display apparatus according to an example embodiment of the present disclosure includes the sound generating device that vibrates the display panel to generate sound, the sound of the display apparatus may be output to a region in front of the display panel. Accordingly, an immersion experience of a viewer who is watching an image displayed by the display apparatus is enhanced.

Moreover, because the display apparatus according to an example embodiment of the present disclosure includes the sound generating device that vibrates the display panel to generate sound, a speaker may not be provided, and thus, a degree of freedom in design and element disposition of a set apparatus is enhanced. Moreover, in the display apparatus according to an example embodiment of the present disclosure, a partition and at least one pad on at least one side of the partition may be provided, and thus, peak and dipping caused by a standing wave may be reduced, thereby enhancing a sound output characteristic.

Moreover, in the display apparatus according to an example embodiment of the present disclosure, at least one pad may be provided on at least one side of the partition, and at least one member may be provided on at least one side of the partition, thereby decreasing a wave phenomenon of the display panel. Accordingly, a display apparatus with an enhanced sound output characteristic may be provided. Moreover, according to an example embodiment of the present disclosure, because the partition is provided between one or more sound generating devices disposed on the display panel, the partition may separate sounds, thereby providing a display apparatus that realizes a stereo sound and has an enhanced sound output characteristic.

Moreover, in the display apparatus according to an example embodiment of the present disclosure, the partition and at least one pad disposed on at least one side of the partition may be provided, and the partition and the pad may include two or more materials that include materials having different stiffness, thereby decreasing a wave phenomenon of the display panel. Moreover, in the display apparatus according to an example embodiment of the present disclosure, the partition, at least one pad disposed on at least one side of the partition, and at least one member may be provided, and at least one of the partition, the pad, and the member may include two or more materials that include materials having different stiffness, thereby decreasing a wave phenomenon of the display panel.

A sound generating device according to an example embodiment of the present disclosure may be applied as a sound generating device in a display apparatus. The display apparatus according to an example embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, TVs, wall paper display apparatuses, signage devices, game machines, notebook computers, monitors, cameras, camcorders, home appliances, etc. Also, the sound generating device according to an example embodiment of the present disclosure may be applied to organic light emitting lighting apparatuses or inorganic light emitting lighting apparatuses. When the sound generating apparatus is applied to a lighting apparatus, the sound generating device may act as lighting and a speaker.

A display apparatus according to an example embodiment of the present disclosure will be described below.

According to one example embodiment of the present disclosure, a display apparatus includes: a display panel configured to display an image; a supporting member on a rear surface of the display panel, wherein the supporting member is configured to support the display panel; at least one sound generating device on the rear surface of the display panel, wherein the at least one sound generating device is configured to vibrate the display panel to generate sound; and a partition between the rear surface of the display panel and an upper surface of the supporting member, the partition including a first material and a second material.

For example, in a display apparatus according to one example embodiment of the present disclosure, the first material is adjacent to the display panel; and the second material is adjacent to the supporting member and includes a material having a lower stiffness value than the first material.

For example, in a display apparatus according to one example embodiment of the present disclosure, the first material includes a material having a 25% compression force deflection (CFD) value of 0.25 or more; and the second material includes a material having a 25% CFD value of less than 0.25.

For example, in a display apparatus according to one example embodiment of the present disclosure, the partition includes a first side and a second side vertical to the first side; and the display apparatus further includes at least one pad in the first side or the second side.

For example, in a display apparatus according to one example embodiment of the present disclosure, the at least one pad faces the at least one sound generating device.

For example, in a display apparatus according to one example embodiment of the present disclosure, the at least one pad includes the same material as a material of the partition.

For example, in a display apparatus according to one example embodiment of the present disclosure, the at least one sound generating device includes one or more of a circular sound generating device, an oval sound generating device, and a pair of sound generating devices.

According to one example embodiment of the present disclosure, a display apparatus includes: a display panel configured to display an image and including a first region, a second region, and a third region; at least one sound generating device on a rear surface of the display panel, and in at least one of the first region, the second region, and the third region; a supporting member on the rear surface of the display panel, wherein the supporting member is configured to support the display panel; a first partition between the display panel and the supporting member, wherein the first partition includes a first side and a second side; at least one first pad in the first region and the first side vertical to the first side; and at least one second pad facing the at least one first pad, wherein the at least one first pad or the at least one second pad includes a first material and a second material.

For example, in a display apparatus according to one example embodiment of the present disclosure, the first material is adjacent to the display panel, and includes a material having a greater stiffness value than a stiffness value of the second material; and the second material is adjacent to the supporting member.

For example, a display apparatus according to one example embodiment of the present disclosure further includes at least one third pad or at least one fourth pad in the second side, wherein the at least one third pad or the at least one fourth pad includes the same material as a material of the at least one first pad.

For example, a display apparatus according to one example embodiment of the present disclosure further includes: at least one seventh pad in the second region and the first side; and at least one eighth pad facing the at least one seventh pad, wherein the at least one seventh pad or the at least one eighth pad includes the same material as a material of the at least one first pad.

For example, a display apparatus according to one example embodiment of the present disclosure further includes at least one ninth pad or at least one tenth pad in the second region and the second side, wherein the at least one ninth pad or the at least one tenth pad includes the same material as a material of the at least one first pad.

For example, in a display apparatus according to one example embodiment of the present disclosure, the first region is a left region of the rear surface of the display panel, the second region is a right region of the rear surface of the display panel, and the third region is a central region of the rear surface of the display panel, and the display apparatus further includes: a second partition between the first region and the third region; and a third partition between the second region and the third region.

For example, in a display apparatus according to one example embodiment of the present disclosure, one of the second partition and the third partition includes the same material as a material of the at least one first pad.

For example, in a display apparatus according to one example embodiment of the present disclosure, one of the second partition and the third partition includes the same material as a material of the first partition.

For example, a display apparatus according to one example embodiment of the present disclosure further includes at least one fifth pad or at least one sixth pad in the first region and one side of the second partition, wherein the at least one fifth pad or the at least one sixth pad includes the same material as a material of the at least one first pad.

For example, a display apparatus according to one example embodiment of the present disclosure further includes at least one eleventh pad and at least one twelfth pad in the second region and one side of the third partition, wherein the at least one eleventh pad or the at least one twelfth pad includes the same material as a material of the at least one first pad.

For example, a display apparatus according to one example embodiment of the present disclosure further includes at least one member in the third region and one side of the second partition, wherein the at least one member includes the same material as a material of the at least one first pad.

For example, a display apparatus according to one example embodiment of the present disclosure further includes at least one member in the third region and one side of the third partition, wherein the at least one member includes the same material as a material of the at least one first pad.

According to one example embodiment of the present disclosure, a display apparatus includes: a display panel configured to display an image and including a first region, a second region, and a third region; at least one sound generating device in at least one of the first region, the second region, and the third region of a rear surface of the display panel; a supporting member on the rear surface of the display panel, wherein the supporting member is configured to support the display panel; a first partition between the display panel and the supporting member, wherein the first partition includes a first side and a second side vertical to the first side; a second partition between the first region and the third region; a third partition between the second region and the third region; and at least one pad in the first region or the second region, and on the first side and the second side, wherein the at least one pad includes two or more materials having different stiffness values.

For example, a display apparatus according to one example embodiment of the present disclosure further includes at least one member in the third region and one side of the second partition or one side of the third partition, wherein the at least one member comprises the same material as a material of the at least one pad.

For example, in a display apparatus according to one example embodiment of the present disclosure, the two or more materials includes a first material having a first stiffness value and a second material having a second stiffness value; the first material is adjacent to the display panel; the second material is adjacent to the supporting member; and the first stiffness value is greater than the second stiffness value.

For example, in a display apparatus according to one example embodiment of the present disclosure, at least one of the first partition, the second partition, and the third partition includes the same material as a material of the at least one pad.

For example, in a display apparatus according to one example embodiment of the present disclosure, one of the first partition, the second partition, and the third partition includes one material.

For example, in a display apparatus according to one example embodiment of the present disclosure, the first material contacts the display panel.

It will be apparent to those skilled in the art that various modifications and variations can be made in the flexible display apparatus and an electronic device comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display apparatus, comprising:
a display panel configured to display an image;
a supporting member on a rear surface of the display panel, wherein the supporting member is configured to support the display panel;
at least one sound generating device on the rear surface of the display panel, wherein the at least one sound generating device is configured to vibrate the display panel to generate sound; and
a partition between the rear surface of the display panel and an upper surface of the supporting member, the partition including a first material and a second material,
wherein:
the first material is adjacent to the display panel; and
the second material is adjacent to the supporting member and includes a material having a lower stiffness value than the first material.

2. The display apparatus of claim 1, wherein:
the first material includes a material having a 25% compression force deflection (CFD) value of 0.25 or more; and
the second material includes a material having a 25% CFD value of less than 0.25.

3. The display apparatus of claim 1, wherein:
the partition includes a first side and a second side vertical to the first side; and
the display apparatus further includes at least one pad in the first side or the second side.

4. The display apparatus of claim 3, wherein the at least one pad faces the at least one sound generating device.

5. The display apparatus of claim 3, wherein the at least one pad includes the same material as a material of the partition.

6. The display apparatus of claim 1, wherein the at least one sound generating device includes one of a circular sound generating device, an oval sound generating device, and a pair of sound generating devices.

7. A display apparatus, comprising:
a display panel configured to display an image and including a first region, a second region, and a third region;
at least one sound generating device on a rear surface of the display panel, and in at least one of the first region, the second region, and the third region;
a supporting member on the rear surface of the display panel, wherein the supporting member is configured to support the display panel;
a first partition between the display panel and the supporting member, wherein the first partition includes a first side and a second side vertical to the first side;
at least one first pad in the first region and the first side; and
at least one second pad facing the at least one first pad,
wherein the at least one first pad or the at least one second pad includes a first material and a second material,
wherein:
the first material is adjacent to the display panel; and
the second material is adjacent to the supporting member and includes a material having a lower stiffness value than the first material.

8. The display apparatus of claim 7, further comprising at least one third pad or at least one fourth pad in the second side,
wherein the at least one third pad or the at least one fourth pad includes the same material as a material of the at least one first pad.

9. The display apparatus of claim 7, further comprising:
at least one seventh pad in the second region and the first side; and
at least one eighth pad facing the at least one seventh pad,
wherein the at least one seventh pad or the at least one eighth pad includes the same material as a material of the at least one first pad.

10. The display apparatus of claim 9, further comprising at least one ninth pad or at least one tenth pad in the second region and the second side,
wherein the at least one ninth pad or the at least one tenth pad includes the same material as a material of the at least one first pad.

11. The display apparatus of claim 7, wherein:
the first region is a left region of the rear surface of the display panel, the second region is a right region of the rear surface of the display panel, and the third region is a central region of the rear surface of the display panel, and the display apparatus further comprises:
a second partition between the first region and the third region; and
a third partition between the second region and the third region.

12. The display apparatus of claim 11, wherein one of the second partition and the third partition includes the same material as a material of the at least one first pad.

13. The display apparatus of claim 11, wherein one of the second partition and the third partition includes the same material as a material of the first partition.

14. The display apparatus of claim 11, further comprising at least one fifth pad or at least one sixth pad in the first region and one side of the second partition,
wherein the at least one fifth pad or the at least one sixth pad includes the same material as a material of the at least one first pad.

15. The display apparatus of claim 11, further comprising at least one eleventh pad and at least one twelfth pad in the second region and one side of the third partition,
wherein the at least one eleventh pad or the at least one twelfth pad includes the same material as a material of the at least one first pad.

16. The display apparatus of claim 11, further comprising at least one member in the third region and one side of the second partition,
wherein the at least one member includes the same material as a material of the at least one first pad.

17. The display apparatus of claim 11, further comprising at least one member in the third region and one side of the third partition,
wherein the at least one member includes the same material as a material of the at least one first pad.

18. A display apparatus, comprising:
a display panel configured to display an image and including a first region, a second region, and a third region;
at least one sound generating device in at least one of the first region, the second region, and the third region of a rear surface of the display panel;
a supporting member on the rear surface of the display panel, wherein the supporting member is configured to support the display panel;
a first partition between the display panel and the supporting member, wherein the first partition includes a first side and a second side vertical to the first side;
a second partition between the first region and the third region;
a third partition between the second region and the third region; and
at least one pad in the first region or the second region, and on the first side and the second side,
wherein the at least one pad includes two or more materials having different stiffness values, and
wherein:
the first material is adjacent to the display panel; and
the second material is adjacent to the supporting member and includes a material having a lower stiffness value than the first material.

19. The display apparatus of claim 18, further comprising:
at least one member in the third region and one side of the second partition or one side of the third partition,
wherein the at least one member comprises the same material as a material of the at least one pad.

20. The display apparatus of claim 18, wherein:
the two or more materials includes a first material having a first stiffness value and a second material having a second stiffness value;
the first material is adjacent to the display panel;
the second material is adjacent to the supporting member; and
the first stiffness value is greater than the second stiffness value.

21. The display apparatus of claim 18, wherein at least one of the first partition, the second partition, and the third partition includes the same material as a material of the at least one pad.

22. The display apparatus of claim 18, wherein one of the first partition, the second partition, and the third partition includes one material.

23. The display apparatus of claim 18, wherein the first material contacts the display panel.

* * * * *